(12) United States Patent
Drachmann et al.

(10) Patent No.: US 10,830,621 B2
(45) Date of Patent: Nov. 10, 2020

(54) ULTRASONIC FLOW METER WITH IMPROVED ADC ARRANGEMENT

(71) Applicant: Apator Miitors ApS, Aarhus V (DK)

(72) Inventors: Jens Drachmann, Viby J (DK); Kresten Helstrup, Hasselager (DK)

(73) Assignee: Apator Miitors ApS, Aarhus V (DK)

( * ) Notice: Subject to any disclaimer, the term of this patent is extended or adjusted under 35 U.S.C. 154(b) by 119 days.

(21) Appl. No.: 16/315,320

(22) PCT Filed: Jul. 8, 2016

(86) PCT No.: PCT/DK2016/050242
§ 371 (c)(1),
(2) Date: Jan. 4, 2019

(87) PCT Pub. No.: WO2018/006912
PCT Pub. Date: Jan. 11, 2018

(65) Prior Publication Data
US 2020/0182670 A1    Jun. 11, 2020

(51) Int. Cl.
| | |
|---|---|
| G01F 1/66 | (2006.01) |
| H03M 1/12 | (2006.01) |
| G01F 19/00 | (2006.01) |
| H03M 1/36 | (2006.01) |
| H03M 1/20 | (2006.01) |

(52) U.S. Cl.
CPC ............ *G01F 1/668* (2013.01); *G01F 1/662* (2013.01); *H03M 1/128* (2013.01); *H03M 1/367* (2013.01); *H03M 1/201* (2013.01)

(58) Field of Classification Search
CPC ........... G01F 1/66; G01F 19/00; H03M 1/128
See application file for complete search history.

(56) References Cited

U.S. PATENT DOCUMENTS

| | | | |
|---|---|---|---|
| 3,636,555 A | 1/1972 | Waaben | |
| 4,399,416 A | 8/1983 | Gillespie | |
| 5,973,996 A | 10/1999 | Zhevelev et al. | |
| 6,016,113 A | 1/2000 | Binder | |
| 6,766,276 B1 | 7/2004 | Dury | |
| 7,117,104 B2 * | 10/2006 | Urdaneta | G01F 1/66 702/48 |
| 9,086,309 B2 * | 7/2015 | Funck | G01F 1/667 |
| 10,641,629 B2 * | 5/2020 | Tsukigi | G01F 1/667 |
| 2005/0288873 A1 | 12/2005 | Urdaneta et al. | |

(Continued)

FOREIGN PATENT DOCUMENTS

| | | |
|---|---|---|
| DE | 102012112516 A1 | 6/2014 |
| EP | 2383505 A1 | 11/2011 |

(Continued)

OTHER PUBLICATIONS

International Search Report in International Application No. PCT/DK2016/050242, dated Jun. 30, 2017, 8 pages.

(Continued)

*Primary Examiner* — Jewel V Dowtin

(74) *Attorney, Agent, or Firm* — Lee & Hayes, P.C.

(57) ABSTRACT

Transit-time based ultrasonic flow meter with analog-to-digital conversion for measuring ultrasonic signals, wherein accuracy of measurements is improved by making several measurements with different input offset, reference voltage, frame offset or sample rate in an analog-to-digital conversion stage.

20 Claims, 7 Drawing Sheets

(56) References Cited

U.S. PATENT DOCUMENTS

Figure 1:
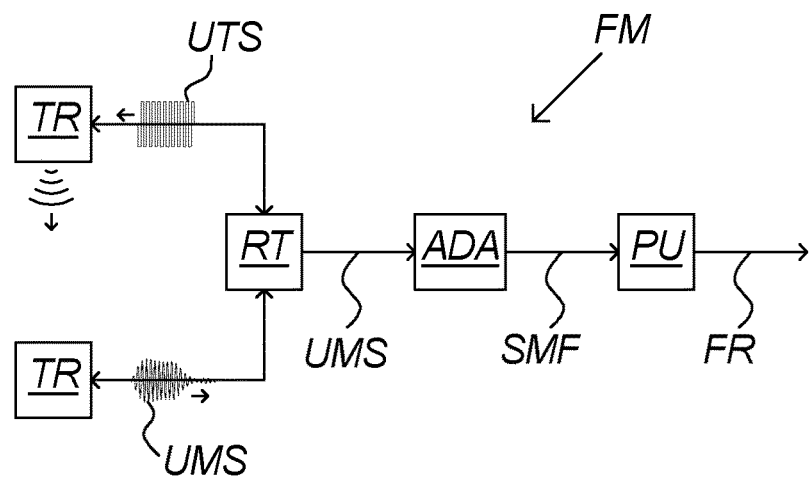

| | | |
|---|---|---|
| 2008/0150771 A1 | 6/2008 | Inagaki |
| 2011/0148676 A1 | 6/2011 | Waheed et al. |
| 2014/0022103 A1 | 1/2014 | Kimura et al. |
| 2014/0253352 A1 | 9/2014 | Oshima et al. |
| 2015/0077135 A1 | 3/2015 | Karl |
| 2016/0069718 A1 | 3/2016 | Wandeler et al. |

FOREIGN PATENT DOCUMENTS

| | | |
|---|---|---|
| EP | 2383550 A1 | 11/2011 |
| WO | WO1997014936 A1 | 4/1997 |
| WO | WO2014094782 A1 | 6/2014 |
| WO | WO2016016818 A1 | 2/2016 |

OTHER PUBLICATIONS

Walden, Robert, "Analog-to-Digital Converter Survey and Analysis," Apr. 1999, IEEE Journal on Selected Areas in Communications, vol. 17, No. 4, pp. 539-550.

\* cited by examiner

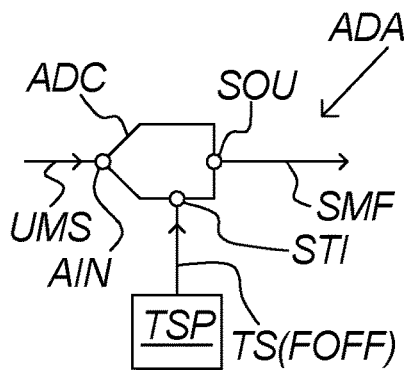
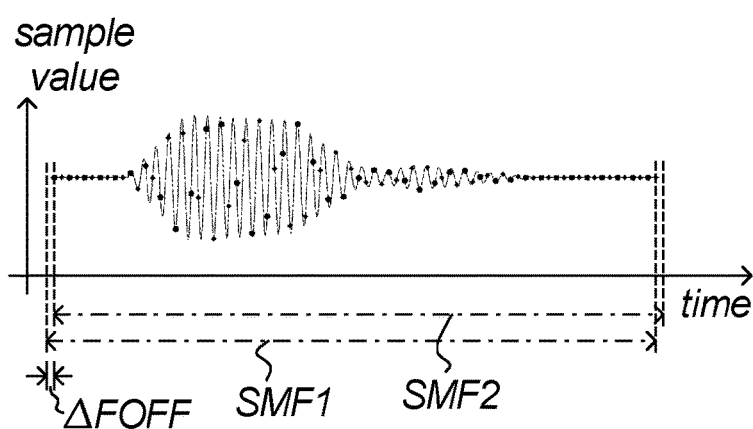
Fig. 12
Fig. 13
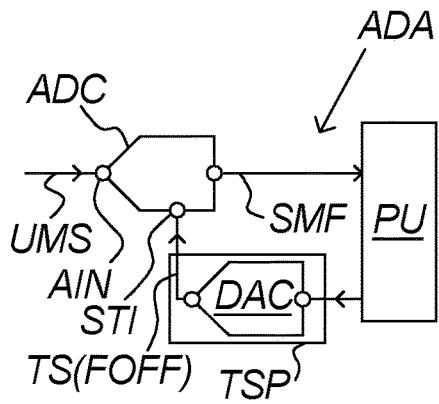
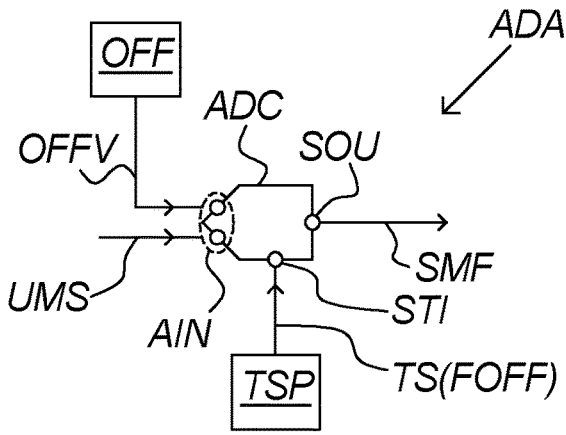
Fig. 14
Fig. 15
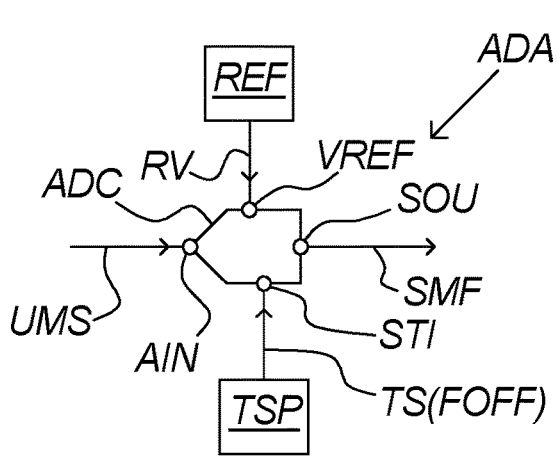
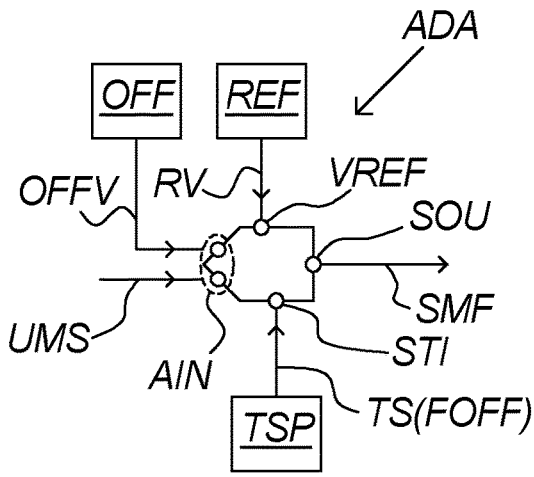
Fig. 16
Fig. 17

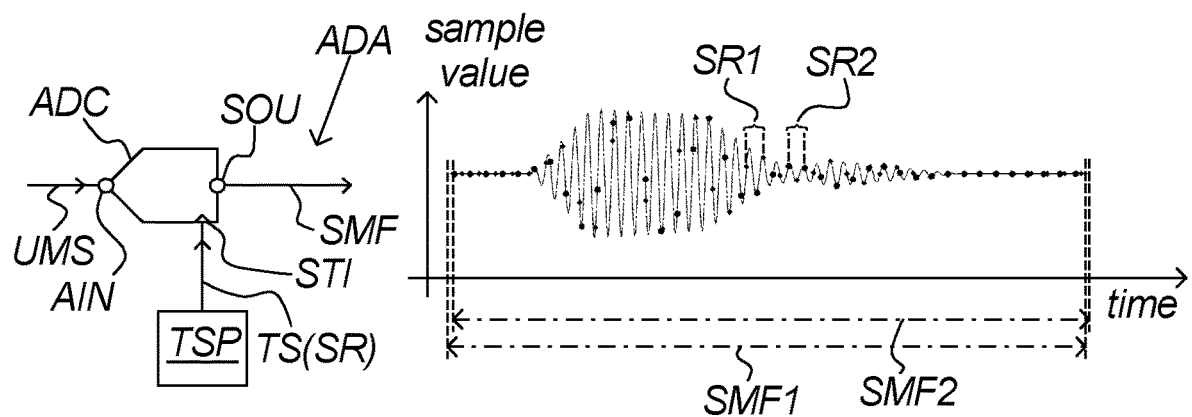
Fig. 18  Fig. 19
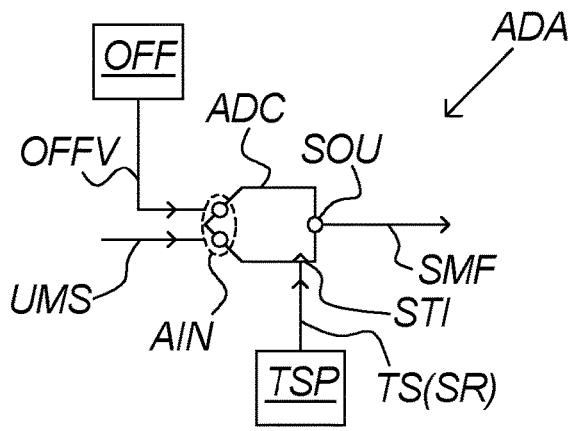 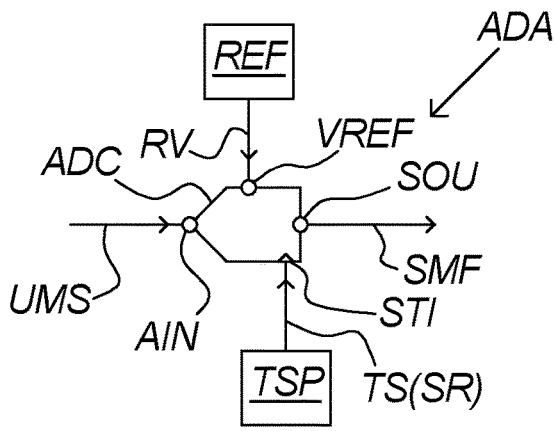
Fig. 20  Fig. 21
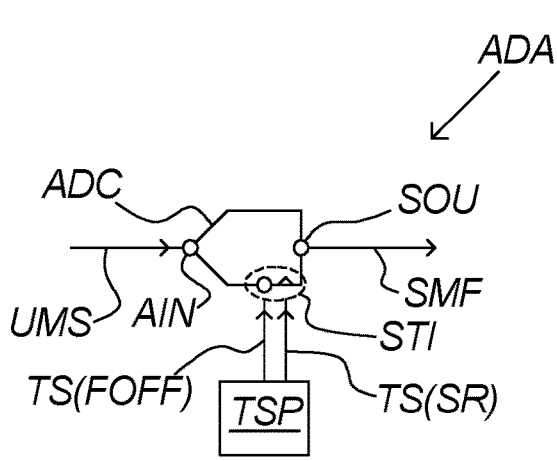 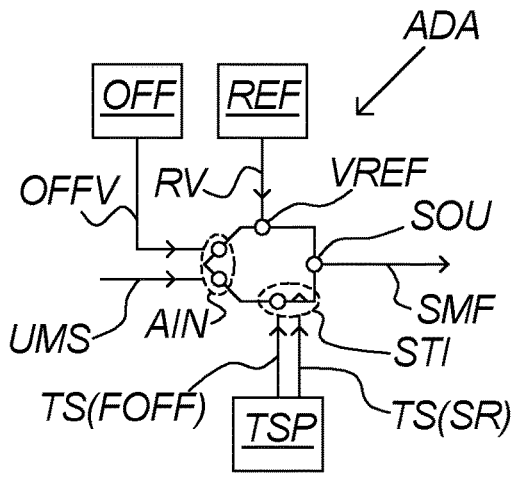
Fig. 22  Fig. 23

ULTRASONIC FLOW METER WITH IMPROVED ADC ARRANGEMENT

CROSS-REFERENCE TO RELATED APPLICATION

This application is the U.S. National Phase of International Application No. PCT/DK2016/050242 filed Jul. 8, 2016, which is incorporated herein by reference in its entirety as if fully set forth herein.

FIELD OF THE INVENTION

The present invention relates to the analog-to-digital conversion applied in transit-time based ultrasonic flow meters to measure ultrasonic signals, in particular low-cost, high-accuracy, mass-produced integrating flow meters, such as utility water meters, utility heat meters and utility gas meters.

BACKGROUND OF THE INVENTION

Transit-time based ultrasonic flow meters utilize two ultrasonic transducers mounted relative to the flow of a fluid in such a way that ultrasonic signals can be transmitted at least partially along the flow or against the flow by using the upstream, respectively downstream, transducer as transmitter, and the other transducer as receiver. Basically, transit-time based flow measurement requires one ultrasound measurement in each direction between the two transducers. The transit-time, or time-of-flight, of an ultrasonic signal, e.g. a short series of pulses, varies with the direction and fluid flow rate, thereby causing the difference in transit-time between a downstream and upstream signal to increase with increasing flow rate. In other words, the flow rate indication $\Phi$ of a fluid is substantially proportional to a ratio of relative and absolute transit-time, according to Equation 1, in which $t_1$ is the transit-time in one direction, $t_2$ is the transit-time in the opposite direction, and $K(t_1-t_2, t_1+t_2)$ is a function returning a correction factor based on the physical parameters of the measurement setup, e.g. the materials traversed, the distances and directions travelled, the type and density of the fluid, etc. The correction factor function, e.g. implemented as a lookup table, may be estimated or measured using reference flows.

$$\Phi \propto \frac{t_1 - t_2}{(t_1 + t_2)^2} \cdot K(t_1 - t_2, t_1 + t_2) \quad \text{(Equation 1)}$$

The accuracy of the flow meter thereby depends on the ability to measure the transit-times accurately. The difference in transit-time $(t_1-t_2)$ may be determined directly from the signals by e.g. comparing phase information, e.g. by cross-correlation, and thereby does not require actually determining $t_1$ and $t_2$ individually. However, the absolute transit-times $t_1$ and $t_2$ are required in order to determine $(t_1+t_2)$. While the transit-time in typical flow meters may be in the range of 30 to 300 µs, the transit-time difference $(t_1-t_2)$ or $\Delta t$ may typically be in the range of as little as 100 ps to 500 ns, i.e. often only a few thousandths or less of the transit time. It is therefore very important to measure this difference accurately.

To avoid actually measuring the absolute transit-times, $t_1$ and $t_2$, prior art flow meters have used an estimated time based on the distance travelled and the speed of sound, i.e. a temperature-dependent estimate for each specific flow meter setup. Such estimated transit-time is of course inaccurate, and the accuracy decreases with increasing fluid flow rate.

An approach for measuring absolute transit-time and transit-time difference with acceptable accuracy is to use a high-resolution and high-quality analog-to-digital converter with a high sample rate to measure the ultrasound signals with sufficient detail to determine the transit-time differences accurately. However, such converters are very expensive and extremely energy consuming.

Dithering, i.e. intentionally adding a small amplitude of noise affecting each signal sample individually and typically (pseudo-)randomly, is generally used in converters to randomize quantization errors and improve linearity. However, conventional dithering techniques may get complicated and insufficient, even destructive, when applied to small scale signals, broadband signals and/or signals sampled at low rate.

SUMMARY OF THE INVENTION

The inventors have identified the above-mentioned problems and challenges related to accurate measuring of transit-times and transit-time difference, and subsequently made the below-described invention which may increase the robustness of ADC arrangements against non-linearity and inaccuracy of medium or low quality analog-to-digital converters to make them usable for use in transit-time based ultrasonic flow meters for measuring the absolute transit-time and in particular the transit-time differences of the ultrasound signals with sufficient accuracy.

Different Input Level Offsets

In an aspect, the invention relates to a transit-time ultrasonic flow meter comprising at least two ultrasonic transducers, an analog-to-digital converter arrangement for sampling ultrasound measurement signals from the ultrasonic transducers and a processing unit for calculating a transit-time based flow representation from the sampled measurement signals;

wherein the analog-to-digital converter arrangement comprises:
   an analog-to-digital converter comprising an analog input and a sample output; and
   an input level offset provider arranged to provide an input level offset value to the analog input;

wherein the analog-to-digital converter arrangement is arranged to receive at least four ultrasound measurement signals from the ultrasonic transducers and provide the ultrasound measurement signals to the analog input;

wherein the input level offset provider is arranged to provide an individual input level offset value for at least two of said ultrasound measurement signals, each individual input level offset value being different; and wherein the analog-to-digital converter is arranged to establish for each of the at least four ultrasound measurement signals a sampled measurement frame with at least 10 samples on the basis of the respective ultrasound measurement signal and the input level offset value and provide the sampled measurement frame at the sample output coupled to said processing unit.

The invention may improve transit-time based flow measurements by improving the robustness against non-linearity of the analog-to-digital conversion of ultrasound measurements on which the transit-time calculations are based. By the present invention, the average error over time of transit-time difference measurements, and thereby of determined flow representations and volume measurements of the flow meter are improved.

The transfer function of an analog-to-digital converter may be illustrated as a stair, where the number of steps of the stair corresponds to the resolution of the converter and a varying width of the individual steps illustrates non-linearities of the converter. By applying a different individual input level offset value to each ultrasound measurement signal during a series of measurement signals, different steps of the stair, typically with different linearity errors, of the analog-to-digital converter are employed to produce each sampled measurement frame.

An ultrasound measurement signal according to the invention refers to a signal comprising a limited number of periods of a signal in the ultrasonic frequency range, the complete ultrasound measurement signal having a duration for example between 1 ns and 1 s, e.g. between 1 μs and 1 ms. The ultrasound measurement signal may be generated by one of the transducers picking up a burst of ultrasound generated by another of the transducers after having travelled through a fluid, to produce the ultrasound measurement signal as an electrical signal for the analog input of the analog-to-digital converter arrangement.

A sampled measurement frame according to the invention refers to a sampled signal comprising a limited number of samples of an ultrasound measurement signal. The length of a complete sampled measurement frame may correspond to the duration of the ultrasound measurement signal being sampled, for example from 1 ns to 1 s, which may for example involve from 10 samples to 10,000 samples.

By combining two or more sampled measurement frames from the same transducer, i.e. from the same measurement direction, into one measurement, e.g. by averaging, the different linearity errors are thereby also combined, e.g. averaged, leading typically to improved overall linearity of the measurements.

Alternatively, and/or in addition, the average error over time of several measurements, is also improved by the invention. In other words, the invention improves the average accuracy of calculated transit time differences, and thereby the average flow and volume measurements of a flow meter.

In particular for measuring several substantially identical ultrasound signals, as is often the case in ultrasonic flow meters, the present invention may prove advantageous, as it may avoid that the identical signals are measured with identical linearity errors. On the contrary, the present invention may cause the identical measurements to be made with different linearity errors, thereby making it possible to reduce the linearity error over time for example by averaging out the differences, by disregarding DC bias, or by subtracting added offsets.

By changing the input level offset value for each measurement, i.e. for each ultrasound signal measured, each measurement may activate an overlapping but slightly different range of steps of the converter stair. In a preferred embodiment, the peak-to-peak range of each measurement is not changed by the changing input level offset value, thereby merely causing the amplitude of the measurements to be slightly shifted, not amplified or compressed.

Using a different input level offset value for sampling each measurement frame through a series of measurement frames may improve robustness to the non-linearity of the analog-to-digital converter as each sampled measurement frame even with constant ultrasound signals may have different linearity errors so the average may have higher accuracy. In a preferred embodiment, the input level offset value is changed a few percent of full scale for each measurement.

In relation to transit-time based ultrasonic flow meters, some of the highly relevant considerations are: accuracy and consistency as flow meters are often used as input for billing and even small errors may accumulate to large errors over several years of flow; energy consumption because the flow meters are often battery operated and required to endure for 8-10 years without replacing or recharging their battery; space requirement as flow meters are often required to be mounted in extremely confined spaces; and costs as a huge number of flow meters are produced so even small cost reductions add up to significant amounts.

Reduction of the number of electronic components by integration by for example a versatile microcontroller or system-on-chip may generally improve on all the mentioned factors, as such integration leads to smaller, often energy saving, and often cheaper, flow meter designs. On the other hand, integration also requires compromises on the different functions due to a limited number of suitable microcontrollers, as compared to having separate integrated circuits for each function, e.g. A/D-converters, D/A-converters, display controllers, etc.

The present invention introduces more flexibility and facilitates the selection of microcontroller or system-on-chip by reducing the requirements to the integrated A/D-converters. This is achieved by the ability of embodiments of the present invention to improve robustness to non-linearity of for example low or medium quality A/D-converters, thereby increasing the accuracy of flow and volume measurements over time. With reduced requirements to A/D-converters, the number of available microcontrollers increases, making it possible to let other requirements, e.g. display controller functionality or price, be deciding factors.

Compared to dithering techniques, the present invention may be advantageous in the particular field of measuring ultrasonic signals in transit-time based ultrasonic flow meters, as such signals are often characterized by one or more of small scale, broadband and/or sampled at low rate. For example, in a preferred embodiment, the ultrasound signals are subsampled, i.e. sampled at a rate below the Nyquist rate related to the frequency content of the analog ultrasound signal, and due to aliasing such a sampled signal may end up as a broadband signal, for example with content in 16 out of 64 FFT bins, making it difficult or complicated to remove any applied dithering. Various techniques to analyze a subsampled signal may also be disturbed or made more complicated by conventional dithering. Further, in order to save power, ultrasonic flow meters according to the invention are preferably highly energy efficient, meaning for instance that the ultrasonic signals are transmitted with the lowest possible power, and the receiver circuit including the analog-to-digital converter arrangement preferably prioritizes energy efficiency over sensitivity. This means that any applied noise from dithering may drown or distort the utility signal beyond recovery, in particular when sampling at a low rate.

With the present invention, the input level offset is kept constant for a complete sampled measurement frame, i.e. for several samples, but is preferably changed before sampling the next measurement frame. Thereby is achieved to employ different steps of the converter stair for different measurement signals to facilitate processing to improve accuracy, without introducing further sample-to-sample noise that need to be handled, and while still having all samples of a complete sampled measurement frame being based on a common input level offset, which can, if necessary for the further processing, simply be subtracted.

Also particularly advantageously for transit-time based flow measurements, the different DC offsets applied to each measurement may in various embodiments be disregarded as the processing of the sampled measurement signals preferably takes place in the frequency domain after a Fourier transform or similar, so the DC level of the individual signals may not be relevant.

Preferably, the analog-to-digital converter is a differential analog-to-digital converter, i.e. having an analog input with two connector points, and the input level offset value and the ultrasound measurement signals are received at respective of these connector points. Preferably, the input level offset value is further offset to an approximate DC level of the ultrasound measurement signals so that the difference of measurement signal and offset value has an approximate DC level close to zero. Alternative embodiments comprise summing (adding or subtracting) the input level offset value to the measurement signal on the analog side and then input the resulting summed signal to a single ended analog-to-digital converter or to the same connector point of a differential analog-to-digital converter, e.g. using the other input for correcting a potential DC offset.

In an embodiment said input level offset provider is arranged to ensure said individual input level offset value for at least two of said ultrasound measurement signals being different.

According to the invention, different input level offset values should be used to achieve the improvement of robustness to the analog-to-digital converter non-linearity, as different offsets are possible to force the typically substantially identical ultrasound signals to be sampled at different steps of the converter transfer function stair as described above. It is therefore beneficial that the input level offset provider is arranged to ensure that different offsets are provided. This may for example be achieved by using an offset generating algorithm which calculates the next offset based on the previous offset, e.g. by incrementing, by taking the offsets from a predetermined sequence of different offsets, by determining a new offset in any way and then comparing it with the previous offset and repeat if not different, etc.

According to the invention in order to achieve the technical effect in general, it may in various embodiments be sufficient that there is a certain high probability for the provided offset being different from the previous offset, whereby making it acceptable to generate the offsets by randomising or pseudo-randomising processes, or apply an algorithm which, like randomising processes, mostly but not guaranteed produce different offsets. The practical suitability of such algorithms, including randomising and pseudo-randomising processes, depends on the risk of providing non-different offsets too often, which highly depends on the resolution and range of different offsets available, i.e. in terms of voltage sensitivity and available non-used dynamic range of the analog-to-digital converter, and the offset generator's resolution.

It is noted, that the technical effect is achieved by using different input level offset values for measurements that are going to be compared, averaged, merged or otherwise processed together to end up with a common result, for example a transit time difference determined on the basis of, e.g., 4 or 6 ultrasound measurement signals from the same transducer and sampled within a short time of each other, e.g. within between 1 ns and 1 s, for example 1 ms. Hence, for the next flow measurement for example taking place between 0.1 second and 1 minute later, the input level offset provider may in an embodiment reuse input level offset values previously provided for earlier flow measurements or generate randomised offsets, etc., only ensuring difference with other offsets used for the same flow measurement, not necessarily with offsets used for earlier flow measurements. Note the differentiation between the terms ultrasound measurement and flow measurement, the first referring to establishing a sampled measurement frame from an ultrasound measurement signal, the latter referring to a series of ultrasound measurements leading to the calculation of one absolute transit time for each direction and/or one transit-time difference. One flow measurement should be conducted within a short time where any flow changes may be considered negligible, e.g. less than 1 s, preferably less than 1 ms, whereas the periodicity of flow measurements only depends on the desired flow meter accumulation accuracy.

The technical effect may also be achieved in embodiments using only very few ultrasound measurements for each flow measurement, as the linearity errors will still be averaged out over time to result in generally improved flow measurement accuracy on average over time.

In an embodiment said input level offset provider is arranged to provide a first sequence of different input level offset values for use with a sequence of ultrasound measurement signals from a first ultrasonic transducer of said at least two ultrasonic transducers and to provide a sequence of different input level offset values for use with a sequence of ultrasound measurement signals from a second ultrasonic transducer of said at least two ultrasonic transducers.

In a preferred embodiment the ensuring different offsets may preferably be related to, and considered in the light of, a selected sequence of measurements among the different transducers. As an example, a two-transducer flow meter needing e.g. 6 measurements from each transducer, i.e. in each direction, to determine a flow representation with a predetermined acceptable accuracy, may in one embodiment be arranged to make 6 measurements from the first transducer with different input level offset values and then make 6 measurements from the second transducer with the same different or other different input level offset values, and may in another embodiment be arranged in an alternating fashion to make one measurement from each transducer with a first input level offset value, then change input level offset value and make a second measurement from each transducer, etc., until 6 pairs of measurements have been made with different input level offset values for each pair, and further embodiments may also be contemplated. In other words, the input level offset provider is according to an embodiment arranged to ensure that measurements from the same transducer are made with different offsets, whereas offsets used for different transducers may be shared or different.

In an embodiment said first and second sequences of ultrasound measurement signals each comprises 2-10 ultrasound measurement signals and said first and second sequences of different input level offset values each comprises 2-10 different input level offset values.

In other words, in a typical two-transducer transit-time flow meter setup, various embodiments preferably require a total of from 4 to 20 ultrasound measurements to determine a flow representation. The number of measurement signals used may be the same for all flow measurements of a particular flow meter model determined from the hardware design and balanced between energy and time consumption and required or desired accuracy, or may be variable and adjusted in accordance with actual achieved accuracy or a scheme of regularly making a flow measurement with more ultrasound measurements for reference purposes. As mentioned above, the ensuring different offsets may be reset at least between the mentioned sequences, i.e. for example between flow measurements.

In an embodiment said first and second sequences of different input level offset values are equal.

Thereby the measurements from each transducer are performed with equal offsets, for example advantageously based on a predetermined sequence of offsets.

In an embodiment said first and second sequences of different input level offset values contain no common values.

Thereby the absolute transit time measurements from each transducer are performed with completely different offsets, i.e. the ensuring different offsets is applied to all offsets provided for a particular complete flow measurement. Thereby the generation of different offsets do not have to be coordinated with the order of changing transducers during the measurement.

In an embodiment said first and second sequences of different input level offset values contain one or more common values.

In an embodiment the input level offset provider ensures difference within each sequence of offsets, e.g. by keeping track of previously provided offsets in each sequence, but does apply additional checking or coordination between the sequences.

In an embodiment said first and second sequences of ultrasound measurement signals are received in an alternating fashion and said input level offset provider is arranged to provide said first and second sequences of different input level offset values in a corresponding alternating fashion.

As it in some embodiments may be advantageous to switch the transmitting and receiving transducer between each or a few ultrasound measurements, the input level offset provider may be arranged to keep track of this switching or be controlled in accordance with the control of this switching to ensure different offsets within each sequence, but for various embodiments not necessarily ensuring different offsets between the sequences. In an embodiment using a predetermined sequence of offsets or where changing input level offset is relatively slow it may be advantageous to alternate between the transducers and reuse one input level offset value for ultrasound measurement signals from all transducers, before changing to the next offset value.

In an embodiment said input level offset provider is arranged to determine at least one of said input level offset values on the basis of a previous input level offset value by an operation causing the new input level offset value to be different from said previous input level offset value.

When generating a new offset value based on a previous offset value several algorithms are available which ensures that the new value is different from the previous, for example as simple as always incrementing by a certain amount, or applying more advanced operations for example an injective function using the previous offset value as input. The operation may be wrapping in the sense that it may start over with the same or a different offset value, depending on the increment, when reaching the end of its range, for example letting an incrementing operation wrap back to the first value before a further increment causes the signal with offset to exceed the dynamic range of the analog-to-digital converter.

In an embodiment said operation comprises an increment operation or a decrement operation.

An advantageously simple operation ensuring different offset values may be simple incrementing or decrementing functions, or variations thereof.

In an embodiment said input level offset provider is communicatively coupled to or comprises a memory.

In various advantageous embodiments the memory may for example be used to store predetermined offset values, predetermined starting value for an offset generating algorithm, one or more previous offset values, etc. The memory may be a separate memory, a shared system memory, a register of a microcontroller, internal microcontroller or system-on-chip memory, etc., and may be of any suitable kind, e.g. flash, RAM, ROM, etc.

In an embodiment said input level offset provider is arranged to provide said input level offset value from a sequence of predetermined input level offset values stored in said memory.

In an embodiment said input level offset provider is arranged to store a history of at least one previous input level offset value for each transducer in said memory.

In an embodiment said input level offset provider is arranged to provide said input level offset value on the basis of a randomly or pseudo-randomly selected value.

The input level offset value may for example be determined as the result of a random( ) function supplied with appropriate arguments regarding output range, or a result of a random( ) function may be used as starting value for an offset generating algorithm. Pseudo-random values may for example be obtained by using a single arbitrary output sample obtained during silence, i.e. the sample comprising an arbitrary noise-value, or by using a single arbitrary output sample from an earlier sampled measurement frame, or be obtained from one or more LSBs from an ever changing memory location, e.g. a system timer for example counting milliseconds, etc.

In an embodiment said pseudo-randomly selected value is derived from one of said sampled measurement frames.

In an embodiment said individual input level offset values are different by less than 15%, preferably less than 10%, more preferably around 5%, 3%, or 1%, of a full range of said analog-to-digital converter.

Preferably, the input level offset values are small, only a few percent of ADC full range, to facilitate keeping the complete signal within the dynamic range of the analog-to-digital converter. To force the conversion to go up or down one step of the transfer function stair, in theory the offset does not have to be larger than the input voltage corresponding to one LSB output change of the analog-to-digital converter. For a 10-bit analog-to-digital converter having 1024 steps, one step or LSB represents ideally about 0.1% of full range. In a preferred embodiment the change is in practice set a little higher, e.g. about 1%, 3% or 5%, to ensure that a completely different step is utilised even in case of severe non-linearities.

In an embodiment said analog input of said analog-to-digital converter comprises a differential input with two connector points.

By implementing the analog-to-digital converter with differential analog input is advantageously achieved a simple option of providing the ultrasound measurement signal and the input level offset value to two different connector points, thereby avoiding a need to providing a summing or subtraction point to merge the two inputs.

In an embodiment said ultrasound measurement signals and said input level offset value are coupled to different of said two connector points.

In an embodiment said input level offset provider comprises a digital-to-analog converter.

For simple and convenient establishment of the input level offset values various preferred embodiments utilise a digital-to-analog converter to generate the offset values. This may be particularly advantageous when the flow meter comprises a microcontroller or system-on-chip comprising on-chip converters directly controllable by the processing unit and easily connectable with none or only little auxiliary circuitry.

In an embodiment said processing unit is arranged to control said input level offset provider.

In an embodiment said processing unit is implemented in a microcontroller or a system-on-chip of said transit-time ultrasonic flow meter, and wherein said microcontroller or system-on-chip comprises an analog-to-digital converter of said analog-to-digital converter arrangement and a digital-to-analog converter of said input level offset provider.

An example of a suitable microcontroller is for example the EFM32G890 from Silicon Laboratories, Inc.

In an embodiment the input level offset provider is arranged to add a DC correction value to said input level offset value to offset a DC level of the ultrasound measurement signal to within 20%, preferably within 10%, for example within 5%, of a median of a dynamic range of the analog-to-digital converter.

Besides the per-measurement DC offset change described above to achieve better linearity properties of the analog-to-digital conversion, the input level offset provider may in addition be employed to add a DC correction value to balance the ultrasound measurement signal substantially in the middle of the dynamic range of the analog-to-digital converter, for example within 20% of the median of the range. Thereby is reduced the risk of clipping and/or facilitated an adaptive dynamic range feature of the analog-to-digital converter, making it possible to match the dynamic range to be for example from 105% to 125% of the signal amplitude, without risking clipping by an unexpected DC level.

In an embodiment said at least four ultrasound measurement signals are consecutive ultrasound measurement signals.

The present invention is particularly advantageous when applied to consecutive signals, i.e. a number of signals measured within a short time and related to the same or consecutive flow measurements.

In an embodiment said at least four ultrasound measurement signals comprises 4 to 20 ultrasound measurement signals.

As mentioned above, a typical two-transducer transit-time flow meter setup, in various embodiments preferably require a total of from 4 to 20 ultrasound measurements to determine a flow representation, i.e. determining the flow representation on the basis of 2 to 10 ultrasound measurements from each direction, i.e. each transducer. The number of measurement signals used may be the same for all flow measurements of a particular flow meter model determined from the hardware design and balanced between energy and time consumption and required or desired accuracy, or may be variable and adjusted in accordance with actual achieved accuracy or a scheme of regularly making a flow measurement with more ultrasound measurements for reference purposes. The ensuring different offsets may be reset after the mentioned number of ultrasound measurements, i.e. after for example 4 to 20 ultrasound measurements, i.e. for example between flow measurements.

In an embodiment said sampled measurement frame comprises 10 to 10,000 samples.

Several separate, finite ultrasound signals are measured, as mentioned above, and for each measured ultrasound signal, a finite sampled measurement frame is established. The number of samples per frame equals the length of the ultrasound signal multiplied with the sample rate. Short signals measured at low sample rate cause short frames of possibly as little as for example 10 samples. Longer signals and/or high sample rate produces larger frames. Various preferred flow meter embodiments make use of undersampling, for example for energy consumption reasons as higher rates consumes much more energy, for cost reasons as higher rate converters including supporting circuitry are typically more expensive, or for availability reasons as only a narrow range of microcontrollers with fast converters e.g. working above 1 million samples per second (MSPS) exist. Undersampling typically causes relatively short sampled measurement frames, e.g. comprising 20-80 samples, for example 40 samples.

In an embodiment said processing unit is arranged to calculate at least one transit time difference on the basis of at least two of said at least four ultrasound measurement signals being received from one of said at least two transducers and on the basis of at least two other of said at least four ultrasound measurement signals being received from another one of said at least two transducers.

The at least four, for example 4-20, ultrasound measurement signals are used to calculate at least a transit time difference based on ultrasound measurements from both transducers, i.e. based on measurements in both directions. For example in a two-transducer setup, half of the signals are from the first transducer and related to one direction, and the other half of the signals are from the second transducer and related to the opposite direction. Note that the signals of one half does not need to be the first half. In other words, a measurement schedule of one embodiment may involve measuring all desired signals from the first transducer before proceeding to measure all desired signals from the other transducer, whereas another embodiment may have a measurement schedule alternating between the two transducers, with one or e.g. two or three, signals measured before turning to the other transducer, and yet other embodiments may have even more complex measurement schedules.

This also means, that the ensuring different input level offset values is preferably performed for at least as long as sufficient signals has been sampled, as described above. After that, the ensuring different input level offset values may be reset, e.g. by starting over with the initial value of an incrementing offset generating algorithm.

The determining a transit time and/or a transit-time difference from one or more sampled ultrasound signals is well-known to the skilled person, see for example several techniques for this described in PCT patent application publication WO2011/134470A2, hereby incorporated by reference. Various embodiments may determine a transit-time difference from each pair of sampled measurement frames and then average or otherwise combine or merge at least two determined transit-time differences, whereas other various embodiments may average or otherwise combine or merge at least two sampled measurement frames and determine one transit-time difference therefrom.

In an embodiment said processing unit is arranged to calculate at least one of said transit-time based flow representation using said calculated at least one transit time difference.

The at least four, for example 4-20, ultrasound measurement signals are via determining a transit time difference as described above, used to calculate said transit-time based flow representation. This also means, that the ensuring different input level offset values is preferably performed for at least as long as sufficient signals has been sampled to calculate a transit-time based flow representation. After that, the ensuring different input level offset values may be reset, e.g. by starting over with the initial value of an incrementing offset generating algorithm.

The calculation of a transit-time based flow representation is well-known to the skilled person, see for example PCT patent application publication WO2011/134470A2, hereby incorporated by reference.

In an embodiment said processing unit is arranged to calculate at least one of said transit-time based flow representation from said at least four sampled measurement frames.

Various embodiments allow for calculating the flow representation in different ways, using for example various differences or sums related to the transit times, and/or absolute transit times.

In an embodiment the analog-to-digital converter arrangement comprises a reference voltage provider arranged to provide a reference voltage to a reference voltage input of said analog-to-digital converter.

Thereby is further made possible to control the reference voltage, i.e. the dynamic range, of the analog-to-digital converter, which may be used in various advantageous ways in various embodiments as described below.

In an embodiment the reference voltage provider is arranged to provide an individual reference voltage for at least two of said ultrasound measurement signals, each individual reference voltage being different.

By providing different reference voltages for the individual measurements of substantially identical ultrasound measurement signals, the converter may be forced to use different steps of the transfer function stair for the individual signals, i.e. achieving a similar effect as obtained by the utilization of different input level offset values for the individual signals. As a changing of voltage reference leading to a larger or smaller dynamic range does not necessarily offset the signal but instead in practice changes the resolution available for the peak-to-peak amplitude of the signal, a combination of controlling both input level offset values and reference voltages during the measurements makes it possible to sample the signal in more different ways without requiring large offsets. In other words, if several measurements, e.g. 10 measurements, are desired with different conversions, instead of applying 10 different input level offset values, various combinations of a few, e.g. 4, different input level offset values and a few, e.g. 3, different reference voltages may provide similar results in terms of improved flow representations and volume measurements over time.

In an embodiment said establishment of a sampled measurement frame is based on the respective ultrasound measurement signal, said input level offset value and said reference voltage.

In an embodiment said reference voltage provider is arranged to ensure said individual reference voltage for at least two of said ultrasound measurement signals being different.

According to the invention, different reference voltages are preferably used to achieve the additional improvement of robustness to the analog-to-digital converter non-linearity, as different reference voltages are possible to facilitate the forcing the typically substantially identical ultrasound signals to be sampled at different steps of the converter transfer function stair as described above. It is therefore beneficial that the reference voltage provider is arranged to ensure that different reference voltages are provided. This may for example be achieved by using a reference voltage generating algorithm which calculates the next reference voltage based on the previous reference voltage, e.g. by incrementing, by taking the reference voltages from a predetermined sequence of different reference voltages, by determining a new reference voltage in any way and then comparing it with the previous reference voltage and repeat if not different, etc.

According to the invention in order to achieve the technical effect in general, it may in various embodiments be sufficient that there is a certain high probability for the provided reference voltage being different from the previous reference voltage, whereby making it acceptable to generate the reference voltages by randomising or pseudo-randomising processes, or apply an algorithm which, like randomising processes, mostly but not guaranteed produce different reference voltages. The practical suitability of such algorithms, including randomising and pseudo-randomising processes, depends on the risk of providing non-different reference voltages too often, which highly depends on the resolution and range of different reference voltages available, i.e. in terms of voltage sensitivity and available non-used dynamic range of the analog-to-digital converter, and the reference voltage generator's resolution.

It is noted, that the technical effect is achieved by using different reference voltages for measurements that are going to be compared, averaged, merged or otherwise processed together to end up with a common result, for example a transit time difference determined on the basis of, e.g., 4 or 6 ultrasound measurement signals from each transducer and sampled within a short time of each other, e.g. within between 1 ns and 1 s, for example 1 ms. Hence, for the next flow measurement for example taking place between 0.1 second and 1 minute later, the reference voltage provider may in an embodiment reuse reference voltages previously provided for earlier flow measurements or generate randomised reference voltages, etc., only ensuring difference with other reference voltages used for the same flow measurement, not necessarily with reference voltages used for earlier flow measurements.

In an embodiment said reference voltage provider is arranged to provide a first sequence of different reference voltages for use with a sequence of ultrasound measurement signals from a first ultrasonic transducer of said at least two ultrasonic transducers and to provide a sequence of different reference voltages for use with a sequence of ultrasound measurement signals from a second ultrasonic transducer of said at least two ultrasonic transducers.

In a preferred embodiment the ensuring different reference voltages may preferably be related to, and considered in the light of, a selected sequence of measurements among the different transducers. As an example, a two-transducer flow meter needing e.g. 6 measurements from each transducer, i.e. in each direction, to determine a transit time difference with a predetermined acceptable accuracy, may in one embodiment be arranged to make 6 measurements from the first transducer with different reference voltages and then make 6 measurements from the second transducer with the same different or other different reference voltages, and may in another embodiment be arranged in an alternating fashion to make one measurement from each transducer with a first reference voltage, then change reference voltage and make a second measurement from each transducer, etc., until 6 pairs of measurements have been made with different reference voltages for each pair, and further embodiments may also be contemplated. In other words, the reference voltage provider is according to an embodiment arranged to ensure that measurements from the same transducer are made with different reference voltages, whereas reference voltages used for different transducers may be shared or different. This may further be coordinated or not coordinated with the variation of input level offset values according to the invention in several different ways to facilitate numerous different conversions made from highly similar signals to improve the accuracy of the conversions in average.

In an embodiment said individual reference voltages are different by less than 15%, preferably less than 10%, more preferably around 5%, 3% or 1% or 0.5%, of a reference voltage of said analog-to-digital converter.

Preferably, the changes of reference voltages are small, only a few percent or even less of the ADC full range, to facilitate keeping the complete signal within a significant part of the dynamic range of the analog-to-digital converter.

In an embodiment said reference voltage provider comprises a digital-to-analog converter.

For simple and convenient establishment of the reference voltages various preferred embodiments utilise a digital-to-analog converter to generate the reference voltages. This may be particularly advantageous when the flow meter comprises a microcontroller or system-on-chip comprising on-chip converters directly controllable by the processing unit and easily connectable with none or only little auxiliary circuitry. In an embodiment with a differential voltage reference, two digital-to-analog converters are preferably applied to produce the composite reference voltage.

In an embodiment said processing unit is arranged to control said reference voltage provider.

It is highly advantageous to let the processing unit control both the input level offset provider and the reference voltage provider to achieve a coordination and thereby possible synergy of the various possible accuracy improvement techniques described above.

In an embodiment the reference voltage provider is arranged to provide a dynamic range correction value to said reference voltage input to accommodate an amplitude of the ultrasound measurement signal within 80%, preferably within 90%, for example within 95%, of a dynamic range of the analog-to-digital converter.

The reference voltage provider may advantageously be employed to add a dynamic range correction value to match the dynamic range substantially to the ultrasound measurement signal, preferably with a margin for safety and to allow the input level offset value changes. The dynamic range correction value may for example be determined with an aim of the ultrasound measurement signal amplitude being about 80%-90% of the dynamic range. Thereby is reduced the risk of clipping and/or facilitated a DC correction feature of the analog-to-digital converter, making it possible to match the dynamic range to be for example from 105% to 125% of the signal amplitude, with reduced risk of clipping by an unexpected DC level.

This feature of the reference voltage provider may in an embodiment be combined with the above-described feature of using the reference voltage provider to ensure a changing reference voltage for at least two of the at least four ultrasound measurement signals.

In an embodiment the reference voltage provider is arranged to add said dynamic range correction value to said reference voltage.

In an embodiment the analog-to-digital converter arrangement comprises a timing signal provider arranged to provide a timing signal comprising a frame offset to a sample timing input of said analog-to-digital converter.

Thereby is further made possible to control the timing of starting sampling the individual frame, i.e. a time offset, of the analog-to-digital converter, which may be used in various advantageous ways in various embodiments as described below.

The frame offset may for example indicate the sample start time relative to the ultrasound transmission time, relative to a reference start time, as an absolute time, etc. The frame offset may be positive or negative with relation to a reference or nominal start time. The frame length may be adjusted correspondingly to ensure that the last portion of the signal is sampled even with an earlier frame start time, or the frame length may be selected sufficiently long to accommodate the signal regardless of any reasonable frame offset. In a preferred embodiment, the frame offset is changed a fraction of a duration of a sample at the respective sample rate for each measurement. In preferred embodiments, the frame offsets used for the different measurements may range from −0.5 to +0.5 times a sample duration, or from +0.05 to +0.95 times a sample duration. In various embodiments the frame offset will advantageously be synchronised with a system clock in order to facilitate selecting a certain fraction of the sample rate as frame start. Such embodiments preferably comprise a system clock being at least, e.g., 4-20 times faster than the sample rate, thereby facilitating, in that example, 4-20 different frame offsets to vary between in accordance with the invention. The largest improvements are achieved in systems with relatively low sample rates compared to the signal's frequency content, as the signal should preferably change considerably during the frame offset to reach a different converter step by the application of the frame offset. The timing signal comprising the frame offset may be implemented in accordance with the particular analog-to-digital converter used. For analog-to-digital converters having a start signal, e.g. a start-bit, a start-pin, a reset-pin, a frame input, or always starting whenever not holding, etc, the timing signal comprising the frame offset may be applied to such control bit or pin accordingly as a start signal or by controlling the start signal. For embodiments without such start signal, the frame offset may be applied to the analog-to-digital converter clock signal, in order to offset the clock signal slightly, e.g. by pausing.

Further embodiments comprise a combination of the providing of an input level offset value as described above with the providing of a frame offset as described in more detail here below, possibly also in combination with the providing of a reference voltage as described above.

In an embodiment the timing signal provider is arranged to provide an individual frame offset for at least two of said ultrasound measurement signals, each individual frame offset being different.

By providing different frame offsets for the individual measurements of substantially identical ultrasound measurement signals, the converter may be forced to use different steps of the transfer function stair for the individual signals, i.e. achieving a similar effect as obtained by the utilization of different input level offset values for the individual signals. As a changing of input level offset value is a level offset and the changing of frame offsets according to the invention is a time offset, a combination of controlling both input level offset values and frame offsets during the measurements makes it possible to sample the signal in more different ways without requiring large input level offset changes.

In an embodiment said establishment of a sampled measurement frame is based on the respective ultrasound measurement signal, said input level offset value, said frame offset, and preferably said reference voltage.

In an embodiment said timing signal provider is arranged to ensure said individual frame offset for at least two of said ultrasound measurement signals being different.

According to the invention, different frame offsets should be used to achieve the improvement of robustness to the analog-to-digital converter non-linearity, as different frame offsets are possible to force the typically substantially identical ultrasound signals to be sampled at different steps of the converter transfer function stair as described above. It is therefore beneficial that the timing signal provider is arranged to ensure that different frame offsets are provided. This may for example be achieved by using a frame offset generating algorithm which calculates the next frame offset based on the previous frame offset, e.g. by incrementing, by taking the frame offsets from a predetermined sequence of different frame offsets, by determining a new frame offset in any way and then comparing it with the previous frame offset and repeat if not different, etc.

According to the invention in order to achieve the technical effect in general, it may in various embodiments be sufficient that there is a certain high probability for the provided frame offset being different from the previous frame offset, whereby making it acceptable to generate the frame offsets by randomising or pseudo-randomising processes, or apply an algorithm which, like randomising processes, mostly but not guaranteed produce different offsets. The practical suitability of such algorithms, including randomising and pseudo-randomising processes, depends on the risk of providing non-different frame offsets too often, which highly depends on the time resolution and range of different offsets available, i.e. in terms of sub-sample timing possibilities, i.e. fractions of a sample duration as described above.

It is noted, that the technical effect is achieved by using different frame offsets for measurements that are going to be compared, averaged, merged or otherwise processed together to end up with a common result, for example a transit time difference determined on the basis of, e.g., 4 or 6 ultrasound measurement signals from each transducer and sampled within a short time of each other, e.g. within between 1 ns and 1 s, for example 1 ms. Hence, for the next flow measurement for example taking place between 0.1 second and 1 minute later, the timing signal provider may in an embodiment reuse frame offsets previously provided for earlier flow measurements or generate randomised frame offsets, etc., only ensuring difference with other frame offsets used for the same flow measurement, not necessarily with frame offsets used for earlier flow measurements.

In an embodiment said timing signal provider is arranged to provide a first sequence of different frame offsets for use with a sequence of ultrasound measurement signals from a first ultrasonic transducer of said at least two ultrasonic transducers and to provide a sequence of different frame offsets for use with a sequence of ultrasound measurement signals from a second ultrasonic transducer of said at least two ultrasonic transducers.

In a preferred embodiment the ensuring different frame offsets may preferably be related to, and considered in the light of, a selected sequence of measurements among the different transducers. As an example, a two-transducer flow meter needing e.g. 6 measurements from each transducer, i.e. in each direction, to determine a transit time difference with a predetermined acceptable accuracy, may in one embodiment be arranged to make 6 measurements from the first transducer with different frame offsets and then make 6 measurements from the second transducer with the same different or other different frame offsets, and may in another embodiment be arranged in an alternating fashion to make one measurement from each transducer with a first frame offset, then change frame offset and make a second measurement from each transducer, etc., until 6 pairs of measurements have been made with different frame offsets for each pair, and further embodiments may also be contemplated. In other words, the timing signal provider is according to an embodiment arranged to ensure that measurements from the same transducer are made with different frame offsets, whereas frame offsets used for different transducers may be shared or different. This may further be coordinated or not coordinated with the variation of input level offset value according to the invention in several different ways to facilitate numerous different conversions made from highly similar signals to improve the accuracy of the conversions in general.

In an embodiment said individual frame offsets are different by less than a duration of a single sample, e.g. no more than 50%, preferably no more than 25%, more preferably no more than 15%, e.g. 12%, 8%, or 4%, of a duration of a single sample.

Preferably, the frame offsets are small, less than half a sample duration, as described above.

In an embodiment said sample timing input of said analog-to-digital converter comprises a control input for commanding the analog-to-digital converter to start sampling a sampled measurement frame; and wherein a control signal for said control input is based on said frame offset.

In an advantageous embodiment, the transit-time ultrasonic flow meter is arranged with a reference frame start time defined in relation to the ultrasound transmission start time and being a little shorter than the expected transit-time. The frame start control signal for the analog-to-digital converter may for example be based on such reference start time with the addition, or subtraction, of the frame offset determined for that respective measurement.

In an embodiment said timing signal provider comprises a digital-to-analog converter.

For simple and convenient establishment of the frame offsets various preferred embodiments utilise a digital-to-analog converter to generate the frame offsets or control signals, e.g. a start signal, based on the frame offsets. This may be particularly advantageous when the flow meter comprises a microcontroller or system-on-chip comprising on-chip converters directly controllable by the processing unit and easily connectable with none or only little auxiliary circuitry.

In an embodiment said processing unit is arranged to control said timing signal provider.

It is highly advantageous to let the processing unit control both the timing signal provider and the input level offset provider to achieve a coordination and thereby possible synergy of the various possible accuracy improvement techniques described above.

In an embodiment the timing signal provider is arranged to add a reference frame start time to said frame offset to offset start of sampling by a little less than an expected transit time.

In an embodiment the analog-to-digital converter arrangement comprises a timing signal provider arranged to provide a timing signal comprising a sample rate to a sample timing input of said analog-to-digital converter.

Thereby is further made possible to control the timing of sampling the individual frame, i.e. a time scaling, of the analog-to-digital converter, which may be used in various advantageous ways in various embodiments as described below. The timing signal provider may for example be arranged to provide said timing signal comprising both a frame offset and a sample rate, and the sample timing input may comprise an input for frame offset and an input for sample rate.

In a preferred embodiment, the sample rate is defined as a division of a faster system or reference clock, and the sample rate can therefore be changed by selecting a different divisor for each measurement. The timing signal may also comprise the sample clock of desired sample rate, or parameters to establish a clock at the desired sample rate. The largest improvements are achieved in systems with relatively low sample rates compared to the signal's frequency content, as the signal should preferably change considerably between each sample to reach a different converter step by the application of the changing sample rate. The timing signal comprising the sample rate may be implemented in accordance with the particular analog-to-digital converter used. For analog-to-digital converters having a sampling clock input as part of the signal timing input, the timing signal provider may establish the timing signal as a sampling clock with the desired clock rate and apply it to such sampling clock input. For embodiments with a divisor input for establishing the sampling clock from a system clock by division to control the sample rate, the timing signal provider may establish the timing signal as a control signal comprising the divisor or other suitable control value.

Hence, the signal timing input may comprise several inputs, e.g. a sample clock input or a divisor input and e.g. a sample start input, etc.

Further embodiments comprise a combination of the providing of an input level offset value as described above with the providing of a sample rate as described in more detail here below, possibly also in combination with the providing of a frame offset and/or the providing of a reference voltage as described above.

In an embodiment the timing signal provider is arranged to provide an individual sample rate for at least two of said ultrasound measurement signals, each individual sample rate being different.

By providing different sample rates for the individual measurements of substantially identical ultrasound measurement signals, the converter may be forced to use different steps of the transfer function stair for the individual signals, i.e. achieving a similar effect as obtained by the utilization of different input level offset values for the individual signals according to the invention. As a changing of sample rate is a time scaling and the changing of input level offset value is a level offset, a combination of controlling both sample rates and input level offset values during the measurements makes it possible to sample the signal in more different ways without requiring large reference voltage changes.

In an embodiment said establishment of a sampled measurement frame is based on the respective ultrasound measurement signal, said input level offset value and said sample rate, and preferably one or more of said frame offset and said reference voltage.

In an embodiment said timing signal provider is arranged to ensure said individual sample rate for at least two of said ultrasound measurement signals being different.

Different sample rates should be used to achieve the improvement of the analog-to-digital converter non-linearity robustness, as different sample rates are possible to force the typically substantially identical ultrasound signals to be sampled at different steps of the converter transfer function stair as described above. It is therefore beneficial that the timing signal provider is arranged to ensure that different sample rates are provided. This may for example be achieved by using a sample rate generating algorithm which calculates the next sample rate based on the previous sample rate, e.g. by incrementing, by taking the sample rates from a predetermined sequence of different sample rates, by determining a new sample rate in any way and then comparing it with the previous sample rate and repeat if not different, etc.

In order to achieve the technical effect in general, it may in various embodiments be sufficient that there is a certain high probability for the provided sample rate being different from the previous sample rate, whereby making it acceptable to generate the sample rates by randomising or pseudo-randomising processes, or apply an algorithm which, like randomising processes, mostly but not guaranteed produce different sample rates. The practical suitability of such algorithms, including randomising and pseudo-randomising processes, depends on the risk of providing non-different sample rates too often, which highly depends on the time resolution and range of different sample rates available, i.e. in terms of clock division possibilities as described above.

It is noted, that the technical effect is achieved by using different sample rates for measurements that are going to be compared, averaged, merged or otherwise processed together to end up with a common result, for example a transit time difference determined on the basis of, e.g., 4 or 6 ultrasound measurement signals from each transducer and sampled within a short time of each other, e.g. within between 1 ns and 1 s, for example 1 ms. Hence, for the next flow measurement for example taking place between 0.1 second and 1 minute later, the timing signal provider may in an embodiment reuse sample rates previously provided for earlier flow measurements or generate randomised sample rates, etc., only ensuring difference with other sample rates used for the same flow measurement, not necessarily with sample rates used for earlier flow measurements.

In an embodiment wherein said timing signal provider is arranged to provide a first sequence of different sample rates for use with a sequence of ultrasound measurement signals from a first ultrasonic transducer of said at least two ultrasonic transducers and to provide a sequence of different sample rates for use with a sequence of ultrasound measurement signals from a second ultrasonic transducer of said at least two ultrasonic transducers.

In a preferred embodiment the ensuring different sample rates may preferably be related to, and considered in the light of, a selected sequence of measurements among the different transducers. As an example, a two-transducer flow meter needing e.g. 6 measurements from each transducer, i.e. in each direction, to determine a transit time difference with a predetermined acceptable accuracy, may in one embodiment be arranged to make 6 measurements from the first transducer with different sample rates and then make 6 measurements from the second transducer with the same different or other different sample rates, and may in another embodiment be arranged in an alternating fashion to make one measurement from each transducer with a first sample rate, then change sample rate and make a second measurement from each transducer, etc., until 6 pairs of measurements have been made with different sample rates for each pair, and further embodiments may also be contemplated. In other words, the timing signal provider is according to an embodiment arranged to ensure that measurements from the same transducer are made with different sample rates, whereas sample rates used for different transducers may be shared or different. This may further be coordinated or not coordinated with the variation of input level offset values according to the invention in several different ways to facilitate numerous different conversions made from highly similar signals to improve the accuracy of the conversions in average.

In an embodiment wherein said individual sample rates are different by 1%-10%, e.g. one individual sample rate being between 92% and 98% or between 102% and 108% of a previous individual sample rate, e.g. 95% or 105% of a previous individual sample rate.

Preferably, the sample rate changes are sufficiently large to change the individual sample significantly so that at least a portion of the samples get converted at different conversion steps than the previous measurement signal. On the other hand, the change of sample rate should be sufficiently small to allow the same number of total samples, e.g. 40 samples, to cover primary features of the measurement signal, including the beginning and end of the signal. Increasing the sample rate too much, in some embodiments for example more than 10%, may cause a fixed number of samples selected to cover the entire signal at a nominal sample rate, e.g. 40 samples, to not cover the end of the signal at the significantly higher rate. Likewise, reducing the sample rate too much, in some embodiments for example more than 10%, may cause a fixed number of samples selected to cover the entire signal at a nominal sample rate, e.g. 40 samples, to be separated too much and a number of the samples being used for a useless sampling of silence following the measurement signal.

In an embodiment said sample timing input of said analog-to-digital converter comprises a sample clock input or sample rate divisor input for controlling a sample rate of the analog-to-digital converter; and wherein a control signal for said sample clock input or sample rate divisor input is based on said sample rate.

In an embodiment said timing signal provider comprises a digital-to-analog converter.

For simple and convenient establishment of the sample rates various preferred embodiments utilise a digital-to-analog converter to generate the sample rates or control signals, e.g. a divisor or clock signal, based on the sample rates. This may be particularly advantageous when the flow meter comprises a microcontroller or system-on-chip comprising on-chip converters directly controllable by the processing unit and easily connectable with none or only little auxiliary circuitry.

In an embodiment said processing unit is arranged to control said timing signal provider with respect to said sample rate.

It is highly advantageous to let the processing unit control the timing signal provider with respect to sample rate to achieve a coordination and thereby possible synergy of the various possible accuracy improvement techniques described above.

In an aspect the invention relates to a method for calculating a transit-time based flow representation in a transit-time ultrasonic flow meter comprising at least two ultrasonic transducers, an analog-to-digital converter arrangement for sampling ultrasound measurement signals from the ultrasonic transducers and a processing unit for said calculating, the method comprising the steps of:

providing by an input level offset provider an input level offset value to an analog input of an analog-to-digital converter of said analog-to-digital converter arrangement;

establishing an ultrasound measurement signal by one of said at least two ultrasonic transducers;

receiving said ultrasound measurement signal at said analog input;

establishing by the analog-to-digital converter a sampled measurement frame with at least 10 samples on the basis of said ultrasound measurement signal and the input level offset value;

providing said sampled measurement frame at a sample output of said analog-to-digital converter coupled to said processing unit;

repeating the above steps with a total of at least four ultrasound measurement signals, wherein said providing said input level offset value comprises providing a different input level offset value for at least two of said at least four ultrasound measurement signals; and calculating one or more transit-time based flow representations by the processing unit on the basis of a sampled measurement frame from each of said repetitions.

Different Reference Voltages

In an aspect the invention relates to a transit-time ultrasonic flow meter comprising at least two ultrasonic transducers, an analog-to-digital converter arrangement for sampling ultrasound measurement signals from the ultrasonic transducers and a processing unit for calculating a transit-time based flow representation from the sampled measurement signals;

wherein the analog-to-digital converter arrangement comprises:
  an analog-to-digital converter comprising an analog input, a reference voltage input and a sample output; and
  a reference voltage provider arranged to provide a reference voltage to the reference voltage input;

wherein the analog-to-digital converter arrangement is arranged to receive at least four ultrasound measurement signals from the ultrasonic transducers and provide the ultrasound measurement signals to the analog input;

wherein the reference voltage provider is arranged to provide an individual reference voltage for at least two of said ultrasound measurement signals, each individual reference voltage being different; and wherein the analog-to-digital converter is arranged to establish for each of the at least four ultrasound measurement signals a sampled measurement frame with at least 10 samples on the basis of the respective ultrasound measurement signal and the reference voltage and provide the sampled measurement frame at the sample output coupled to said processing unit.

The invention may improve transit-time based flow measurements by improving the robustness against non-linearity of the analog-to-digital conversion of ultrasound measurements on which the transit-time calculations are based. By the present invention, the average error over time of transit-time difference measurements, and thereby of determined flow representations and volume measurements of the flow meter are improved.

The transfer function of an analog-to-digital converter may be illustrated as a stair, where the number of steps of the stair corresponds to the resolution of the converter and a varying width of the individual steps illustrates non-linearities of the converter. By applying a different individual reference voltage, i.e. height of the transfer function stair, for each ultrasound measurement signal during a series of measurement signals, different steps of the stair, typically with different linearity errors, of the analog-to-digital converter are employed to produce each sampled measurement frame. Also in the case of a differential voltage reference where the lower reference is also controllable and not tied to ground, a synchronized variation of the high and low reference to maintain a constant dynamic range between them can be used to change the steps of the stair employed to produce each sampled measurement frame.

An ultrasound measurement signal according to the invention refers to a signal comprising a limited number of periods of a signal in the ultrasonic frequency range, the complete ultrasound measurement signal having a duration for example between 1 ns and 1 s, e.g. between 1 µs and 1 ms. The ultrasound measurement signal may be generated by one of the transducers picking up a burst of ultrasound generated by another of the transducers after having travelled through a fluid, to produce the ultrasound measurement signal as an electrical signal for the analog input of the analog-to-digital converter arrangement.

A sampled measurement frame according to the invention refers to a sampled signal comprising a limited number of samples of an ultrasound measurement signal. The length of a complete sampled measurement frame may correspond to the duration of the ultrasound measurement signal being sampled, for example from 1 ns to 1 s, which may for example involve from 10 samples to 10,000 samples.

By combining two or more sampled measurement frames from the same transducer, i.e. from the same measurement direction, into one measurement, e.g. by averaging, the different linearity errors are thereby also combined, e.g. averaged, leading typically to improved overall linearity of the measurements.

Alternatively, and/or in addition, the average error over time of several measurements, is also improved by the invention. In other words, the invention improves the average accuracy of calculated transit time differences, and thereby the average flow and volume measurements of a flow meter.

In particular for measuring several substantially identical ultrasound signals, as is often the case in ultrasonic flow meters, the present invention may prove advantageous, as it may avoid that the identical signals are measured with identical linearity errors. On the contrary, the present invention may cause the identical measurements to be made with different linearity errors, thereby making it possible to reduce the linearity error over time for example by averaging out the differences, by disregarding DC bias, or by compensating the output for the varying reference voltage.

By changing the reference voltage for each measurement, i.e. for each ultrasound signal measured, each measurement may activate an overlapping but slightly different range of steps of the converter stair.

Using a different reference voltage for sampling each measurement frame through a series of measurement frames may improve robustness to the non-linearity of the analog-to-digital converter as each sampled measurement frame even with constant ultrasound signals may have different linearity errors so the average may have higher accuracy. In a preferred embodiment, the reference voltage is changed less than 1% of the reference voltage for each measurement.

In relation to transit-time based ultrasonic flow meters, some of the highly relevant considerations are: accuracy and consistency as flow meters are often used as input for billing and even small errors may accumulate to large errors over several years of flow; energy consumption because the flow meters are often battery operated and required to endure for 8-10 years without replacing or recharging their battery; space requirement as flow meters are often required to be mounted in extremely confined spaces; and costs as a huge number of flow meters are produced so even small cost reductions add up to significant amounts.

Reduction of the number of electronic components by integration by for example a versatile microcontroller or system-on-chip may generally improve on all the mentioned factors, as such integration leads to smaller, often energy saving, and often cheaper, flow meter designs. On the other hand, integration also requires compromises on the different functions due to a limited number of suitable microcontrollers, as compared to having separate integrated circuits for each function, e.g. A/D-converters, D/A-converters, display controllers, etc.

The present invention introduces more flexibility and facilitates the selection of microcontroller or system-on-chip by reducing the requirements to the integrated A/D-converters. This is achieved by the ability of embodiments of the present invention to improve robustness to non-linearity of for example low or medium quality A/D-converters, thereby increasing the accuracy of flow and volume measurements over time. With reduced requirements to A/D-converters, the number of available microcontrollers increases, making it possible to let other requirements, e.g. display controller functionality or price, be deciding factors.

Compared to dithering techniques, the present invention may be advantageous in the particular field of measuring ultrasonic signals in transit-time based ultrasonic flow meters, as such signals are often characterized by one or more of small scale, broadband and/or sampled at low rate. For example, in a preferred embodiment, the ultrasound signals are subsampled, i.e. sampled at a rate below the Nyquist rate related to the frequency content of the analog ultrasound signal, and due to aliasing such a sampled signal may end up as a broadband signal, for example with content in 16 out of 64 FFT bins, making it difficult or complicated to remove any applied dithering. Various techniques to analyze a subsampled signal may also be disturbed or made more complicated by conventional dithering. Further, in order to save power, ultrasonic flow meters according to the invention are preferably highly energy efficient, meaning for instance that the ultrasonic signals are transmitted with the lowest possible power, and the receiver circuit including the analog-to-digital converter arrangement preferably prioritizes energy efficiency over sensitivity. This means that any applied noise from dithering may drown or distort the utility signal beyond recovery, in particular when sampling at a low rate.

With the present invention, the reference voltage is kept constant for a complete sampled measurement frame, i.e. for several samples, but is preferably changed before sampling the next measurement frame. Thereby is achieved to employ different steps of the converter stair for different measurement signals to facilitate processing to improve accuracy, without introducing further sample-to-sample noise that need to be handled, and while still having all samples of a complete sampled measurement frame being based on a common reference voltage, which can, if necessary for the further processing, simply be compensated for by appropriate counter-scaling in the digital domain.

Also particularly advantageously for transit-time based flow measurements, the different reference voltages applied to each measurement may in various embodiments be disregarded as the processing of the sampled measurement signals preferably takes place in the frequency domain after a Fourier transform or similar, so the amplitude of the individual signals is not relevant.

The analog-to-digital converter may in various embodiments be implemented with its dynamic range being defined between a positive, or negative, reference voltage and 0V, ground, or similar, for example a reference voltage of 5V and the dynamic range being the range from 0V-5V with 2.5V as the median. Various other embodiments may comprise a composite reference voltage comprising both a positive and negative part, or a high and low part, thereby establishing a dynamic range as the range between the two parts, for example with a reference voltage comprising a −2.5V part and a +2.5V part defining a dynamic range of 5V with 0V as the median, or for example with a reference voltage comprising a +1V part and a +6V part defining a dynamic range of 5V with 3.5V as the median. For embodiments with a composite reference voltage as described, the invention allows for either changing the height of the converter transfer function, the offset of the converter transfer function, or both. The skilled person will acknowledge that a high diversity of possibilities exists and will know how to apply the invention to various types of analog-to-digital converters depending on various types and properties of ultrasound signals.

In an embodiment said reference voltage provider is arranged to ensure said individual reference voltage for at least two of said ultrasound measurement signals being different.

According to the invention, different reference voltages should be used to achieve the improvement of robustness to the analog-to-digital converter non-linearity, as different reference voltages are possible to force the typically substantially identical ultrasound signals to be sampled at different steps of the converter transfer function stair as described above. It is therefore beneficial that the reference voltage provider is arranged to ensure that different reference voltages are provided. This may for example be achieved by using a reference voltage generating algorithm which calculates the next reference voltage based on the previous reference voltage, e.g. by incrementing, by taking the reference voltages from a predetermined sequence of different reference voltages, by determining a new reference voltage in any way and then comparing it with the previous reference voltage and repeat if not different, etc.

According to the invention in order to achieve the technical effect in general, it may in various embodiments be sufficient that there is a certain high probability for the provided reference voltage being different from the previous reference voltage, whereby making it acceptable to generate the reference voltages by randomising or pseudo-randomising processes, or apply an algorithm which, like randomising processes, mostly but not guaranteed produce different reference voltages. The practical suitability of such algorithms, including randomising and pseudo-randomising processes, depends on the risk of providing non-different reference voltages too often, which highly depends on the resolution and range of different reference voltages available, i.e. in terms of voltage sensitivity and available non-used dynamic range of the analog-to-digital converter, and the reference voltage generator's resolution.

It is noted, that the technical effect is achieved by using different reference voltages for measurements that are going to be compared, averaged, merged or otherwise processed together to end up with a common result, for example a transit time difference determined on the basis of, e.g., 4 or 6 ultrasound measurement signals from the same transducer and sampled within a short time of each other, e.g. within between 1 ns and 1 s, for example 1 ms. Hence, for the next flow measurement for example taking place between 0.1 second and 1 minute later, the reference voltage provider may in an embodiment reuse reference voltages previously provided for earlier flow measurements or generate randomised reference voltages, etc., only ensuring difference with other reference voltages used for the same flow measurement, not necessarily with reference voltages used for earlier flow measurements. Note the differentiation between the terms ultrasound measurement and flow measurement, the first referring to establishing a sampled measurement frame from an ultrasound measurement signal, the latter referring to a series of ultrasound measurements leading to the calculation of one absolute transit time for each direction and/or one transit-time difference. One flow measurement should be conducted within a short time where any flow changes may be considered negligible, e.g. less than 1 s, preferably less than 1 ms, whereas the periodicity of flow measurements only depends on the desired flow meter accumulation accuracy.

The technical effect may also be achieved in embodiments using only very few ultrasound measurements for each flow measurement, as the linearity errors will still be averaged out over time to result in generally improved flow measurement accuracy on average over time.

In an embodiment said reference voltage provider is arranged to provide a first sequence of different reference voltages for use with a sequence of ultrasound measurement signals from a first ultrasonic transducer of said at least two ultrasonic transducers and to provide a sequence of different reference voltages for use with a sequence of ultrasound measurement signals from a second ultrasonic transducer of said at least two ultrasonic transducers.

In a preferred embodiment the ensuring different reference voltages may preferably be related to, and considered in the light of, a selected sequence of measurements among the different transducers. As an example, a two-transducer flow meter needing e.g. 6 measurements from each transducer, i.e. in each direction, to determine a flow representation with a predetermined acceptable accuracy, may in one embodiment be arranged to make 6 measurements from the first transducer with different reference voltages and then make 6 measurements from the second transducer with the same different or other different reference voltages, and may in another embodiment be arranged in an alternating fashion to make one measurement from each transducer with a first reference voltage, then change reference voltage and make a second measurement from each transducer, etc., until 6 pairs of measurements have been made with different reference voltages for each pair, and further embodiments may also be contemplated. In other words, the reference voltage provider is according to an embodiment arranged to ensure that measurements from the same transducer are made with different reference voltages, whereas reference voltages used for different transducers may be shared or different.

In an embodiment said first and second sequences of ultrasound measurement signals each comprises 2-10 ultrasound measurement signals and said first and second sequences of different reference voltages each comprises 2-10 different reference voltages.

In other words, in a typical two-transducer transit-time flow meter setup, various embodiments preferably require a total of from 4 to 20 ultrasound measurements to determine a flow representation. The number of measurement signals used may be the same for all flow measurements of a particular flow meter model determined from the hardware design and balanced between energy and time consumption and required or desired accuracy, or may be variable and adjusted in accordance with actual achieved accuracy or a scheme of regularly making a flow measurement with more ultrasound measurements for reference purposes. As mentioned above, the ensuring different reference voltages may be reset at least between the mentioned sequences, i.e. for example between flow measurements.

In an embodiment said first and second sequences of different reference voltages are equal.

Thereby the measurements from each transducer are performed with equal reference voltages, for example advantageously based on a predetermined sequence of reference voltages.

In an embodiment said first and second sequences of different reference voltages contain no common values.

Thereby the absolute transit time measurements from each transducer are performed with completely different reference voltages, i.e. the ensuring different reference voltages is applied to all reference voltages provided for a particular complete flow measurement. Thereby the generation of different reference voltages do not have to be coordinated with the order of changing transducers during the measurement.

In an embodiment said first and second sequences of different reference voltages contain one or more common values.

In an embodiment the reference voltage provider ensures difference within each sequence of reference voltages, e.g. by keeping track of previously provided reference voltages in each sequence, but does apply additional checking or coordination between the sequences.

In an embodiment said first and second sequences of ultrasound measurement signals are received in an alternating fashion and said reference voltage provider is arranged to provide said first and second sequences of different reference voltages in a corresponding alternating fashion.

As it in some embodiments may be advantageous to switch the transmitting and receiving transducer between each or a few ultrasound measurements, the reference voltage provider may be arranged to keep track of this switching or be controlled in accordance with the control of this switching to ensure different reference voltages within each sequence, but for various embodiments not necessarily ensuring different reference voltages between the sequences. In an embodiment using a predetermined sequence of reference voltages or where changing reference voltage is relatively slow it may be advantageous to alternate between the transducers and reuse one reference voltage for ultrasound measurement signals from all transducers, before changing to the next reference voltage value.

In an embodiment said reference voltage provider is arranged to determine at least one of said reference voltages on the basis of a previous reference voltage by an operation causing the new reference voltage to be different from said previous reference voltage.

When generating a new reference voltage based on a previous reference voltage several algorithms are available which ensures that the new reference voltage is different from the previous, for example as simple as always incrementing by a certain amount, or applying more advanced operations for example an injective function using the previous reference voltage as input. The operation may be wrapping in the sense that it may start over with the same or a different reference voltage, depending on the increment, when reaching the end of its range, for example letting an incrementing operation wrap back to the first value before a further increment causes the reference voltage to exceed hardware limitations of the flow meter, e.g. not being able to provide a higher reference voltage than the system supply voltage.

In an embodiment said operation comprises an increment operation or a decrement operation.

An advantageously simple operation ensuring different reference voltages may be simple incrementing or decrementing functions, or variations thereof.

In an embodiment said reference voltage provider is communicatively coupled to or comprises a memory.

In various advantageous embodiments the memory may for example be used to store predetermined reference voltages, predetermined starting value for a reference voltage generating algorithm, one or more previous reference voltages, etc. The memory may be a separate memory, a shared system memory, a register of a microcontroller, internal microcontroller or system-on-chip memory, etc., and may be of any suitable kind, e.g. flash, RAM, ROM, etc.

In an embodiment said reference voltage provider is arranged to provide said reference voltage from a sequence of predetermined reference voltages stored in said memory.

In an embodiment said reference voltage provider is arranged to store a history of at least one previous reference voltage for each transducer in said memory.

In an embodiment said reference voltage provider is arranged to provide said reference voltage on the basis of a randomly or pseudo-randomly selected value.

The reference voltage may for example be determined as the result of a random( ) function supplied with appropriate arguments regarding output range, or a result of a random( ) function may be used as starting value for a reference voltage generating algorithm. Pseudo-random values may for example be obtained by using a single arbitrary output sample obtained during silence, i.e. the sample comprising an arbitrary noise-value, or by using a single arbitrary output sample from an earlier sampled measurement frame, or be obtained from one or more LSBs from an ever changing memory location, e.g. a system timer for example counting milliseconds, etc.

In an embodiment said pseudo-randomly selected value is derived from one of said sampled measurement frames.

In an embodiment said individual reference voltages are different by less than 15%, preferably less than 10%, more preferably around 5%, 3% or 1% or 0.5%, of a reference voltage of said analog-to-digital converter.

Preferably, the changes of reference voltages are small, only a few percent or even less of the ADC full range, to facilitate keeping the complete signal within a significant part of the dynamic range of the analog-to-digital converter.

In an embodiment said reference voltage input of said analog-to-digital converter comprises two connector points and said reference voltage provider is arranged to provide a composite reference voltage comprising a reference voltage plus and a reference voltage minus.

As mentioned above, the analog-to-digital converter may in various embodiments be implemented with its dynamic range being defined between a positive and negative part, or a high and low part, thereby establishing a dynamic range as the range between the two parts, for example with a reference voltage comprising a −2.5V part and a +2.5V part defining a dynamic range of 5V with 0V as the median, or for example with a reference voltage comprising a +1V part and a +6V part defining a dynamic range of 5V with 3.5V as the median. This embodiment is particularly advantageous, as it allows for offsetting the conversion transfer function to achieve the effect of using different steps of the converter stair for converting similar signals, either alone or in combination with varying the height of the transfer function, i.e. the resolution of the conversion with respect to the signal amplitude.

In an embodiment said reference voltage provider comprises a digital-to-analog converter.

For simple and convenient establishment of the reference voltages various preferred embodiments utilise a digital-to-analog converter to generate the reference voltages. This may be particularly advantageous when the flow meter comprises a microcontroller or system-on-chip comprising on-chip converters directly controllable by the processing unit and easily connectable with none or only little auxiliary circuitry.

In an embodiment said processing unit is arranged to control said reference voltage provider.

In an embodiment said processing unit is implemented in a microcontroller or a system-on-chip of said transit-time ultrasonic flow meter, and wherein said microcontroller or system-on-chip comprises an analog-to-digital converter of said analog-to-digital converter arrangement and a digital-to-analog converter of said reference voltage provider.

An example of a suitable microcontroller is for example the EFM32G890 from Silicon Laboratories, Inc.

In an embodiment the reference voltage provider is arranged to provide a dynamic range correction value to said reference voltage input to accommodate an amplitude of the ultrasound measurement signal within at least 80%, preferably within at least 90%, for example within 95%, of a dynamic range of the analog-to-digital converter.

Besides the per-measurement reference voltage change described above to achieve better linearity properties of the analog-to-digital conversion, the reference voltage provider may in addition be employed to add a dynamic range correction value to match the dynamic range substantially to the ultrasound measurement signal, preferably with a margin for safety and to allow the reference voltage changes. The dynamic range correction value may for example be determined with an aim of the ultrasound measurement signal amplitude being about 80%-90% of the dynamic range. Thereby is reduced the risk of clipping and/or facilitated a DC correction feature of the analog-to-digital converter, making it possible to match the dynamic range to be for example from 105% to 125% of the signal amplitude, with reduced risk of clipping by an unexpected DC level.

In an embodiment the reference voltage provider is arranged to add said dynamic range correction value to said reference voltage.

In an embodiment said at least four ultrasound measurement signals are consecutive ultrasound measurement signals.

The present invention is particularly advantageous when applied to consecutive signals, i.e. a number of signals measured within a short time and related to the same or consecutive flow measurements.

In an embodiment said at least four ultrasound measurement signals comprises 4 to 20 ultrasound measurement signals.

As mentioned above, a typical two-transducer transit-time flow meter setup, in various embodiments preferably require a total of from 4 to 20 ultrasound measurements to determine a flow representation, i.e. determining the flow representation on the basis of 2 to 10 ultrasound measurements from each direction, i.e. each transducer. The number of measurement signals used may be the same for all flow measurements of a particular flow meter model determined from the hardware design and balanced between energy and time consumption and required or desired accuracy, or may be variable and adjusted in accordance with actual achieved accuracy or a scheme of regularly making a flow measurement with more ultrasound measurements for reference purposes. The ensuring different voltage references may be reset after the mentioned number of ultrasound measurements, i.e. after for example 4 to 20 ultrasound measurements, i.e. for example between flow measurements.

In an embodiment said sampled measurement frame comprises 10 to 10,000 samples.

Several separate, finite ultrasound signals are measured, as mentioned above, and for each measured ultrasound signal, a finite sampled measurement frame is established. The number of samples per frame equals the length of the ultrasound signal multiplied with the sample rate. Short signals measured at low sample rate cause short frames of possibly as little as for example 10 samples. Longer signals and/or high sample rate produces larger frames. Various preferred flow meter embodiments make use of undersampling primarily for energy consumption reasons as higher rates consumes much more energy, for cost reasons as higher rate converters including supporting circuitry are typically more expensive, or for availability reasons as only a narrow range of microcontrollers with fast converters e.g. working above 1 million samples per second (MSPS) exist. Undersampling typically causes relatively short sampled measurement frames, e.g. comprising 20-80 samples, for example 40 samples.

In an embodiment said processing unit is arranged to calculate at least one transit time difference on the basis of at least two of said at least four ultrasound measurement signals being received from one of said at least two transducers and on the basis of at least two other of said at least four ultrasound measurement signals being received from another one of said at least two transducers.

The at least four, for example 4-20, ultrasound measurement signals are used to calculate at least a transit time difference based on ultrasound measurements from both transducers, i.e. based on measurements in both directions. For example in a two-transducer setup, half of the signals are from the first transducer and related to one direction, and the other half of the signals are from the second transducer and related to the opposite direction. Note that the signals of one half does not need to be the first half. In other words, a measurement schedule of one embodiment may involve measuring all desired signals from the first transducer before proceeding to measure all desired signals from the other transducer, whereas another embodiment may have a measurement schedule alternating between the two transducers, with one or e.g. two or three, signals measured before turning to the other transducer, and yet other embodiments may have even more complex measurement schedules.

This also means, that the ensuring different voltage references is preferably performed for at least as long as sufficient signals has been sampled, as described above. After that, the ensuring different voltage references may be reset, e.g. by starting over with the initial value of an incrementing voltage reference generating algorithm.

The determining a transit time and/or a transit-time difference from one or more sampled ultrasound signals is well-known to the skilled person, see for example several techniques for this described in PCT patent application publication WO2011/134470A2, hereby incorporated by reference. Various embodiments may determine a transit-time difference from each pair of sampled measurement frames and then average or otherwise combine or merge at least two determined transit-time differences, whereas other various embodiments may average or otherwise combine or merge at least two sampled measurement frames and determine one transit-time difference therefrom.

In an embodiment said processing unit is arranged to calculate at least one of said transit-time based flow representation using said calculated at least one transit time difference.

The at least four, for example 4-20, ultrasound measurement signals are via determining a transit time difference as described above, used to calculate said transit-time based flow representation. This also means, that the ensuring different voltage references is preferably performed for at least as long as sufficient signals has been sampled to calculate a transit-time based flow representation. After that, the ensuring different voltage references may be reset, e.g. by starting over with the initial value of an incrementing voltage reference generating algorithm.

The calculation of a transit-time based flow representation is well-known to the skilled person, see for example PCT patent application publication WO2011/134470A2, hereby incorporated by reference.

In an embodiment said processing unit is arranged to calculate at least one of said transit-time based flow representation from said at least four sampled measurement frames.

Various embodiments allow for calculating the flow representation in different ways, using for example various differences or sums related to the transit times, and/or absolute transit times.

In an embodiment the analog-to-digital converter arrangement comprises an input level offset provider arranged to provide an input level offset value to said analog input.

Thereby is further made possible to control offset of the ultrasound measurement signal, which may be used in various advantageous ways in various embodiments as described below.

In an embodiment the input level offset provider is arranged to provide an individual input level offset value for at least two of said ultrasound measurement signals, each individual input level offset value being different.

By applying a different individual input level offset value for the individual measurements of substantially identical ultrasound measurement signals during a series of measurement signals, different steps of the stair, typically with different linearity errors, of the analog-to-digital converter are employed to produce each sampled measurement frame, i.e. achieving a similar effect as obtained by the utilization of different reference voltages for the individual signals. As a changing of input level offset value leads to an offset of the signal but does not scale the signal, and as the changing of reference voltage may be used to achieve a larger or smaller dynamic range and in practice change the resolution available with respect to the signal amplitude, a combination of controlling both input level offset values and reference voltages during the measurements makes it possible to sample the signal in more different ways without requiring large reference voltage changes. In other words, if several measurements, e.g. 10 measurements, are desired with different conversions, instead of applying 10 different reference voltages, various combinations of a few, e.g. 4, different input level offset values and a few, e.g. 3, different reference voltages may provide similar results in terms of improved flow representations and volume measurements over time.

In an embodiment said establishment of a sampled measurement frame is based on the respective ultrasound measurement signal, said reference voltage and said input level offset value.

In an embodiment said input level offset provider is arranged to ensure said individual input level offset value for at least two of said ultrasound measurement signals being different.

According to the invention, different input level offset values should be used to achieve the additional improvement of robustness to the analog-to-digital converter non-linearity, as different offsets are possible to facilitate the forcing the typically substantially identical ultrasound signals to be sampled at different steps of the converter transfer function stair as described above. It is therefore beneficial that the input level offset provider is arranged to ensure that different offsets are provided. This may for example be achieved by using an offset generating algorithm which calculates the next offset based on the previous offset, e.g. by incrementing, by taking the offsets from a predetermined sequence of different offsets, by determining a new offset in any way and then comparing it with the previous offset and repeat if not different, etc.

According to the invention in order to achieve the technical effect in general, it may in various embodiments be sufficient that there is a certain high probability for the provided offset being different from the previous offset, whereby making it acceptable to generate the offsets by randomising or pseudo-randomising processes, or apply an algorithm which, like randomising processes, mostly but not guaranteed produce different offsets. The practical suitability of such algorithms, including randomising and pseudo-randomising processes, depends on the risk of providing non-different offsets too often, which highly depends on the resolution and range of different offsets available, i.e. in terms of voltage sensitivity and available non-used dynamic range of the analog-to-digital converter, and the offset generator's resolution.

It is noted, that the technical effect is achieved by using different input level offset values for measurements that are going to be compared, averaged, merged or otherwise processed together to end up with a common result, for example a transit time difference determined on the basis of, e.g., 4 or 6 ultrasound measurement signals from each transducer and sampled within a short time of each other, e.g. within between 1 ns and 1 s, for example 1 ms. Hence, for the next flow measurement for example taking place between 0.1 second and 1 minute later, the input level offset provider may in an embodiment reuse input level offset values previously provided for earlier flow measurements or generate randomised offsets, etc., only ensuring difference with other offsets used for the same flow measurement, not necessarily with offsets used for earlier flow measurements.

In an embodiment said input level offset provider is arranged to provide a first sequence of different input level offset values for use with a sequence of ultrasound measurement signals from a first ultrasonic transducer of said at least two ultrasonic transducers and to provide a sequence of different input level offset values for use with a sequence of ultrasound measurement signals from a second ultrasonic transducer of said at least two ultrasonic transducers.

In a preferred embodiment the ensuring different offsets may preferably be related to, and considered in the light of, a selected sequence of measurements among the different transducers. As an example, a two-transducer flow meter needing e.g. 6 measurements from each transducer, i.e. in each direction, to determine a transit time difference with a predetermined acceptable accuracy, may in one embodiment be arranged to make 6 measurements from the first transducer with different input level offset values and then make 6 measurements from the second transducer with the same different or other different input level offset values, and may in another embodiment be arranged in an alternating fashion to make one measurement from each transducer with a first input level offset value, then change input level offset value and make a second measurement from each transducer, etc., until 6 pairs of measurements have been made with different input level offset values for each pair, and further embodiments may also be contemplated. In other words, the input level offset provider is according to an embodiment arranged to ensure that measurements from the same transducer are made with different offsets, whereas offsets used for different transducers may be shared or different. This may further be coordinated or not coordinated with the variation of reference voltages according to the invention in several different ways to facilitate numerous different conversions made from highly similar signals to improve the accuracy of the conversions in average.

In an embodiment said individual input level offset values are different by less than 15%, preferably less than 10%, more preferably around 5%, 3%, or 1%, of a full range of said analog-to-digital converter.

Preferably, the input level offset values are small, only a few percent of ADC full range, to facilitate keeping the complete signal within the dynamic range of the analog-to-digital converter. To force the conversion to go up or down one step of the transfer function stair, in theory the offset does not have to be larger than the input voltage corresponding to one LSB output change of the analog-to-digital converter. For a 10-bit analog-to-digital converter having 1024 steps, one step or LSB represents ideally about 0.1% of full range. In a preferred embodiment the change is in practice set a little higher, e.g. about 1%, 3% or 5%, to ensure that a completely different step is utilised even in case of severe non-linearities.

In an embodiment said analog input of said analog-to-digital converter comprises a differential input with two connector points.

By implementing the analog-to-digital converter with differential analog input is advantageously achieved a simple option of providing the ultrasound measurement signal and the input level offset value to two different connector points, thereby avoiding a need to providing a summing or subtraction point to merge the two inputs.

In an embodiment said ultrasound measurement signals and said input level offset value are coupled to different of said two connector points.

In an embodiment said input level offset provider comprises a digital-to-analog converter.

For simple and convenient establishment of the input level offset values various preferred embodiments utilise a digital-to-analog converter to generate the offset values. This may be particularly advantageous when the flow meter comprises a microcontroller or system-on-chip comprising on-chip converters directly controllable by the processing unit and easily connectable with none or only little auxiliary circuitry.

In an embodiment said processing unit is arranged to control said input level offset provider.

It is highly advantageous to let the processing unit control both the input level offset provider and the reference voltage provider to achieve a coordination and thereby possible synergy of the various possible linearity improvement techniques described above.

In an embodiment the input level offset provider is arranged to provide a DC correction value to said analog input to offset a DC level of the ultrasound measurement signal to within 20%, preferably within 10%, for example within 5%, of a median of a dynamic range of the analog-to-digital converter.

The input level offset provider may advantageously be employed to add a DC correction value to balance the ultrasound measurement signal substantially in the middle of the dynamic range of the analog-to-digital converter, for example within 20% of the median of the range. Thereby is reduced the risk of clipping and/or facilitated an adaptive dynamic range feature of the analog-to-digital converter, making it possible to match the dynamic range to be for example from 105% to 125% of the signal amplitude, without risking clipping by an unexpected DC level.

This feature of the input level offset provider may in an embodiment be combined with the above-described feature of using the input level offset provider to ensure a changing input level offset value for at least two of the at least four ultrasound measurement signals.

In an embodiment the input level offset provider is arranged to add said DC correction value to said input level offset value.

In an embodiment the analog-to-digital converter arrangement comprises a timing signal provider arranged to provide a timing signal comprising a frame offset to a sample timing input of said analog-to-digital converter.

Thereby is further made possible to control the timing of starting sampling the individual frame, i.e. a time offset, of the analog-to-digital converter, which may be used in various advantageous ways in various embodiments as described below.

The frame offset may for example indicate the sample start time relative to the ultrasound transmission time, relative to a reference start time, as an absolute time, etc. The frame offset may be positive or negative with relation to a reference or nominal start time. The frame length may be adjusted correspondingly to ensure that the last portion of the signal is sampled even with an earlier frame start time, or the frame length may be selected sufficiently long to accommodate the signal regardless of any reasonable frame offset. In a preferred embodiment, the frame offset is changed a fraction of a duration of a sample at the respective sample rate for each measurement. In preferred embodiments, the frame offsets used for the different measurements may range from −0.5 to +0.5 times a sample duration, or from +0.05 to +0.95 times a sample duration. In various embodiments the frame offset will advantageously be synchronised with a system clock in order to facilitate selecting a certain fraction of the sample rate as frame start. Such embodiments preferably comprise a system clock being at least, e.g., 4-20 times faster than the sample rate, thereby facilitating, in that example, 4-20 different frame offsets to vary between in accordance with the invention. The largest improvements are achieved in systems with relatively low sample rates compared to the signal's frequency content, as the signal should preferably change considerably during the frame offset to reach a different converter step by the application of the frame offset. The timing signal comprising the frame offset may be implemented in accordance with the particular analog-to-digital converter used. For analog-to-digital converters having a start signal, e.g. a start-bit, a start-pin, a reset-pin, a frame input, or always starting whenever not holding, etc, the timing signal comprising the frame offset may be applied to such control bit or pin accordingly as a start signal or by controlling the start signal. For embodiments without such start signal, the frame offset may be applied to the analog-to-digital converter clock signal, in order to offset the clock signal slightly, e.g. by pausing.

Further embodiments comprise a combination of the providing of a reference voltage as described above with the providing of a frame offset as described in more detail here below, possibly also in combination with the providing of an input level offset value as described above.

In an embodiment the timing signal provider is arranged to provide an individual frame offset for at least two of said ultrasound measurement signals, each individual frame offset being different.

By providing different frame offsets for the individual measurements of substantially identical ultrasound measurement signals, the converter may be forced to use different steps of the transfer function stair for the individual signals, i.e. achieving a similar effect as obtained by the utilization of different reference voltages for the individual signals. As a changing of reference voltage is a level offset or scaling and the changing of frame offsets according to the invention is a time offset, a combination of controlling both reference voltages and frame offsets during the measurements makes it possible to sample the signal in more different ways without requiring large reference voltage changes.

In an embodiment said establishment of a sampled measurement frame is based on the respective ultrasound measurement signal, said reference voltage, said frame offset, and preferably said input level offset value.

In an embodiment said timing signal provider is arranged to ensure said individual frame offset for at least two of said ultrasound measurement signals being different.

Different frame offsets could preferably be used to achieve the improvement of robustness to the analog-to-digital converter non-linearity, as different frame offsets are possible to force the typically substantially identical ultrasound signals to be sampled at different steps of the converter transfer function stair as described above. It is therefore beneficial that the timing signal provider is arranged to ensure that different frame offsets are provided. This may for example be achieved by using a frame offset generating algorithm which calculates the next frame offset based on the previous frame offset, e.g. by incrementing, by taking the frame offsets from a predetermined sequence of different frame offsets, by determining a new frame offset in any way and then comparing it with the previous frame offset and repeat if not different, etc.

In order to achieve the technical effect in general, it may in various embodiments be sufficient that there is a certain high probability for the provided frame offset being different from the previous frame offset, whereby making it acceptable to generate the frame offsets by randomising or pseudo-randomising processes, or apply an algorithm which, like randomising processes, mostly but not guaranteed produce different offsets. The practical suitability of such algorithms, including randomising and pseudo-randomising processes, depends on the risk of providing non-different frame offsets too often, which highly depends on the time resolution and range of different offsets available, i.e. in terms of sub-sample timing possibilities, i.e. fractions of a sample duration as described above.

It is noted, that the technical effect is achieved by using different frame offsets for measurements that are going to be compared, averaged, merged or otherwise processed together to end up with a common result, for example a transit time difference determined on the basis of, e.g., 4 or 6 ultrasound measurement signals from each transducer and sampled within a short time of each other, e.g. within between 1 ns and 1 s, for example 1 ms. Hence, for the next flow measurement for example taking place between 0.1 second and 1 minute later, the timing signal provider may in an embodiment reuse frame offsets previously provided for earlier flow measurements or generate randomised frame offsets, etc., only ensuring difference with other frame offsets used for the same flow measurement, not necessarily with frame offsets used for earlier flow measurements.

In an embodiment said timing signal provider is arranged to provide a first sequence of different frame offsets for use with a sequence of ultrasound measurement signals from a first ultrasonic transducer of said at least two ultrasonic transducers and to provide a sequence of different frame offsets for use with a sequence of ultrasound measurement signals from a second ultrasonic transducer of said at least two ultrasonic transducers.

In a preferred embodiment the ensuring different frame offsets may preferably be related to, and considered in the light of, a selected sequence of measurements among the different transducers. As an example, a two-transducer flow meter needing e.g. 6 measurements from each transducer, i.e. in each direction, to determine a transit time difference with a predetermined acceptable accuracy, may in one embodiment be arranged to make 6 measurements from the first transducer with different frame offsets and then make 6 measurements from the second transducer with the same different or other different frame offsets, and may in another embodiment be arranged in an alternating fashion to make one measurement from each transducer with a first frame offset, then change frame offset and make a second measurement from each transducer, etc., until 6 pairs of measurements have been made with different frame offsets for each pair, and further embodiments may also be contemplated. In other words, the timing signal provider is according to an embodiment arranged to ensure that measurements from the same transducer are made with different frame offsets, whereas frame offsets used for different transducers may be shared or different. This may further be coordinated or not coordinated with the variation of reference voltage according to the invention in several different ways to facilitate numerous different conversions made from highly similar signals to improve the accuracy of the conversions in general.

In an embodiment said individual frame offsets are different by less than a duration of a single sample, e.g. no more than 50%, preferably no more than 25%, more preferably no more than 15%, e.g. 12%, 8%, or 4%, of a duration of a single sample.

Preferably, the frame offsets are small, less than half a sample duration, as described above.

In an embodiment said sample timing input of said analog-to-digital converter comprises a control input for commanding the analog-to-digital converter to start sampling a sampled measurement frame; and wherein a control signal for said control input is based on said frame offset.

In an advantageous embodiment, the transit-time ultrasonic flow meter is arranged with a reference frame start time defined in relation to the ultrasound transmission start time and being a little shorter than the expected transit-time. The frame start control signal for the analog-to-digital converter may for example be based on such reference start time with the addition, or subtraction, of the frame offset determined for that respective measurement.

In an embodiment said timing signal provider comprises a digital-to-analog converter.

For simple and convenient establishment of the frame offsets various preferred embodiments utilise a digital-toanalog converter to generate the frame offsets or control signals, e.g. a start signal, based on the frame offsets. This may be particularly advantageous when the flow meter comprises a microcontroller or system-on-chip comprising on-chip converters directly controllable by the processing unit and easily connectable with none or only little auxiliary circuitry.

In an embodiment said processing unit is arranged to control said timing signal provider.

It is highly advantageous to let the processing unit control both the timing signal provider and the reference voltage provider to achieve a coordination and thereby possible synergy of the various possible accuracy improvement techniques described above.

In an embodiment the timing signal provider is arranged to add a reference frame start time to said frame offset to offset start of sampling by a little less than an expected transit time.

In an embodiment the analog-to-digital converter arrangement comprises a timing signal provider arranged to provide a timing signal comprising a sample rate to a sample timing input of said analog-to-digital converter.

Thereby is further made possible to control the timing of sampling the individual frame, i.e. a time scaling, of the analog-to-digital converter, which may be used in various advantageous ways in various embodiments as described below. The timing signal provider may for example be arranged to provide said timing signal comprising both a frame offset and a sample rate, and the sample timing input may comprise an input for frame offset and an input for sample rate.

In a preferred embodiment, the sample rate is defined as a division of a faster system or reference clock, and the sample rate can therefore be changed by selecting a different divisor for each measurement. The timing signal may also comprise the sample clock of desired sample rate, or parameters to establish a clock at the desired sample rate. The largest improvements are achieved in systems with relatively low sample rates compared to the signal's frequency content, as the signal should preferably change considerably between each sample to reach a different converter step by the application of the changing sample rate. The timing signal comprising the sample rate may be implemented in accordance with the particular analog-to-digital converter used. For analog-to-digital converters having a sampling clock input as part of the signal timing input, the timing signal provider may establish the timing signal as a sampling clock with the desired clock rate and apply it to such sampling clock input. For embodiments with a divisor input for establishing the sampling clock from a system clock by division to control the sample rate, the timing signal provider may establish the timing signal as a control signal comprising the divisor or other suitable control value.

Hence, the signal timing input may comprise several inputs, e.g. a sample clock input or a divisor input and e.g. a sample start input, etc.

Further embodiments comprise a combination of the providing of a reference voltage as described above with the providing of a sample rate as described in more detail here below, possibly also in combination with the providing of a frame offset and/or the providing of an input level offset value as described above.

In an embodiment the timing signal provider is arranged to provide an individual sample rate for at least two of said ultrasound measurement signals, each individual sample rate being different.

By providing different sample rates for the individual measurements of substantially identical ultrasound measurement signals, the converter may be forced to use different steps of the transfer function stair for the individual signals, i.e. achieving a similar effect as obtained by the utilization of different reference voltages for the individual signals according to the invention. As a changing of sample rate is a time scaling and the changing of reference voltage is a level offset or level scaling, a combination of controlling both sample rates and reference voltages during the measurements makes it possible to sample the signal in more different ways without requiring large reference voltage changes.

In an embodiment said establishment of a sampled measurement frame is based on the respective ultrasound measurement signal, said reference voltage and said sample rate, and preferably one or more of said frame offset and said input level offset value.

In an embodiment said timing signal provider is arranged to ensure said individual sample rate for at least two of said ultrasound measurement signals being different.

Different sample rates should be used to achieve the improvement of the analog-to-digital converter non-linearity robustness, as different sample rates are possible to force the typically substantially identical ultrasound signals to be sampled at different steps of the converter transfer function stair as described above. It is therefore beneficial that the timing signal provider is arranged to ensure that different sample rates are provided. This may for example be achieved by using a sample rate generating algorithm which calculates the next sample rate based on the previous sample rate, e.g. by incrementing, by taking the sample rates from a predetermined sequence of different sample rates, by determining a new sample rate in any way and then comparing it with the previous sample rate and repeat if not different, etc.

In order to achieve the technical effect in general, it may in various embodiments be sufficient that there is a certain high probability for the provided sample rate being different from the previous sample rate, whereby making it acceptable to generate the sample rates by randomising or pseudo-randomising processes, or apply an algorithm which, like randomising processes, mostly but not guaranteed produce different sample rates. The practical suitability of such algorithms, including randomising and pseudo-randomising processes, depends on the risk of providing non-different sample rates too often, which highly depends on the time resolution and range of different sample rates available, i.e. in terms of clock division possibilities as described above.

It is noted, that the technical effect is achieved by using different sample rates for measurements that are going to be compared, averaged, merged or otherwise processed together to end up with a common result, for example a transit time difference determined on the basis of, e.g., 4 or 6 ultrasound measurement signals from each transducer and sampled within a short time of each other, e.g. within between 1 ns and 1 s, for example 1 ms. Hence, for the next flow measurement for example taking place between 0.1 second and 1 minute later, the timing signal provider may in an embodiment reuse sample rates previously provided for earlier flow measurements or generate randomised sample rates, etc., only ensuring difference with other sample rates used for the same flow measurement, not necessarily with sample rates used for earlier flow measurements.

In an embodiment said timing signal provider is arranged to provide a first sequence of different sample rates for use with a sequence of ultrasound measurement signals from a first ultrasonic transducer of said at least two ultrasonic transducers and to provide a sequence of different sample rates for use with a sequence of ultrasound measurement signals from a second ultrasonic transducer of said at least two ultrasonic transducers.

In a preferred embodiment the ensuring different sample rates may preferably be related to, and considered in the light of, a selected sequence of measurements among the different transducers. As an example, a two-transducer flow meter needing e.g. 6 measurements from each transducer, i.e. in each direction, to determine a transit time difference with a predetermined acceptable accuracy, may in one embodiment be arranged to make 6 measurements from the first transducer with different sample rates and then make 6 measurements from the second transducer with the same different or other different sample rates, and may in another embodiment be arranged in an alternating fashion to make one measurement from each transducer with a first sample rate, then change sample rate and make a second measurement from each transducer, etc., until 6 pairs of measurements have been made with different sample rates for each pair, and further embodiments may also be contemplated. In other words, the timing signal provider is according to an embodiment arranged to ensure that measurements from the same transducer are made with different sample rates, whereas sample rates used for different transducers may be shared or different. This may further be coordinated or not coordinated with the variation of reference voltages according to the invention in several different ways to facilitate numerous different conversions made from highly similar signals to improve the accuracy of the conversions in average.

In an embodiment said individual sample rates are different by 1%-10%, e.g. one individual sample rate being between 92% and 98% or between 102% and 108% of a previous individual sample rate, e.g. 95% or 105% of a previous individual sample rate.

Preferably, the sample rate changes are sufficiently large to change the individual sample significantly so that at least a portion of the samples get converted at different conversion steps than the previous measurement signal. On the other hand, the change of sample rate should be sufficiently small to allow the same number of total samples, e.g. 40 samples, to cover primary features of the measurement signal, including the beginning and end of the signal. Increasing the sample rate too much, in some embodiments for example more than 10%, may cause a fixed number of samples selected to cover the entire signal at a nominal sample rate, e.g. 40 samples, to not cover the end of the signal at the significantly higher rate. Likewise, reducing the sample rate too much, in some embodiments for example more than 10%, may cause a fixed number of samples selected to cover the entire signal at a nominal sample rate, e.g. 40 samples, to be separated too much and a number of the samples being used for a useless sampling of silence following the measurement signal.

In an embodiment said sample timing input of said analog-to-digital converter comprises a sample clock input or sample rate divisor input for controlling a sample rate of the analog-to-digital converter; and wherein a control signal for said sample clock input or sample rate divisor input is based on said sample rate.

In an embodiment said timing signal provider comprises a digital-to-analog converter.

For simple and convenient establishment of the sample rates various preferred embodiments utilise a digital-to-analog converter to generate the sample rates or control signals, e.g. a divisor or clock signal, based on the sample rates. This may be particularly advantageous when the flow meter comprises a microcontroller or system-on-chip comprising on-chip converters directly controllable by the processing unit and easily connectable with none or only little auxiliary circuitry.

In an embodiment said processing unit is arranged to control said timing signal provider with respect to said sample rate.

It is highly advantageous to let the processing unit control the timing signal provider with respect to sample rate to achieve a coordination and thereby possible synergy of the various possible accuracy improvement techniques described above.

In an aspect the invention relates to a method for calculating a transit-time based flow representation in a transit-time ultrasonic flow meter comprising at least two ultrasonic transducers, an analog-to-digital converter arrangement for sampling ultrasound measurement signals from the ultrasonic transducers and a processing unit for said calculating, the method comprising the steps of:

providing by a voltage reference provider a reference voltage to a reference voltage input of an analog-to-digital converter of said analog-to-digital converter arrangement;
establishing an ultrasound measurement signal by one of said at least two ultrasonic transducers;
receiving said ultrasound measurement signal at an analog input of said analog-to-digital converter;
establishing by the analog-to-digital converter a sampled measurement frame with at least 10 samples on the basis of said ultrasound measurement signal and the reference voltage;
providing said sampled measurement frame at a sample output of said analog-to-digital converter coupled to said processing unit;
repeating the above steps with a total of at least four ultrasound measurement signals, wherein said providing said reference voltage comprises providing a different reference voltage for at least two of said at least four ultrasound measurement signals; and
calculating one or more transit-time based flow representations by the processing unit on the basis of a sampled measurement frame from each of said repetitions.

Different Frame Offsets

In an aspect the invention relates to a transit-time ultrasonic flow meter comprising at least two ultrasonic transducers, an analog-to-digital converter arrangement for sampling ultrasound measurement signals from the ultrasonic transducers and a processing unit for calculating a transit-time based flow representation from the sampled measurement signals;

wherein the analog-to-digital converter arrangement comprises:
    an analog-to-digital converter comprising an analog input, a sample timing input and a sample output; and
    a timing signal provider arranged to provide a timing signal to the sample timing input;

wherein the analog-to-digital converter arrangement is arranged to receive at least four ultrasound measurement signals from the ultrasonic transducers and provide the ultrasound measurement signals to the analog input;

wherein the timing signal provider is arranged to provide an individual timing signal for at least two of said ultrasound measurement signals, each individual timing signal being different with respect to a frame offset; and wherein the analog-to-digital converter is arranged to establish for each of the at least four ultrasound measurement signals a sampled measurement frame with at least 10 samples on the basis of the respective ultrasound measurement signal and the timing signal and provide the sampled measurement frame at the sample output coupled to said processing unit.

The invention may improve transit-time based flow measurements by improving the robustness against non-linearity of the analog-to-digital conversion of ultrasound measurements on which the transit-time calculations are based. By the present invention, the average error over time of transit-time difference measurements, and thereby of determined flow representations and volume measurements of the flow meter are improved.

The transfer function of an analog-to-digital converter may be illustrated as a stair, where the number of steps of the stair corresponds to the resolution of the converter and a varying width of the individual steps illustrates non-linearities of the converter. By applying a different frame offset, i.e. sampling start time, to each ultrasound measurement signal during a series of measurement signals, the pulsed ultrasound signal will be sampled at different points on the curve, i.e. at different input levels, thereby utilising different steps of the stair, typically with different linearity errors, of the analog-to-digital converter to produce each sampled measurement frame.

An ultrasound measurement signal according to the invention refers to a signal comprising a limited number of periods of a signal in the ultrasonic frequency range, the complete ultrasound measurement signal having a duration for example between 1 ns and 1 s, e.g. between 1 µs and 1 ms. The ultrasound measurement signal may be generated by one of the transducers picking up a burst of ultrasound generated by another of the transducers after having travelled through a fluid, to produce the ultrasound measurement signal as an electrical signal for the analog input of the analog-to-digital converter arrangement.

A sampled measurement frame according to the invention refers to a sampled signal comprising a limited number of samples of an ultrasound measurement signal. The length of a complete sampled measurement frame may correspond to the duration of the ultrasound measurement signal being sampled, for example from 1 ns to 1 s, which may for example involve from 10 samples to 10,000 samples.

By combining two or more sampled measurement frames from the same transducer, i.e. from the same measurement direction, into one measurement, e.g. by averaging, the different linearity errors are thereby also combined, e.g. averaged, leading typically to improved overall linearity of the measurements.

Alternatively, and/or in addition, the average error over time of several measurements, is also improved by the invention. In other words, the invention improves the average accuracy of calculated transit time differences, and thereby the average flow and volume measurements of a flow meter.

In particular for measuring several substantially identical ultrasound signals, as is often the case in ultrasonic flow meters, the present invention may prove advantageous, as it may avoid that the identical signals are measured with identical linearity errors. On the contrary, the present invention may cause the identical measurements to be made with different linearity errors, thereby making it possible to reduce the linearity error over time for example by averaging out the differences or by subtracting added offsets.

By changing the frame offset for each measurement, i.e. for each ultrasound signal measured, each measurement may activate an overlapping but slightly different range of steps of the converter stair. The frame offset may for example indicate the sample start time relative to the ultrasound transmission time, relative to a reference start time, as an absolute time, etc. The frame offset may be positive or negative with relation to a reference or nominal start time. The frame length may be adjusted correspondingly to ensure that the last portion of the signal is sampled even with an earlier frame start time, or the frame length may be selected sufficiently long to accommodate the signal regardless of any reasonable frame offset.

Using a different frame offset for sampling each measurement frame through a series of measurement frames may improve robustness to the non-linearity of the analog-to-digital converter as each sampled measurement frame even with constant ultrasound signals may have different linearity errors so the average may have higher accuracy. In a preferred embodiment, the frame offset is changed a fraction of a duration of a sample at the respective sample rate for each measurement. For example, at a sample rate of, e.g., 1 MHz, the duration of each sample is 1 µs, and the frame offset should therefore be a fraction of 1 µs, for example 100 ns, 200 ns, 500 ns, etc. If the frame offset equals the sample duration, the effect is lost as the same points of the signal will be sampled at the same steps, just one sample later or earlier. In preferred embodiments, the frame offsets used for the different measurements may range from −0.5 to +0.5 times a sample duration, or from +0.05 to +0.95 times a sample duration. In various embodiments the frame offset will advantageously be synchronised with a system clock in order to facilitate selecting a certain fraction of the sample rate as frame start. Such embodiments preferably comprise a system clock being at least, e.g., 4-20 times faster than the sample rate, thereby facilitating, in that example, 4-20 different frame offsets to vary between in accordance with the invention. The largest improvements are achieved in systems with relatively low sample rates compared to the signal's frequency content, as the signal should preferably change considerably during the frame offset to reach a different converter step by the application of the frame offset.

In relation to transit-time based ultrasonic flow meters, some of the highly relevant considerations are: accuracy and consistency as flow meters are often used as input for billing and even small errors may accumulate to large errors over several years of flow; energy consumption because the flow meters are often battery operated and required to endure for 8-10 years without replacing or recharging their battery; space requirement as flow meters are often required to be mounted in extremely confined spaces; and costs as a huge number of flow meters are produced so even small cost reductions add up to significant amounts.

Reduction of the number of electronic components by integration by for example a versatile microcontroller or system-on-chip may generally improve on all the mentioned factors, as such integration leads to smaller, often energy saving, and often cheaper, flow meter designs. On the other hand, integration also requires compromises on the different functions due to a limited number of suitable microcontrollers, as compared to having separate integrated circuits for each function, e.g. A/D-converters, D/A-converters, display controllers, etc.

The present invention introduces more flexibility and facilitates the selection of microcontroller or system-on-chip by reducing the requirements to the integrated A/D-converters. This is achieved by the ability of embodiments of the present invention to improve robustness to non-linearity of for example low or medium quality A/D-converters, thereby increasing accuracy of flow and volume measurements over time. With reduced requirements to A/D-converters, the number of available microcontrollers increases, making it possible to let other requirements, e.g. display controller functionality or price, be deciding factors.

Compared to dithering techniques, the present invention may be advantageous in the particular field of measuring ultrasonic signals in transit-time based ultrasonic flow meters, as such signals are often characterized by one or more of small scale, broadband and/or sampled at low rate. For example, in a preferred embodiment, the ultrasound signals are subsampled, i.e. sampled at a rate below the Nyquist rate related to the frequency content of the analog ultrasound signal, and due to aliasing such a sampled signal may end up as a broadband signal, for example with content in 16 out of 64 FFT bins, making it difficult or complicated to remove any applied dithering. Various techniques to analyze a subsampled signal may also be disturbed or made more complicated by conventional dithering. Further, in order to save power, ultrasonic flow meters according to the invention are preferably highly energy efficient, meaning for instance that the ultrasonic signals are transmitted with the lowest possible power, and the receiver circuit including the analog-to-digital converter arrangement preferably prioritizes energy efficiency over sensitivity. This means that any applied noise from dithering may drown or distort the utility signal beyond recovery, in particular when sampling at a low rate.

With the present invention, the frame offset is kept constant for a complete sampled measurement frame, i.e. for several samples, but is preferably changed before sampling the next measurement frame. Thereby is achieved to employ different steps of the converter stair for different measurement signals to facilitate processing to improve accuracy, without introducing further sample-to-sample noise that need to be handled, and while still having all samples of a complete sampled measurement frame being based on a common frame offset, which can, if necessary for the further processing, simply be subtracted.

The timing signal comprising the frame offset may be implemented in accordance with the particular analog-to-digital converter used. For analog-to-digital converters having a start signal, e.g. a start-bit, a start-pin, a reset-pin, a frame input, or always starting whenever not holding, etc, the timing signal comprising the frame offset may be applied to such control bit or pin accordingly as a start signal or by controlling the start signal. For embodiments without such start signal, the frame offset may be applied to the analog-to-digital converter clock signal, in order to offset the clock signal slightly, e.g. by pausing.

In an embodiment said timing signal provider is arranged to ensure said individual frame offset for at least two of said ultrasound measurement signals being different.

According to the invention, different frame offsets should be used to achieve the improvement of the robustness to analog-to-digital converter non-linearity, as different frame offsets are possible to force the typically substantially identical ultrasound signals to be sampled at different steps of the converter transfer function stair as described above. It is therefore beneficial that the timing signal provider is arranged to ensure that different frame offsets are provided. This may for example be achieved by using a frame offset generating algorithm which calculates the next frame offset based on the previous frame offset, e.g. by incrementing, by taking the frame offsets from a predetermined sequence of different frame offsets, by determining a new frame offset in any way and then comparing it with the previous frame offset and repeat if not different, etc.

According to the invention in order to achieve the technical effect in general, it may in various embodiments be sufficient that there is a certain high probability for the provided frame offset being different from the previous frame offset, whereby making it acceptable to generate the frame offsets by randomising or pseudo-randomising processes, or apply an algorithm which, like randomising processes, mostly but not guaranteed produce different offsets. The practical suitability of such algorithms, including randomising and pseudo-randomising processes, depends on the risk of providing non-different frame offsets too often, which highly depends on the time resolution and range of different offsets available, i.e. in terms of sub-sample timing possibilities, i.e. fractions of a sample duration as described above.

It is noted, that the technical effect is achieved by using different frame offsets for measurements that are going to be compared, averaged, merged or otherwise processed together to end up with a common result, for example transit time difference determined on the basis of, e.g., 4 or 6 ultrasound measurement signals from the same transducer and sampled within a short time of each other, e.g. within between 1 ns and 1 s, for example 1 ms. Hence, for the next flow measurement for example taking place between 0.1 second and 1 minute later, the timing signal provider may in an embodiment reuse frame offsets previously provided for earlier flow measurements or generate randomised frame offsets, etc., only ensuring difference with other frame offsets used for the same flow measurement, not necessarily with frame offsets used for earlier flow measurements. Note the differentiation between the terms ultrasound measurement and flow measurement, the first referring to establishing a sampled measurement frame from an ultrasound measurement signal, the latter referring to a series of ultrasound measurements leading to the calculation of one absolute transit time for each direction and/or one transit-time difference. One flow measurement should be conducted within a short time where any flow changes may be considered negligible, e.g. less than 1 s, preferably less than 1 ms, whereas the periodicity of flow measurements only depends on the desired flow meter accumulation accuracy.

The technical effect may also be achieved in embodiments using only very few ultrasound measurements for each flow measurement, as the linearity errors will still be averaged out over time to result in generally improved flow measurement accuracy on average over time.

In an embodiment said timing signal provider is arranged to provide a first sequence of different frame offsets for use with a sequence of ultrasound measurement signals from a first ultrasonic transducer of said at least two ultrasonic transducers and to provide a sequence of different frame offsets for use with a sequence of ultrasound measurement signals from a second ultrasonic transducer of said at least two ultrasonic transducers.

In a preferred embodiment the ensuring different frame offsets may preferably be related to, and considered in the light of, a selected sequence of measurements among the different transducers. As an example, a two-transducer flow meter needing e.g. 6 measurements from each transducer, i.e. in each direction, to determine a flow representation with a predetermined acceptable accuracy, may in one embodiment be arranged to make 6 measurements from the first transducer with different frame offsets and then make 6 measurements from the second transducer with the same different or other different frame offsets, and may in another embodiment be arranged in an alternating fashion to make one measurement from each transducer with a first frame offset, then change frame offset and make a second measurement from each transducer, etc., until 6 pairs of measurements have been made with different frame offsets for each pair, and further embodiments may also be contemplated. In other words, the timing signal provider is according to an embodiment arranged to ensure that measurements from the same transducer are made with different frame offsets, whereas frame offsets used for different transducers may be shared or different.

In an embodiment said first and second sequences of ultrasound measurement signals each comprises 2-10 ultrasound measurement signals and said first and second sequences of different frame offsets each comprises 2-10 different frame offsets.

In other words, in a typical two-transducer transit-time flow meter setup, various embodiments preferably require a total of from 4 to 20 ultrasound measurements to determine a flow representation. The number of measurement signals used may be the same for all flow measurements of a particular flow meter model determined from the hardware design and balanced between energy and time consumption and required or desired accuracy, or may be variable and adjusted in accordance with actual achieved accuracy or a scheme of regularly making a flow measurement with more ultrasound measurements for reference purposes. As mentioned above, the ensuring different frame offsets may be reset at least between the mentioned sequences, i.e. for example between flow measurements.

In an embodiment said first and second sequences of different frame offsets are equal.

Thereby the measurements from each transducer are performed with equal frame offsets, for example advantageously based on a predetermined sequence of offsets. Thereby an advantageous embodiment of pair-wise measurement of each transducer with equal frame offset is enabled, which for some transit-time and flow representation calculation techniques may reduce the calculations as one sampled measurement frame from one transducer can be compared with one sampled measurement frame from another transducer disregarding the frame offset because they are equal.

In an embodiment said first and second sequences of different frame offsets contain no common values.

Thereby the absolute transit time measurements from each transducer are performed with completely different offsets, i.e. the ensuring different offsets is applied to all offsets provided for a particular complete flow measurement. Thereby the generation of different offsets do not have to be coordinated with the order of changing transducers during the measurement.

In an embodiment said first and second sequences of different frame offsets contain one or more common values.

In an embodiment the timing signal provider ensures difference within each sequence of frame offsets, e.g. by keeping track of previously provided offsets in each sequence, but does apply additional checking or coordination between the sequences.

In an embodiment said first and second sequences of ultrasound measurement signals are received in an alternating fashion and said timing signal provider is arranged to provide said first and second sequences of different frame offsets in a corresponding alternating fashion.

As it in some embodiments may be advantageous to switch the transmitting and receiving transducer between each or a few ultrasound measurements, the timing signal provider may be arranged to keep track of this switching or be controlled in accordance with the control of this switching to ensure different offsets within each sequence, but for various embodiments not necessarily ensuring different offsets between the sequences. In an embodiment using a predetermined sequence of offsets or where changing frame offset is relatively slow it may be advantageous to alternate between the transducers and reuse one frame offset for ultrasound measurement signals from all transducers, before changing to the next frame offset.

In an embodiment said timing signal provider is arranged to determine at least one of said frame offsets on the basis of a previous frame offset by an operation causing the new frame offset to be different from said previous frame offset.

When generating a new frame offset based on a previous frame offset several algorithms are available which ensures that the new frame offset is different from the previous, for example as simple as always incrementing by a certain amount, or applying more advanced operations for example an injective function using the previous frame offset as input. The operation may be wrapping in the sense that it may start over with the same or a different frame offset, depending on the increment, when reaching the end of its range, for example letting an incrementing operation wrap back to the first value when reaching an offset of 0.5 sample.

In an embodiment said operation comprises an increment operation or a decrement operation.

An advantageously simple operation ensuring different frame offsets may be simple incrementing or decrementing functions, or variations thereof.

In an embodiment said timing signal provider is communicatively coupled to or comprises a memory.

In various advantageous embodiments the memory may for example be used to store predetermined frame offsets, predetermined starting value for a frame offset generating algorithm, one or more previous frame offsets, etc. The memory may be a separate memory, a shared system memory, a register of a microcontroller, internal microcontroller or system-on-chip memory, etc., and may be of any suitable kind, e.g. flash, RAM, ROM, etc.

In an embodiment said timing signal provider is arranged to provide said frame offset from a sequence of predetermined frame offsets stored in said memory.

In an embodiment said timing signal provider is arranged to store a history of at least one previous frame offset for each transducer in said memory.

In an embodiment said timing signal provider is arranged to provide said frame offset on the basis of a randomly or pseudo-randomly selected value.

The frame offset may for example be determined as the result of a random( ) function supplied with appropriate arguments regarding output range, or a result of a random( ) function may be used as starting value for a frame offset generating algorithm. Pseudo-random values may for example be obtained by using a single arbitrary output sample obtained during silence, i.e. the sample comprising an arbitrary noise-value, or by using a single arbitrary output sample from an earlier sampled measurement frame, or be obtained from one or more LSBs from an ever changing memory location, e.g. a system timer for example counting milliseconds, etc.

In an embodiment said pseudo-randomly selected value is derived from one of said sampled measurement frames.

In an embodiment said individual frame offsets are different by less than a duration of a single sample, e.g. no more than 50%, preferably no more than 25%, more preferably no more than 15%, e.g. 12%, 8%, or 4%, of a duration of a single sample.

Preferably, the frame offsets are small, less than half a sample duration, as described above.

In an embodiment said sample timing input of said analog-to-digital converter comprises a control input for commanding the analog-to-digital converter to start sampling a sampled measurement frame; and wherein a control signal for said control input is based on said frame offset.

In an advantageous embodiment, the transit-time ultrasonic flow meter is arranged with a reference frame start time defined in relation to the ultrasound transmission start time and being a little shorter than the expected transit-time. The frame start control signal for the analog-to-digital converter may for example be based on such reference start time with the addition, or subtraction, of the frame offset determined for that respective measurement.

In an embodiment said timing signal provider comprises a digital-to-analog converter.

For simple and convenient establishment of the frame offsets various preferred embodiments utilise a digital-to-analog converter to generate the frame offsets or control signals, e.g. a start signal, based on the frame offsets. This may be particularly advantageous when the flow meter comprises a microcontroller or system-on-chip comprising on-chip converters directly controllable by the processing unit and easily connectable with none or only little auxiliary circuitry.

In an embodiment said processing unit is arranged to control said timing signal provider.

In an embodiment said processing unit is implemented in a microcontroller or a system-on-chip of said transit-time ultrasonic flow meter, and wherein said microcontroller or system-on-chip comprises an analog-to-digital converter of said analog-to-digital converter arrangement and a digital-to-analog converter of said timing signal provider.

An example of a suitable microcontroller is for example the EFM32G890 from Silicon Laboratories, Inc.

In an embodiment the timing signal provider is arranged to add a reference frame start time to said frame offset to offset start of sampling by a little less than an expected transit time.

In an embodiment said at least four ultrasound measurement signals are consecutive ultrasound measurement signals.

The present invention is particularly advantageous when applied to consecutive signals, i.e. a number of signals measured within a short time and related to the same or consecutive flow measurements.

In an embodiment said at least four ultrasound measurement signals comprises 4 to 20 ultrasound measurement signals.

As mentioned above, a typical two-transducer transit-time flow meter setup, in various embodiments preferably require a total of from 4 to 20 ultrasound measurements to determine a flow representation, i.e. determining the flow representation on the basis of 2 to 10 ultrasound measurements from each direction, i.e. each transducer. The number of measurement signals used may be the same for all flow measurements of a particular flow meter model determined from the hardware design and balanced between energy and time consumption and required or desired accuracy, or may be variable and adjusted in accordance with actual achieved accuracy or a scheme of regularly making a flow measurement with more ultrasound measurements for reference purposes. The ensuring different frame offsets may be reset after the mentioned number of ultrasound measurements, i.e. after for example 4 to 20 ultrasound measurements, i.e. for example between flow measurements.

In an embodiment said sampled measurement frame comprises 10 to 10,000 samples.

Several separate, finite ultrasound signals are measured, as mentioned above, and for each measured ultrasound signal, a finite sampled measurement frame is established. The number of samples per frame equals the length of the ultrasound signal multiplied with the sample rate. Short signals measured at low sample rate cause short frames of possibly as little as for example 10 samples. Longer signals and/or high sample rate produces larger frames. Various preferred flow meter embodiments make use of undersampling primarily for energy consumption reasons as higher rates consumes much more energy, for cost reasons as higher rate converters including supporting circuitry are typically more expensive, or for availability reasons as only a narrow range of microcontrollers with fast converters e.g. working above 1 million samples per second (MSPS) exist. Undersampling typically causes relatively short sampled measurement frames, e.g. comprising 20-80 samples, for example 40 samples.

In an embodiment said processing unit is arranged to calculate at least one transit time difference on the basis of at least two of said at least four ultrasound measurement signals being received from one of said at least two transducers and on the basis of at least two other of said at least four ultrasound measurement signals being received from another one of said at least two transducers.

The at least four, for example 4-20, ultrasound measurement signals are used to calculate at least a transit time difference based on ultrasound measurements from both transducers, i.e. based on measurements in both directions. For example in a two-transducer setup, half of the signals are from the first transducer and related to one direction, and the other half of the signals are from the second transducer and related to the opposite direction. Note that the signals of one half does not need to be the first half. In other words, a measurement schedule of one embodiment may involve measuring all desired signals from the first transducer before proceeding to measure all desired signals from the other transducer, whereas another embodiment may have a measurement schedule alternating between the two transducers, with one or e.g. two or three, signals measured before turning to the other transducer, and yet other embodiments may have even more complex measurement schedules.

This also means, that the ensuring different frame offsets is preferably performed for at least as long as sufficient signals has been sampled as described above. After that, the ensuring different frame offsets may be reset, e.g. by starting over with the initial value of an incrementing offset generating algorithm.

The determining a transit time and/or a transit-time difference from one or more sampled ultrasound signals is well-known to the skilled person, see for example several techniques for this described in PCT patent application publication WO2011/134470A2, hereby incorporated by reference. Various embodiments may determine a transit-time difference from each pair of sampled measurement frames and then average or otherwise combine or merge at least two determined transit-time differences, whereas other various embodiments may average or otherwise combine or merge at least two sampled measurement frames and determine one transit-time difference therefrom.

In an embodiment said processing unit is arranged to calculate at least one of said transit-time based flow representation using said calculated at least one transit time difference.

The at least four, for example 4-20, ultrasound measurement signals are via determining a transit time difference as described above, used to calculate said transit-time based flow representation. This also means, that the ensuring different frame offsets is preferably performed for at least as long as sufficient signals has been sampled to calculate a transit-time based flow representation. After that, the ensuring different frame offsets may be reset, e.g. by starting over with the initial value of an incrementing offset generating algorithm.

The calculation of a transit-time based flow representation is well-known to the skilled person, see for example PCT patent application publication WO2011/134470A2, hereby incorporated by reference.

In an embodiment said processing unit is arranged to calculate at least one of said transit-time based flow representation from said at least four sampled measurement frames.

Various embodiments allow for calculating the flow representation in different ways, using for example various differences or sums related to the transit times, and/or absolute transit times.

In an embodiment the analog-to-digital converter arrangement comprises an input level offset provider arranged to provide an input level offset value to said analog input.

Thereby is further made possible to control offset of the ultrasound measurement signal, which may be used in various advantageous ways in various embodiments as described below.

In an embodiment the input level offset provider is arranged to provide an individual input level offset value for at least two of said ultrasound measurement signals, each individual input level offset value being different.

By applying a different individual input level offset value for the individual measurements of substantially identical ultrasound measurement signals during a series of measurement signals, different steps of the stair, typically with different linearity errors, of the analog-to-digital converter are employed to produce each sampled measurement frame, i.e. achieving a similar effect as obtained by the utilization of different frame offsets for the individual signals. As a changing of input level offset value is a level offset and the changing of frame offsets according to the invention is a time offset, a combination of controlling both input level offset values and frame offsets during the measurements makes it possible to sample the signal in more different ways without requiring a high resolution of frame offset changes. In other words, if several measurements, e.g. 10 measurements, are desired with different conversions, instead of applying 10 different frame offsets, various combinations of a few, e.g. 4, different input level offset values and a few, e.g. 3, different frame offsets may provide similar results in terms of improved flow representations and volume measurements over time.

In an embodiment said establishment of a sampled measurement frame is based on the respective ultrasound measurement signal, said frame offset and said input level offset value.

In an embodiment said input level offset provider is arranged to ensure said individual input level offset value for at least two of said ultrasound measurement signals being different.

According to the invention, different input level offset values should be used to achieve the additional improvement of robustness to the analog-to-digital converter non-linearity, as different offsets are possible to facilitate the forcing the typically substantially identical ultrasound signals to be sampled at different steps of the converter transfer function stair as described above. It is therefore beneficial that the input level offset provider is arranged to ensure that different offsets are provided. This may for example be achieved by using an offset generating algorithm which calculates the next offset based on the previous offset, e.g. by incrementing, by taking the offsets from a predetermined sequence of different offsets, by determining a new offset in any way and then comparing it with the previous offset and repeat if not different, etc.

According to the invention in order to achieve the technical effect in general, it may in various embodiments be sufficient that there is a certain high probability for the provided offset being different from the previous offset, whereby making it acceptable to generate the offsets by randomising or pseudo-randomising processes, or apply an algorithm which, like randomising processes, mostly but not guaranteed produce different offsets. The practical suitability of such algorithms, including randomising and pseudo-randomising processes, depends on the risk of providing non-different offsets too often, which highly depends on the resolution and range of different offsets available, i.e. in terms of voltage sensitivity and available non-used dynamic range of the analog-to-digital converter, and the offset generator's resolution.

It is noted, that the technical effect is achieved by using different input level offset values for measurements that are going to be compared, averaged, merged or otherwise processed together to end up with a common result, for example a transit time difference determined on the basis of, e.g., 4 or 6 ultrasound measurement signals from each transducer and sampled within a short time of each other, e.g. within between 1 ns and 1 s, for example 1 ms. Hence, for the next flow measurement for example taking place between 0.1 second and 1 minute later, the input level offset provider may in an embodiment reuse input level offset values previously provided for earlier flow measurements or generate randomised offsets, etc., only ensuring difference with other offsets used for the same flow measurement, not necessarily with offsets used for earlier flow measurements.

In an embodiment wherein said input level offset provider is arranged to provide a first sequence of different input level offset values for use with a sequence of ultrasound measurement signals from a first ultrasonic transducer of said at least two ultrasonic transducers and to provide a sequence of different input level offset values for use with a sequence of ultrasound measurement signals from a second ultrasonic transducer of said at least two ultrasonic transducers.

In a preferred embodiment the ensuring different input level offset values may preferably be related to, and considered in the light of, a selected sequence of measurements among the different transducers. As an example, a two-transducer flow meter needing e.g. 6 measurements from each transducer, i.e. in each direction, to determine a transit time difference with a predetermined acceptable accuracy, may in one embodiment be arranged to make 6 measurements from the first transducer with different input level offset values and then make 6 measurements from the second transducer with the same different or other different input level offset values, and may in another embodiment be arranged in an alternating fashion to make one measurement from each transducer with a first input level offset value, then change input level offset value and make a second measurement from each transducer, etc., until 6 pairs of measurements have been made with different input level offset values for each pair, and further embodiments may also be contemplated. In other words, the input level offset provider is according to an embodiment arranged to ensure that measurements from the same transducer are made with different offsets, whereas offsets used for different transducers may be shared or different. This may further be coordinated or not coordinated with the variation of frame offsets according to the invention in several different ways to facilitate numerous different conversions made from highly similar signals to improve the accuracy of the conversions in average.

In an embodiment said individual input level offset values are different by less than 15%, preferably less than 10%, more preferably around 5%, 3%, or 1%, of a full range of said analog-to-digital converter.

Preferably, the input level offset values are small, only a few percent of ADC full range, to facilitate keeping the complete signal within the dynamic range of the analog-to-digital converter. To force the conversion to go up or down one step of the transfer function stair, in theory the offset does not have to be larger than the input voltage corresponding to one LSB output change of the analog-to-digital converter. For a 10-bit analog-to-digital converter having 1024 steps, one step or LSB represents ideally about 0.1% of full range. In a preferred embodiment the change is in practice set a little higher, e.g. about 1%, 3% or 5%, to ensure that a completely different step is utilised even in case of severe non-linearities.

In an embodiment said analog input of said analog-to-digital converter comprises a differential input with two connector points.

By implementing the analog-to-digital converter with differential analog input is advantageously achieved a simple option of providing the ultrasound measurement signal and the input level offset value to two different connector points, thereby avoiding a need to providing a summing or subtraction point to merge the two inputs.

In an embodiment said ultrasound measurement signals and said input level offset value are coupled to different of said two connector points.

In an embodiment said input level offset provider comprises a digital-to-analog converter.

For simple and convenient establishment of the input level offset values various preferred embodiments utilise a digital-to-analog converter to generate the offset values. This may be particularly advantageous when the flow meter comprises a microcontroller or system-on-chip comprising on-chip converters directly controllable by the processing unit and easily connectable with none or only little auxiliary circuitry.

In an embodiment said processing unit is arranged to control said input level offset provider.

It is highly advantageous to let the processing unit control both the input level offset provider and the timing signal provider to achieve a coordination and thereby possible synergy of the various possible linearity improvement techniques described above.

In an embodiment the input level offset provider is arranged to provide a DC correction value to said analog input to offset a DC level of the ultrasound measurement signal to within 20%, preferably within 10%, for example within 5%, of a median of a dynamic range of the analog-to-digital converter.

The input level offset provider may advantageously be employed to add a DC correction value to balance the ultrasound measurement signal substantially in the middle of the dynamic range of the analog-to-digital converter, for example within 20% of the median of the range. Thereby is reduced the risk of clipping and/or facilitated an adaptive dynamic range feature of the analog-to-digital converter, making it possible to match the dynamic range to be for example from 105% to 125% of the signal amplitude, without risking clipping by an unexpected DC level.

This feature of the input level offset provider may in an embodiment be combined with the above-described feature of using the input level offset provider to ensure a changing input level offset value for at least two of the at least four ultrasound measurement signals.

In an embodiment the input level offset provider is arranged to add said DC correction value to said input level offset value.

In an embodiment the analog-to-digital converter arrangement comprises a reference voltage provider arranged to provide a reference voltage to a reference voltage input of said analog-to-digital converter.

Thereby is further made possible to control the reference voltage, i.e. the dynamic range, of the analog-to-digital converter, which may be used in various advantageous ways in various embodiments as described below.

Further embodiments comprise a combination of the providing of a frame offset as described above with the providing of a reference voltage as described in more detail here below, possibly also in combination with the providing of an input level offset value as described above.

In an embodiment the reference voltage provider is arranged to provide an individual reference voltage for at least two of said ultrasound measurement signals, each individual reference voltage being different.

By providing different reference voltages for the individual measurements of substantially identical ultrasound measurement signals, the converter may be forced to use different steps of the transfer function stair for the individual signals, i.e. achieving a similar effect as obtained by the utilization of different frame offsets for the individual signals. As a changing of voltage reference leading to a larger or smaller dynamic range does not necessarily offset the signal but instead in practice changes the resolution available for the peak-to-peak amplitude of the signal, a combination of controlling both frame offset and/or input level offset values and reference voltages during the measurements makes it possible to sample the signal in more different ways without requiring large offsets.

In an embodiment said establishment of a sampled measurement frame is based on the respective ultrasound measurement signal, said frame offset, said reference voltage, and preferably an input level offset value.

In an embodiment said reference voltage provider is arranged to ensure said individual reference voltage for at least two of said ultrasound measurement signals being different.

According to the invention, different reference voltages are preferably used to achieve the additional improvement of robustness to the analog-to-digital converter non-linearity, as different reference voltages are possible to facilitate the forcing the typically substantially identical ultrasound signals to be sampled at different steps of the converter transfer function stair as described above. It is therefore beneficial that the reference voltage provider is arranged to ensure that different reference voltages are provided. This may for example be achieved by using a reference voltage generating algorithm which calculates the next reference voltage based on the previous reference voltage, e.g. by incrementing, by taking the reference voltages from a predetermined sequence of different reference voltages, by determining a new reference voltage in any way and then comparing it with the previous reference voltage and repeat if not different, etc.

According to the invention in order to achieve the technical effect in general, it may in various embodiments be sufficient that there is a certain high probability for the provided reference voltage being different from the previous reference voltage, whereby making it acceptable to generate the reference voltages by randomising or pseudo-randomising processes, or apply an algorithm which, like randomising processes, mostly but not guaranteed produce different reference voltages. The practical suitability of such algorithms, including randomising and pseudo-randomising processes, depends on the risk of providing non-different reference voltages too often, which highly depends on the resolution and range of different reference voltages available, i.e. in terms of voltage sensitivity and available non-used dynamic range of the analog-to-digital converter, and the reference voltage generator's resolution.

It is noted, that the technical effect is achieved by using different reference voltages for measurements that are going to be compared, averaged, merged or otherwise processed together to end up with a common result, for example a transit time difference determined on the basis of, e.g., 4 or 6 ultrasound measurement signals from each transducer and sampled within a short time of each other, e.g. within between 1 ns and 1 s, for example 1 ms. Hence, for the next flow measurement for example taking place between 0.1 second and 1 minute later, the reference voltage provider may in an embodiment reuse reference voltages previously provided for earlier flow measurements or generate randomised reference voltages, etc., only ensuring difference with other reference voltages used for the same flow measurement, not necessarily with reference voltages used for earlier flow measurements.

In an embodiment said reference voltage provider is arranged to provide a first sequence of different reference voltages for use with a sequence of ultrasound measurement signals from a first ultrasonic transducer of said at least two ultrasonic transducers and to provide a sequence of different reference voltages for use with a sequence of ultrasound measurement signals from a second ultrasonic transducer of said at least two ultrasonic transducers.

In a preferred embodiment the ensuring different reference voltages may preferably be related to, and considered in the light of, a selected sequence of measurements among the different transducers. As an example, a two-transducer flow meter needing e.g. 6 measurements from each transducer, i.e. in each direction, to determine a transit time difference with a predetermined acceptable accuracy, may in one embodiment be arranged to make 6 measurements from the first transducer with different reference voltages and then make 6 measurements from the second transducer with the same different or other different reference voltages, and may in another embodiment be arranged in an alternating fashion to make one measurement from each transducer with a first reference voltage, then change reference voltage and make a second measurement from each transducer, etc., until 6 pairs of measurements have been made with different reference voltages for each pair, and further embodiments may also be contemplated. In other words, the reference voltage provider is according to an embodiment arranged to ensure that measurements from the same transducer are made with different reference voltages, whereas reference voltages used for different transducers may be shared or different. This may further be coordinated or not coordinated with the variation of frame offsets according to the invention in several different ways to facilitate numerous different conversions made from highly similar signals to improve the accuracy of the conversions in average.

In an embodiment said individual reference voltages are different by less than 15%, preferably less than 10%, more preferably around 5%, 3%, or 1% or 0.5%, of a reference voltage of said analog-to-digital converter.

Preferably, the changes of reference voltages are small, only a few percent or even less of the ADC full range, to facilitate keeping the complete signal within a significant part of the dynamic range of the analog-to-digital converter.

In an embodiment said reference voltage provider comprises a digital-to-analog converter.

For simple and convenient establishment of the reference voltages various preferred embodiments utilise a digital-to-analog converter to generate the reference voltages. This may be particularly advantageous when the flow meter comprises a microcontroller or system-on-chip comprising on-chip converters directly controllable by the processing unit and easily connectable with none or only little auxiliary circuitry. In an embodiment with a differential voltage reference, two digital-to-analog converters are preferably applied to produce the composite reference voltage.

In an embodiment said processing unit is arranged to control said reference voltage provider.

It is highly advantageous to let the processing unit control both the timing signal provider and the reference voltage provider to achieve a coordination and thereby possible synergy of the various possible accuracy improvement techniques described above.

In an embodiment the reference voltage provider is arranged to provide a dynamic range correction value to said reference voltage input to accommodate an amplitude of the ultrasound measurement signal within 80%, preferably within 90%, for example within 95%, of a dynamic range of the analog-to-digital converter.

The reference voltage provider may advantageously be employed to add a dynamic range correction value to match the dynamic range substantially to the ultrasound measurement signal, preferably with a margin for safety and to allow the input level offset value changes. The dynamic range correction value may for example be determined with an aim of the ultrasound measurement signal amplitude being about 80%-90% of the dynamic range. Thereby is reduced the risk of clipping and/or facilitated a DC correction feature of the analog-to-digital converter, making it possible to match the dynamic range to be for example from 105% to 125% of the signal amplitude, with reduced risk of clipping by an unexpected DC level.

This feature of the reference voltage provider may in an embodiment be combined with the above-described feature of using the reference voltage provider to ensure a changing reference voltage for at least two of the at least four ultrasound measurement signals.

In an embodiment the reference voltage provider is arranged to add said dynamic range correction value to said reference voltage.

In an embodiment said timing signal provider is arranged to provide said timing signal further comprising sample rate to said sample timing input of said analog-to-digital converter.

Thereby is further made possible to control the timing of sampling the individual frame, i.e. a time scaling, of the analog-to-digital converter, which may be used in various advantageous ways in various embodiments as described below. The timing signal provider may for example be arranged to provide said timing signal comprising both a frame offset and a sample rate, and the sample timing input may comprise an input for frame offset and an input for sample rate.

In a preferred embodiment, the sample rate is defined as a division of a faster system or reference clock, and the sample rate can therefore be changed by selecting a different divisor for each measurement. The timing signal may also comprise the sample clock of desired sample rate, or parameters to establish a clock at the desired sample rate. The largest improvements are achieved in systems with relatively low sample rates compared to the signal's frequency content, as the signal should preferably change considerably between each sample to reach a different converter step by the application of the changing sample rate. The timing signal comprising the sample rate may be implemented in accordance with the particular analog-to-digital converter used. For analog-to-digital converters having a sampling clock inputas part of the signal timing input, the timing signal provider may establish the timing signal as a sampling clock with the desired clock rate and apply it to such sampling clock input. For embodiments with a divisor input for establishing the sampling clock from a system clock by division to control the sample rate, the timing signal provider may establish the timing signal as a control signal comprising the divisor or other suitable control value.

Hence, the signal timing input may comprise several inputs, e.g. a sample clock input or a divisor input and e.g. a sample start input, etc.

Further embodiments comprise a combination of the providing of a frame offset as described above with the providing of a sample rate as described in more detail here below, possibly also in combination with the providing of an input level offset value and/or the providing of a reference voltage as described above.

In an embodiment the timing signal provider is arranged to provide an individual sample rate for at least two of said ultrasound measurement signals, each individual sample rate being different.

By providing different sample rates for the individual measurements of substantially identical ultrasound measurement signals, the converter may be forced to use different steps of the transfer function stair for the individual signals, i.e. achieving a similar effect as obtained by the utilization of different frame offsets for the individual signals according to the invention. As a changing of sample rate is a time scaling and the changing of frame offset is a time offset, a combination of controlling both sample rates and frame offsets during the measurements makes it possible to sample the signal in more different ways without requiring large reference voltage changes.

In an embodiment said establishment of a sampled measurement frame is based on the respective ultrasound measurement signal, said frame offset and said sample rate, and preferably one or more of said input level offset value and said reference voltage.

In an embodiment said timing signal provider is arranged to ensure said individual sample rate for at least two of said ultrasound measurement signals being different.

Different sample rates should be used to achieve the improvement of the analog-to-digital converter non-linearity robustness, as different sample rates are possible to force the typically substantially identical ultrasound signals to be sampled at different steps of the converter transfer function stair as described above. It is therefore beneficial that the timing signal provider is arranged to ensure that different sample rates are provided. This may for example be achieved by using a sample rate generating algorithm which calculates the next sample rate based on the previous sample rate, e.g. by incrementing, by taking the sample rates from a predetermined sequence of different sample rates, by determining a new sample rate in any way and then comparing it with the previous sample rate and repeat if not different, etc.

In order to achieve the technical effect in general, it may in various embodiments be sufficient that there is a certain high probability for the provided sample rate being different from the previous sample rate, whereby making it acceptable to generate the sample rates by randomising or pseudo-randomising processes, or apply an algorithm which, like randomising processes, mostly but not guaranteed produce different sample rates. The practical suitability of such algorithms, including randomising and pseudo-randomising processes, depends on the risk of providing non-different sample rates too often, which highly depends on the time resolution and range of different sample rates available, i.e. in terms of clock division possibilities as described above.

It is noted, that the technical effect is achieved by using different sample rates for measurements that are going to be compared, averaged, merged or otherwise processed together to end up with a common result, for example a transit time difference determined on the basis of, e.g., 4 or 6 ultrasound measurement signals from each transducer and sampled within a short time of each other, e.g. within between 1 ns and 1 s, for example 1 ms. Hence, for the next flow measurement for example taking place between 0.1 second and 1 minute later, the timing signal provider may in an embodiment reuse sample rates previously provided for earlier flow measurements or generate randomised sample rates, etc., only ensuring difference with other sample rates used for the same flow measurement, not necessarily with sample rates used for earlier flow measurements.

In an embodiment wherein said timing signal provider is arranged to provide a first sequence of different sample rates for use with a sequence of ultrasound measurement signals from a first ultrasonic transducer of said at least two ultrasonic transducers and to provide a sequence of different sample rates for use with a sequence of ultrasound measurement signals from a second ultrasonic transducer of said at least two ultrasonic transducers.

In a preferred embodiment the ensuring different sample rates may preferably be related to, and considered in the light of, a selected sequence of measurements among the different transducers. As an example, a two-transducer flow meter needing e.g. 6 measurements from each transducer, i.e. in each direction, to determine a transit time difference with a predetermined acceptable accuracy, may in one embodiment be arranged to make 6 measurements from the first transducer with different sample rates and then make 6 measurements from the second transducer with the same different or other different sample rates, and may in another embodiment be arranged in an alternating fashion to make one measurement from each transducer with a first sample rate, then change sample rate and make a second measurement from each transducer, etc., until 6 pairs of measurements have been made with different sample rates for each pair, and further embodiments may also be contemplated. In other words, the timing signal provider is according to an embodiment arranged to ensure that measurements from the same transducer are made with different sample rates, whereas sample rates used for different transducers may be shared or different. This may further be coordinated or not coordinated with the variation of frame offsets according to the invention in several different ways to facilitate numerous different conversions made from highly similar signals to improve the accuracy of the conversions in average.

In an embodiment said individual sample rates are different by 1%-10%, e.g. one individual sample rate being between 92% and 98% or between 102% and 108% of a previous individual sample rate, e.g. 95% or 105% of a previous individual sample rate.

Preferably, the sample rate changes are sufficiently large to change the individual sample significantly so that at least a portion of the samples get converted at different conversion steps than the previous measurement signal. On the other hand, the change of sample rate should be sufficiently small to allow the same number of total samples, e.g. 40 samples, to cover primary features of the measurement signal, including the beginning and end of the signal. Increasing the sample rate too much, in some embodiments for example more than 10%, may cause a fixed number of samples selected to cover the entire signal at a nominal sample rate, e.g. 40 samples, to not cover the end of the signal at the significantly higher rate. Likewise, reducing the sample rate too much, in some embodiments for example more than 10%, may cause a fixed number of samples selected to cover the entire signal at a nominal sample rate, e.g. 40 samples, to be separated too much and a number of the samples being used for a useless sampling of silence following the measurement signal.

In an embodiment said sample timing input of said analog-to-digital converter comprises a sample clock input or sample rate divisor input for controlling a sample rate of the analog-to-digital converter; and wherein a control signal for said sample clock input or sample rate divisor input is based on said sample rate.

In an embodiment said timing signal provider comprises a digital-to-analog converter.

For simple and convenient establishment of the sample rates various preferred embodiments utilise a digital-to-analog converter to generate the sample rates or control signals, e.g. a divisor or clock signal, based on the sample rates. This may be particularly advantageous when the flow meter comprises a microcontroller or system-on-chip comprising on-chip converters directly controllable by the processing unit and easily connectable with none or only little auxiliary circuitry.

In an embodiment said processing unit is arranged to control said timing signal provider with respect to said sample rate.

It is highly advantageous to let the processing unit control the timing signal provider with respect to sample rate to achieve a coordination and thereby possible synergy of the various possible accuracy improvement techniques described above.

In an aspect the invention relates to a method for calculating a transit-time based flow representation in a transit-time ultrasonic flow meter comprising at least two ultrasonic transducers, an analog-to-digital converter arrangement for sampling ultrasound measurement signals from the ultrasonic transducers and a processing unit for said calculating, the method comprising the steps of:
providing by a timing signal provider a timing signal to a sample timing input of an analog-to-digital converter of said analog-to-digital converter arrangement;
establishing an ultrasound measurement signal by one of said at least two ultrasonic transducers;
receiving said ultrasound measurement signal at an analog input of said analog-to-digital converter;
establishing by the analog-to-digital converter a sampled measurement frame with at least 10 samples on the basis of said ultrasound measurement signal and the timing signal;
providing said sampled measurement frame at a sample output of said analog-to-digital converter coupled to said processing unit;
repeating the above steps with a total of at least four ultrasound measurement signals, wherein said providing said timing signal comprises providing a different timing signal for at least two of said at least four ultrasound measurement signals, said different timing signal being different with respect to a frame offset; and
calculating one or more transit-time based flow representation by the processing unit on the basis of a sampled measurement frame from each of said repetitions.

Different Sample Rates

In an aspect the invention relates to a transit-time ultrasonic flow meter comprising at least two ultrasonic transducers, an analog-to-digital converter arrangement for sampling ultrasound measurement signals from the ultrasonic transducers and a processing unit for calculating a transit-time based flow representation from the sampled measurement signals;
wherein the analog-to-digital converter arrangement comprises: an analog-to-digital converter comprising an analog input, a sample timing input and a sample output; and
a timing signal provider arranged to provide a timing signal to the sample timing input;
wherein the analog-to-digital converter arrangement is arranged to receive at least four ultrasound measurement signals from the ultrasonic transducers and provide the ultrasound measurement signals to the analog input;
wherein the timing signal provider is arranged to provide an individual timing signal for at least two of said ultrasound measurement signals, each individual timing signal being different with respect to a sample rate; and
wherein the analog-to-digital converter is arranged to establish for each of the at least four ultrasound measurement signals a sampled measurement frame with at least 10 samples on the basis of the respective ultrasound measurement signal and the timing signal and provide the sampled measurement frame at the sample output coupled to said processing unit.

The invention may improve transit-time based flow measurements by improving the robustness against non-linearity of the analog-to-digital conversion of ultrasound measurements on which the transit-time calculations are based. By the present invention, the average error over time of transit-time difference measurements, and thereby of determined flow representations and volume measurements of the flow meter are improved.

The transfer function of an analog-to-digital converter may be illustrated as a stair, where the number of steps of the stair corresponds to the resolution of the converter and a varying width of the individual steps illustrates non-linearities of the converter. By using a different sample frequency for some or each ultrasound measurement signal during a series of measurement signals, the pulsed ultrasound signal will be sampled at different points on the curve, i.e. at different input levels, thereby utilising different steps of the stair, typically with different linearity errors, of the analog-to-digital converter to produce each sampled measurement frame.

An ultrasound measurement signal according to the invention refers to a signal comprising a limited number of periods of a signal in the ultrasonic frequency range, the complete ultrasound measurement signal having a duration for example between 1 ns and 1 s, e.g. between 1 µs and 1 ms. The ultrasound measurement signal may be generated by one of the transducers picking up a burst of ultrasound generated by another of the transducers after having travelled through a fluid, to produce the ultrasound measurement signal as an electrical signal for the analog input of the analog-to-digital converter arrangement.

A sampled measurement frame according to the invention refers to a sampled signal comprising a limited number of samples of an ultrasound measurement signal. The length of a complete sampled measurement frame may correspond to the duration of the ultrasound measurement signal being sampled, for example from 1 ns to 1 s, which may for example involve from 10 samples to 10,000 samples.

By combining two or more sampled measurement frames from the same transducer, i.e. from the same measurement direction, into one measurement, e.g. by averaging, the different linearity errors are thereby also combined, e.g. averaged, leading typically to improved overall linearity of the measurements.

Alternatively, and/or in addition, the average error over time of several measurements, is also improved by the invention. In other words, the invention improves the average accuracy of calculated transit time differences, and thereby the average flow and volume measurements of a flow meter.

In particular for measuring several substantially identical ultrasound signals, as is often the case in ultrasonic flow meters, the present invention may prove advantageous, as it may avoid that the identical signals are measured with identical linearity errors. On the contrary, the present invention may cause the identical measurements to be made with different linearity errors, thereby making it possible to reduce the linearity error over time for example by averaging out the differences or by subtracting added offsets.

By changing the sample rate for each measurement, i.e. for each ultrasound signal measured, each measurement may activate an overlapping but slightly different range of steps of the converter stair.

Using a different sample rate for sampling each measurement frame through a series of measurement frames may improve robustness to the non-linearity of the analog-to-digital converter as each sampled measurement frame even with constant ultrasound signals may have different linearity errors so the average may have higher accuracy. In a preferred embodiment, the sample rate is defined as a division of a faster system or reference clock, and the sample rate can therefore be changed by selecting a different divisor for each measurement. The largest improvements are achieved in systems with relatively low sample rates compared to the signal's frequency content, as the signal should preferably change considerably between each sample to reach a different converter step by the application of the changing sample rate.

In relation to transit-time based ultrasonic flow meters, some of the highly relevant considerations are: accuracy and consistency as flow meters are often used as input for billing and even small errors may accumulate to large errors over several years of flow; energy consumption because the flow meters are often battery operated and required to endure for 8-10 years without replacing or recharging their battery; space requirement as flow meters are often required to be mounted in extremely confined spaces; and costs as a huge number of flow meters are produced so even small cost reductions add up to significant amounts.

Reduction of the number of electronic components by integration by for example a versatile microcontroller or system-on-chip may generally improve on all the mentioned factors, as such integration leads to smaller, often energy saving, and often cheaper, flow meter designs. On the other hand, integration also requires compromises on the different functions due to a limited number of suitable microcontrollers, as compared to having separate integrated circuits for each function, e.g. A/D-converters, D/A-converters, display controllers, etc.

The present invention introduces more flexibility and facilitates the selection of microcontroller or system-on-chip by reducing the requirements to the integrated A/D-converters. This is achieved by the ability of embodiments of the present invention to improve robustness to non-linearity of for example low or medium quality A/D-converters, thereby increasing accuracy of flow and volume measurements over time. With reduced requirements to A/D-converters, the number of available microcontrollers increases, making it possible to let other requirements, e.g. display controller functionality or price, be deciding factors.

Compared to dithering techniques, the present invention may be advantageous in the particular field of measuring ultrasonic signals in transit-time based ultrasonic flow meters, as such signals are often characterized by one or more of small scale, broadband and/or sampled at low rate. For example, in a preferred embodiment, the ultrasound signals are subsampled, i.e. sampled at a rate below the Nyquist rate related to the frequency content of the analog ultrasound signal, and due to aliasing such a sampled signal may end up as a broadband signal, for example with content in 16 out of 64 FFT bins, making it difficult or complicated to remove any applied dithering. Various techniques to analyze a subsampled signal may also be disturbed or made more complicated by conventional dithering. Further, in order to save power, ultrasonic flow meters according to the invention are preferably highly energy efficient, meaning for instance that the ultrasonic signals are transmitted with the lowest possible power, and the receiver circuit including the analog-to-digital converter arrangement preferably prioritizes energy efficiency over sensitivity. This means that any applied noise from dithering may drown or distort the utility signal beyond recovery, in particular when sampling at a low rate.

With the present invention, the sample rate is kept constant for a complete sampled measurement frame, i.e. for several samples, but is preferably changed before sampling the next measurement frame. Thereby is achieved to employ different steps of the converter stair for different measurement signals to facilitate processing to improve accuracy, without introducing further sample-to-sample noise that need to be handled, and while still having all samples of a complete sampled measurement frame being based on a common sample rate, which can, if necessary for the further processing, simply be subtracted.

The timing signal comprising the sample rate may be implemented in accordance with the particular analog-to-digital converter used. For analog-to-digital converters having a sampling clock input as part of the signal timing input, the timing signal provider may establish the timing signal as a sampling clock with the desired clock rate and apply it to such sampling clock input. For embodiments with a divisor input for establishing the sampling clock from a system clock by division to control the sample rate, the timing signal provider may establish the timing signal as a control signal comprising the divisor or other suitable control value.

In an embodiment said timing signal provider is arranged to ensure said individual sample rate for at least two of said ultrasound measurement signals being different.

According to the invention, different sample rates should be used to achieve the improvement of the robustness to analog-to-digital converter non-linearity, as different sample rates are possible to force the typically substantially identical ultrasound signals to be sampled at different steps of the converter transfer function stair as described above. It is therefore beneficial that the timing signal provider is arranged to ensure that different sample rates are provided. This may for example be achieved by using a sample rate generating algorithm which calculates the next sample rate based on the previous sample rate, e.g. by incrementing, by taking the sample rates from a predetermined sequence of different sample rates, by determining a new sample rate in any way and then comparing it with the previous sample rate and repeat if not different, etc.

According to the invention in order to achieve the technical effect in general, it may in various embodiments be sufficient that there is a certain high probability for the provided sample rate being different from the previous sample rate, whereby making it acceptable to generate the sample rates by randomising or pseudo-randomising processes, or apply an algorithm which, like randomising processes, mostly but not guaranteed produce different sample rates. The practical suitability of such algorithms, including randomising and pseudo-randomising processes, depends on the risk of providing non-different sample rates too often, which highly depends on the time resolution and range of different sample rates available, i.e. in terms of clock division possibilities as described above.

It is noted, that the technical effect is achieved by using different sample rates for measurements that are going to be compared, averaged, merged or otherwise processed together to end up with a common result, for example transit time difference determined on the basis of, e.g., 4 or 6 ultrasound measurement signals from the same transducer and sampled within a short time of each other, e.g. within between 1 ns and 1 s, for example 1 ms. Hence, for the next flow measurement for example taking place between 0.1 second and 1 minute later, the timing signal provider may in an embodiment reuse sample rates previously provided for earlier flow measurements or generate randomised sample rates, etc., only ensuring difference with other sample rates used for the same flow measurement, not necessarily with sample rates used for earlier flow measurements. Note the differentiation between the terms ultrasound measurement and flow measurement, the first referring to establishing a sampled measurement frame from an ultrasound measurement signal, the latter referring to a series of ultrasound measurements leading to the calculation of one absolute transit time for each direction and/or one transit-time difference. One flow measurement should be conducted within a short time where any flow changes may be considered negligible, e.g. less than 1 s, preferably less than 1 ms, whereas the periodicity of flow measurements only depends on the desired flow meter accumulation accuracy.

The technical effect may also be achieved in embodiments using only very few ultrasound measurements for each flow measurement, as the linearity errors will still be averaged out over time to result in generally improved flow measurement accuracy on average over time.

In an embodiment said timing signal provider is arranged to provide a first sequence of different sample rates for use with a sequence of ultrasound measurement signals from a first ultrasonic transducer of said at least two ultrasonic transducers and to provide a sequence of different sample rates for use with a sequence of ultrasound measurement signals from a second ultrasonic transducer of said at least two ultrasonic transducers.

In a preferred embodiment the ensuring different sample rates may preferably be related to, and considered in the light of, a selected sequence of measurements among the different transducers. As an example, a two-transducer flow meter needing e.g. 6 measurements from each transducer, i.e. in each direction, to determine a flow representation with a predetermined acceptable accuracy, may in one embodiment be arranged to make 6 measurements from the first transducer with different sample rates and then make 6 measurements from the second transducer with the same different or other different sample rates, and may in another embodiment be arranged in an alternating fashion to make one measurement from each transducer with a first sample rate, then change sample rate and make a second measurement from each transducer, etc., until 6 pairs of measurements have been made with different sample rates for each pair, and further embodiments may also be contemplated. In other words, the timing signal provider is according to an embodiment arranged to ensure that measurements from the same transducer are made with different sample rates, whereas sample rates used for different transducers may be shared or different.

In an embodiment said first and second sequences of ultrasound measurement signals each comprises 2-10 ultrasound measurement signals and said first and second sequences of different sample rates each comprises 2-10 different sample rates.

In other words, in a typical two-transducer transit-time flow meter setup, various embodiments preferably require a total of from 4 to 20 ultrasound measurements to determine a flow representation. The number of measurement signals used may be the same for all flow measurements of a particular flow meter model determined from the hardware design and balanced between energy and time consumption and required or desired accuracy, or may be variable and adjusted in accordance with actual achieved accuracy or a scheme of regularly making a flow measurement with more ultrasound measurements for reference purposes. As mentioned above, the ensuring different sample rates may be reset at least between the mentioned sequences, i.e. for example between flow measurements.

In an embodiment said first and second sequences of different sample rates are equal.

Thereby the measurements from each transducer are performed with equal sample rates, for example advantageously based on a predetermined sequence of sample rates. Thereby an advantageous embodiment of pair-wise measurement of each transducer with equal sample rate is enabled, which for some transit-time and flow representation calculation techniques may reduce the calculations as one sampled measurement frame from one transducer can be compared with one sampled measurement frame from another transducer disregarding the particular sample rate because they are equal.

In an embodiment said first and second sequences of different sample rates contain no common values.

Thereby the absolute transit time measurements from each transducer are performed with completely different sample rates, i.e. the ensuring different sample rates is applied to all sample rates provided for a particular complete flow measurement. Thereby the generation of different sample rates do not have to be coordinated with the order of changing transducers during the measurement.

In an embodiment said first and second sequences of different sample rates contain one or more common values.

In an embodiment the timing signal provider ensures difference within each sequence of sample rates, e.g. by keeping track of previously provided sample rates in each sequence, but does apply additional checking or coordination between the sequences.

In an embodiment said first and second sequences of ultrasound measurement signals are received in an alternating fashion and said timing signal provider is arranged to provide said first and second sequences of different sample rates in a corresponding alternating fashion.

As it in some embodiments may be advantageous to switch the transmitting and receiving transducer between each or a few ultrasound measurements, the timing signal provider may be arranged to keep track of this switching or be controlled in accordance with the control of this switching to ensure different sample rates within each sequence, but for various embodiments not necessarily ensuring different sample rates between the sequences. In an embodiment using a predetermined sequence of sample rates or where changing sample rate is relatively slow it may be advantageous to alternate between the transducers and reuse one sample rate for ultrasound measurement signals from all transducers, before changing to the next sample rate.

In an embodiment said timing signal provider is arranged to determine at least one of said sample rates on the basis of a previous sample rate by an operation causing the new sample rate to be different from said previous sample rate.

When generating a new sample rate based on a previous sample rate several algorithms are available which ensures that the new sample rate is different from the previous, for example as simple as always incrementing by a certain amount, or applying more advanced operations for example an injective function using the previous sample rate as input. The operation may be wrapping in the sense that it may start over with the same or different sample rate, depending on the increment, when reaching the end of its range, for example letting an incrementing operation wrap back to the first value when there are no more divisors to use, or when the sample rate gets too far from the desired sample rate.

In an embodiment said operation comprises an increment operation or a decrement operation.

An advantageously simple operation ensuring different sample rates may be simple incrementing or decrementing functions, or variations thereof.

In an embodiment said timing signal provider is communicatively coupled to or comprises a memory.

In various advantageous embodiments the memory may for example be used to store predetermined sample rates, predetermined starting value for a sample rate generating algorithm, one or more previous sample rates, etc. The memory may be a separate memory, a shared system memory, a register of a microcontroller, internal microcontroller or system-on-chip memory, etc., and may be of any suitable kind, e.g. flash, RAM, ROM, etc.

In an embodiment said timing signal provider is arranged to provide said sample rate from a sequence of predetermined sample rates stored in said memory.

In an embodiment said timing signal provider is arranged to store a history of at least one previous sample rate for each transducer in said memory.

In an embodiment said timing signal provider is arranged to provide said sample rate on the basis of a randomly or pseudo-randomly selected value.

The frame offset may for example be determined as the result of a random( ) function supplied with appropriate arguments regarding output range, or a result of a random( ) function may be used as starting value for a sample rate generating algorithm. Pseudo-random values may for example be obtained by using a single arbitrary output sample obtained during silence, i.e. the sample comprising an arbitrary noise-value, or by using a single arbitrary output sample from an earlier sampled measurement frame, or be obtained from one or more LSBs from an ever changing memory location, e.g. a system timer for example counting milliseconds, etc.

In an embodiment said pseudo-randomly selected value is derived from one of said sampled measurement frames.

In an embodiment said individual sample rates are different by 1%-10%, e.g. one individual sample rate being between 92% and 98% or between 102% and 108% of a previous individual sample rate, e.g. 95% or 105% of a previous individual sample rate.

Preferably, the sample rate changes are sufficiently large to change the individual sample significantly so that at least a portion of the samples get converted at different conversion steps than the previous measurement signal. On the other hand, the change of sample rate should be sufficiently small to allow the same number of total samples, e.g. 40 samples, to cover primary features of the measurement signal, including the beginning and end of the signal. Increasing the sample rate too much, in some embodiments for example more than 10%, may cause a fixed number of samples selected to cover the entire signal at a nominal sample rate, e.g. 40 samples, to not cover the end of the signal at the significantly higher rate. Likewise, reducing the sample rate too much, in some embodiments for example more than 10%, may cause a fixed number of samples selected to cover the entire signal at a nominal sample rate, e.g. 40 samples, to be separated too much and a number of the samples being used for a useless sampling of silence following the measurement signal.

In an embodiment said sample timing input of said analog-to-digital converter comprises a sample clock input or sample rate divisor input for controlling a sample rate of the analog-to-digital converter; and wherein a control signal for said sample clock input or sample rate divisor input is based on said sample rate.

In an embodiment said timing signal provider comprises a digital-to-analog converter.

For simple and convenient establishment of the sample rates various preferred embodiments utilise a digital-to-analog converter to generate the sample rates or control signals, e.g. a divisor or clock signal, based on the sample rates. This may be particularly advantageous when the flow meter comprises a microcontroller or system-on-chip comprising on-chip converters directly controllable by the processing unit and easily connectable with none or only little auxiliary circuitry.

In an embodiment said processing unit is arranged to control said timing signal provider.

In an embodiment said processing unit is implemented in a microcontroller or a system-on-chip of said transit-time ultrasonic flow meter, and wherein said microcontroller or system-on-chip comprises an analog-to-digital converter of said analog-to-digital converter arrangement and a digital-to-analog converter of said timing signal provider.

An example of a suitable microcontroller is for example the EFM32G890 from Silicon Laboratories, Inc.

In an embodiment said at least four ultrasound measurement signals are consecutive ultrasound measurement signals.

The present invention is particularly advantageous when applied to consecutive signals, i.e. a number of signals measured within a short time and related to the same or consecutive flow measurements.

In an embodiment said at least four ultrasound measurement signals comprises 4 to 20 ultrasound measurement signals.

As mentioned above, a typical two-transducer transit-time flow meter setup, in various embodiments preferably require a total of from 4 to 20 ultrasound measurements to determine a flow representation, i.e. determining the flow representation on the basis of 2 to 10 ultrasound measurements from each direction, i.e. each transducer. The number of measurement signals used may be the same for all flow measurements of a particular flow meter model determined from the hardware design and balanced between energy and time consumption and required or desired accuracy, or may be variable and adjusted in accordance with actual achieved accuracy or a scheme of regularly making a flow measurement with more ultrasound measurements for reference purposes. The ensuring different sample rates may be reset after the mentioned number of ultrasound measurements, i.e. after for example 4 to 20 ultrasound measurements, i.e. for example between flow measurements.

In an embodiment said sampled measurement frame comprises 10 to 10,000 samples.

Several separate, finite ultrasound signals are measured, as mentioned above, and for each measured ultrasound signal, a finite sampled measurement frame is established. The number of samples per frame equals the length of the ultrasound signal multiplied with the sample rate. Short signals measured at low sample rate cause short frames of possibly as little as for example 10 samples. Longer signals and/or high sample rate produces larger frames. Various preferred flow meter embodiments make use of undersampling primarily for energy consumption reasons as higher rates consumes much more energy, for cost reasons as higher rate converters including supporting circuitry are typically more expensive, or for availability reasons as only a narrow range of microcontrollers with fast converters e.g. working above 1 million samples per second (MSPS) exist. Undersampling typically causes relatively short sampled measurement frames, e.g. comprising 20-80 samples, for example 40 samples.

In an embodiment said processing unit is arranged to calculate at least one transit time difference on the basis of at least two of said at least four ultrasound measurement signals being received from one of said at least two transducers and on the basis of at least two other of said at least four ultrasound measurement signals being received from another one of said at least two transducers.

The at least four, for example 4-20, ultrasound measurement signals are used to calculate at least a transit time difference based on ultrasound measurements from both transducers, i.e. based on measurements in both directions. For example in a two-transducer setup, half of the signals are from the first transducer and related to one direction, and the other half of the signals are from the second transducer and related to the opposite direction. Note that the signals of one half does not need to be the first half. In other words, a measurement schedule of one embodiment may involve measuring all desired signals from the first transducer before proceeding to measure all desired signals from the other transducer, whereas another embodiment may have a measurement schedule alternating between the two transducers, with one or e.g. two or three, signals measured before turning to the other transducer, and yet other embodiments may have even more complex measurement schedules.

This also means, that the ensuring different sample rates is preferably performed for at least as long as sufficient signals has been sampled as described above. After that, the ensuring different sample rates may be reset, e.g. by starting over with the initial value of an incrementing sample rate generating algorithm.

The determining a transit time and/or a transit-time difference from one or more sampled ultrasound signals is well-known to the skilled person, see for example several techniques for this described in PCT patent application publication WO2011/134470A2, hereby incorporated by reference. Various embodiments may determine a transit-time difference from each pair of sampled measurement frames and then average or otherwise combine or merge at least two determined transit-time differences, whereas other various embodiments may average or otherwise combine or merge at least two sampled measurement frames and determine one transit-time difference therefrom.

In an embodiment said processing unit is arranged to calculate at least one of said transit-time based flow representation using said calculated at least one transit time difference.

The at least four, for example 4-20, ultrasound measurement signals are via determining a transit time difference as described above, used to calculate said transit-time based flow representation. This also means, that the ensuring different sample rates are preferably performed for at least as long as sufficient signals has been sampled to calculate a transit-time based flow representation. After that, the ensuring different sample rates may be reset, e.g. by starting over with the initial value of an incrementing sample rate generating algorithm.

The calculation of a transit-time based flow representation is well-known to the skilled person, see for example PCT patent application publication WO2011/134470A2, hereby incorporated by reference.

In an embodiment said processing unit is arranged to calculate at least one of said transit-time based flow representation from said at least four sampled measurement frames.

Various embodiments allow for calculating the flow representation in different ways, using for example various differences or sums related to the transit times, and/or absolute transit times.

In an embodiment the analog-to-digital converter arrangement comprises an input level offset provider arranged to provide an input level offset value to said analog input.

Thereby is further made possible to control offset of the ultrasound measurement signal, which may be used in various advantageous ways in various embodiments as described below.

In an embodiment the input level offset provider is arranged to provide an individual input level offset value for at least two of said ultrasound measurement signals, each individual input level offset value being different.

By applying a different individual input level offset value for the individual measurements of substantially identical ultrasound measurement signals during a series of measurement signals, different steps of the stair, typically with different linearity errors, of the analog-to-digital converter are employed to produce each sampled measurement frame, i.e. achieving a similar effect as obtained by the utilization of different sample rate for the individual signals. As a changing of input level offset value is a level offset and the changing of sample rate according to the invention is a time scaling, a combination of controlling both input level offset values and sample rates during the measurements makes it possible to sample the signal in more different ways without requiring a high resolution of frame offset changes. In other words, if several measurements, e.g. 10 measurements, are desired with different conversions, instead of applying 10 different frame offsets, various combinations of a few, e.g. 4, different input level offset values and a few, e.g. 3, different sample rates may provide similar results in terms of improved flow representations and volume measurements over time.

In an embodiment said establishment of a sampled measurement frame is based on the respective ultrasound measurement signal, said sample rate and said input level offset value.

In an embodiment said input level offset provider is arranged to ensure said individual input level offset value for at least two of said ultrasound measurement signals being different.

Different input level offset values should preferably be used to achieve the additional improvement of robustness to the analog-to-digital converter non-linearity, as different offsets are possible to facilitate the forcing the typically substantially identical ultrasound signals to be sampled at different steps of the converter transfer function stair as described above. It is therefore beneficial that the input level offset provider is arranged to ensure that different offsets are provided. This may for example be achieved by using an offset generating algorithm which calculates the next offset based on the previous offset, e.g. by incrementing, by taking the offsets from a predetermined sequence of different offsets, by determining a new offset in any way and then comparing it with the previous offset and repeat if not different, etc.

In order to achieve the technical effect in general, it may in various embodiments be sufficient that there is a certain high probability for the provided offset being different from the previous offset, whereby making it acceptable to generate the offsets by randomising or pseudo-randomising processes, or apply an algorithm which, like randomising processes, mostly but not guaranteed produce different offsets. The practical suitability of such algorithms, including randomising and pseudo-randomising processes, depends on the risk of providing non-different offsets too often, which highly depends on the resolution and range of different offsets available, i.e. in terms of voltage sensitivity and available non-used dynamic range of the analog-to-digital converter, and the offset generator's resolution.

It is noted, that the technical effect is achieved by using different input level offset values for measurements that are going to be compared, averaged, merged or otherwise processed together to end up with a common result, for example a transit time difference determined on the basis of, e.g., 4 or 6 ultrasound measurement signals from each transducer and sampled within a short time of each other, e.g. within between 1 ns and 1 s, for example 1 ms. Hence, for the next flow measurement for example taking place between 0.1 second and 1 minute later, the input level offset provider may in an embodiment reuse input level offset values previously provided for earlier flow measurements or generate randomised offsets, etc., only ensuring difference with other offsets used for the same flow measurement, not necessarily with offsets used for earlier flow measurements.

In an embodiment said input level offset provider is arranged to provide a first sequence of different input level offset values for use with a sequence of ultrasound measurement signals from a first ultrasonic transducer of said at least two ultrasonic transducers and to provide a sequence of different input level offset values for use with a sequence of ultrasound measurement signals from a second ultrasonic transducer of said at least two ultrasonic transducers.

In a preferred embodiment the ensuring different input level offset values may preferably be related to, and considered in the light of, a selected sequence of measurements among the different transducers. As an example, a two-transducer flow meter needing e.g. 6 measurements from each transducer, i.e. in each direction, to determine a transit time difference with a predetermined acceptable accuracy, may in one embodiment be arranged to make 6 measurements from the first transducer with different input level offset values and then make 6 measurements from the second transducer with the same different or other different input level offset values, and may in another embodiment be arranged in an alternating fashion to make one measurement from each transducer with a first input level offset value, then change input level offset value and make a second measurement from each transducer, etc., until 6 pairs of measurements have been made with different input level offset values for each pair, and further embodiments may also be contemplated. In other words, the input level offset provider is according to an embodiment arranged to ensure that measurements from the same transducer are made with different offsets, whereas offsets used for different transducers may be shared or different. This may further be coordinated or not coordinated with the variation of sample rates according to the invention in several different ways to facilitate numerous different conversions made from highly similar signals to improve the accuracy of the conversions in average.

In an embodiment said individual input level offset values are different by less than 15%, preferably less than 10%, more preferably around 5%, 3%, or 1%, of a full range of said analog-to-digital converter.

Preferably, the input level offset values are small, only a few percent of ADC full range, to facilitate keeping the complete signal within the dynamic range of the analog-to-digital converter. To force the conversion to go up or down one step of the transfer function stair, in theory the offset does not have to be larger than the input voltage corresponding to one LSB output change of the analog-to-digital converter. For a 10-bit analog-to-digital converter having 1024 steps, one step or LSB represents ideally about 0.1% of full range. In a preferred embodiment the change is in practice set a little higher, e.g. about 1%, 3% or 5%, to ensure that a completely different step is utilised even in case of severe non-linearities.

In an embodiment said analog input of said analog-to-digital converter comprises a differential input with two connector points.

By implementing the analog-to-digital converter with differential analog input is advantageously achieved a simple option of providing the ultrasound measurement signal and the input level offset value to two different connector points, thereby avoiding a need to providing a summing or subtraction point to merge the two inputs.

In an embodiment said ultrasound measurement signals and said input level offset value are coupled to different of said two connector points.

In an embodiment said input level offset provider comprises a digital-to-analog converter.

For simple and convenient establishment of the input level offset values various preferred embodiments utilise a digital-to-analog converter to generate the offset values. This may be particularly advantageous when the flow meter comprises a microcontroller or system-on-chip comprising on-chip converters directly controllable by the processing unit and easily connectable with none or only little auxiliary circuitry.

In an embodiment said processing unit is arranged to control said input level offset provider.

It is highly advantageous to let the processing unit control both the input level offset provider and the timing signal provider to achieve a coordination and thereby possible synergy of the various possible linearity improvement techniques described above.

In an embodiment the input level offset provider is arranged to provide a DC correction value to said analog input to offset a DC level of the ultrasound measurement signal to within 20%, preferably within 10%, for example within 5%, of a median of a dynamic range of the analog-to-digital converter.

The input level offset provider may advantageously be employed to add a DC correction value to balance the ultrasound measurement signal substantially in the middle of the dynamic range of the analog-to-digital converter, for example within 20% of the median of the range. Thereby is reduced the risk of clipping and/or facilitated an adaptive dynamic range feature of the analog-to-digital converter, making it possible to match the dynamic range to be for example from 105% to 125% of the signal amplitude, without risking clipping by an unexpected DC level.

This feature of the input level offset provider may in an embodiment be combined with the above-described feature of using the input level offset provider to ensure a changing input level offset value for at least two of the at least four ultrasound measurement signals.

In an embodiment the input level offset provider is arranged to add said DC correction value to said input level offset value.

In an embodiment the analog-to-digital converter arrangement comprises a reference voltage provider arranged to provide a reference voltage to a reference voltage input of said analog-to-digital converter.

Thereby is further made possible to control the reference voltage, i.e. the dynamic range, of the analog-to-digital converter, which may be used in various advantageous ways in various embodiments as described above.

Further embodiments comprise a combination of the providing of a sample rate as described above with the providing of a reference voltage as described in more detail here below, possibly also in combination with the providing of an input level offset value as described above.

In an embodiment the reference voltage provider is arranged to provide an individual reference voltage for at least two of said ultrasound measurement signals, each individual reference voltage being different.

By providing different reference voltages for the individual measurements of substantially identical ultrasound measurement signals, the converter may be forced to use different steps of the transfer function stair for the individual signals, i.e. achieving a similar effect as obtained by the utilization of different sample rates for the individual signals. As a changing of voltage reference leading to a larger or smaller dynamic range does not necessarily offset the signal but instead in practice changes the resolution available for the peak-to-peak amplitude of the signal, a combination of controlling both sample rate and/or input level offset values and reference voltages during the measurements makes it possible to sample the signal in more different ways without requiring large offsets.

In an embodiment said establishment of a sampled measurement frame is based on the respective ultrasound measurement signal, said sample rate, said reference voltage, and preferably an input level offset value.

In an embodiment said reference voltage provider is arranged to ensure said individual reference voltage for at least two of said ultrasound measurement signals being different.

According to the invention, different reference voltages are preferably used to achieve the additional improvement of robustness to the analog-to-digital converter non-linearity, as different reference voltages are possible to facilitate the forcing the typically substantially identical ultrasound signals to be sampled at different steps of the converter transfer function stair as described above. It is therefore beneficial that the reference voltage provider is arranged to ensure that different reference voltages are provided. This may for example be achieved by using a reference voltage generating algorithm which calculates the next reference voltage based on the previous reference voltage, e.g. by incrementing, by taking the reference voltages from a predetermined sequence of different reference voltages, by determining a new reference voltage in any way and then comparing it with the previous reference voltage and repeat if not different, etc.

According to the invention in order to achieve the technical effect in general, it may in various embodiments be sufficient that there is a certain high probability for the provided reference voltage being different from the previous reference voltage, whereby making it acceptable to generate the reference voltages by randomising or pseudo-randomising processes, or apply an algorithm which, like randomising processes, mostly but not guaranteed produce different reference voltages. The practical suitability of such algorithms, including randomising and pseudo-randomising processes, depends on the risk of providing non-different reference voltages too often, which highly depends on the resolution and range of different reference voltages available, i.e. in terms of voltage sensitivity and available non-used dynamic range of the analog-to-digital converter, and the reference voltage generator's resolution.

It is noted, that the technical effect is achieved by using different reference voltages for measurements that are going to be compared, averaged, merged or otherwise processed together to end up with a common result, for example a transit time difference determined on the basis of, e.g., 4 or 6 ultrasound measurement signals from each transducer and sampled within a short time of each other, e.g. within between 1 ns and 1 s, for example 1 ms. Hence, for the next flow measurement for example taking place between 0.1 second and 1 minute later, the reference voltage provider may in an embodiment reuse reference voltages previously provided for earlier flow measurements or generate randomised reference voltages, etc., only ensuring difference with other reference voltages used for the same flow measurement, not necessarily with reference voltages used for earlier flow measurements.

In an embodiment said reference voltage provider is arranged to provide a first sequence of different reference voltages for use with a sequence of ultrasound measurement signals from a first ultrasonic transducer of said at least two ultrasonic transducers and to provide a sequence of different reference voltages for use with a sequence of ultrasound measurement signals from a second ultrasonic transducer of said at least two ultrasonic transducers.

In a preferred embodiment the ensuring different reference voltages may preferably be related to, and considered in the light of, a selected sequence of measurements among the different transducers. As an example, a two-transducer flow meter needing e.g. 6 measurements from each transducer, i.e. in each direction, to determine a transit time difference with a predetermined acceptable accuracy, may in one embodiment be arranged to make 6 measurements from the first transducer with different reference voltages and then make 6 measurements from the second transducer with the same different or other different reference voltages, and may in another embodiment be arranged in an alternating fashion to make one measurement from each transducer with a first reference voltage, then change reference voltage and make a second measurement from each transducer, etc., until 6 pairs of measurements have been made with different reference voltages for each pair, and further embodiments may also be contemplated. In other words, the reference voltage provider is according to an embodiment arranged to ensure that measurements from the same transducer are made with different reference voltages, whereas reference voltages used for different transducers may be shared or different. This may further be coordinated or not coordinated with the variation of sample rates according to the invention in several different ways to facilitate numerous different conversions made from highly similar signals to improve the accuracy of the conversions in average.

In an embodiment said individual reference voltages are different by less than 15%, preferably less than 10%, more preferably around 5%, 3%, or 1% or 0.5%, of a reference voltage of said analog-to-digital converter.

Preferably, the changes of reference voltages are small, only a few percent or even less of the ADC full range, to facilitate keeping the complete signal within a significant part of the dynamic range of the analog-to-digital converter.

In an embodiment said reference voltage provider comprises a digital-to-analog converter.

For simple and convenient establishment of the reference voltages various preferred embodiments utilise a digital-to-analog converter to generate the reference voltages. This may be particularly advantageous when the flow meter comprises a microcontroller or system-on-chip comprising on-chip converters directly controllable by the processing unit and easily connectable with none or only little auxiliary circuitry. In an embodiment with a differential voltage reference, two digital-to-analog converters are preferably applied to produce the composite reference voltage.

In an embodiment said processing unit is arranged to control said reference voltage provider.

It is highly advantageous to let the processing unit control both the timing signal provider and the reference voltage provider to achieve a coordination and thereby possible synergy of the various possible accuracy improvement techniques described above.

In an embodiment the reference voltage provider is arranged to provide a dynamic range correction value to said reference voltage input to accommodate an amplitude of the ultrasound measurement signal within 80%, preferably within 90%, for example within 95%, of a dynamic range of the analog-to-digital converter.

The reference voltage provider may advantageously be employed to add a dynamic range correction value to match the dynamic range substantially to the ultrasound measurement signal, preferably with a margin for safety and to allow the input level offset value changes. The dynamic range correction value may for example be determined with an aim of the ultrasound measurement signal amplitude being about 80%-90% of the dynamic range. Thereby is reduced the risk of clipping and/or facilitated a DC correction feature of the analog-to-digital converter, making it possible to match the dynamic range to be for example from 105% to 125% of the signal amplitude, with reduced risk of clipping by an unexpected DC level.

This feature of the reference voltage provider may in an embodiment be combined with the above-described feature of using the reference voltage provider to ensure a changing reference voltage for at least two of the at least four ultrasound measurement signals.

In an embodiment the reference voltage provider is arranged to add said dynamic range correction value to said reference voltage.

In an embodiment said timing signal provider is arranged to provide said timing signal further comprising frame offset to said sample timing input of said analog-to-digital converter.

Thereby is further made possible to control the timing of starting sampling the individual frame, i.e. a time offset, of the analog-to-digital converter, which may be used in various advantageous ways in various embodiments as described below. The timing signal provider may for example be arranged to provide said timing signal comprising both a frame offset and a sample rate, and the sample timing input may comprise an input for frame offset and an input for sample rate.

The frame offset may for example indicate the sample start time relative to the ultrasound transmission time, relative to a reference start time, as an absolute time, etc. The frame offset may be positive or negative with relation to a reference or nominal start time. The frame length may be adjusted correspondingly to ensure that the last portion of the signal is sampled even with an earlier frame start time, or the frame length may be selected sufficiently long to accommodate the signal regardless of any reasonable frame offset. In a preferred embodiment, the frame offset is changed a fraction of a duration of a sample at the respective sample rate for each measurement. In preferred embodiments, the frame offsets used for the different measurements may range from −0.5 to +0.5 times a sample duration, or from +0.05 to +0.95 times a sample duration. In various embodiments the frame offset will advantageously be synchronised with a system clock in order to facilitate selecting a certain fraction of the sample rate as frame start. Such embodiments preferably comprise a system clock being at least, e.g., 4-20 times faster than the sample rate, thereby facilitating, in that example, 4-20 different frame offsets to vary between in accordance with the invention. The largest improvements are achieved in systems with relatively low sample rates compared to the signal's frequency content, as the signal should preferably change considerably during the frame offset to reach a different converter step by the application of the frame offset. The timing signal comprising the frame offset may be implemented in accordance with the particular analog-to-digital converter used. For analog-to-digital converters having a start signal, e.g. a start-bit, a start-pin, a reset-pin, a frame input, or always starting whenever not holding, etc, the timing signal comprising the frame offset may be applied to such control bit or pin accordingly as a start signal or by controlling the start signal. For embodiments without such start signal, the frame offset may be applied to the analog-to-digital converter clock signal, in order to offset the clock signal slightly, e.g. by pausing.

Hence, the signal timing input may comprise several inputs, e.g. a sample clock input or a divisor input and e.g. a sample start input, etc.

Further embodiments comprise a combination of the providing of a sample rate as described above with the providing of a frame offset as described in more detail here below, possibly also in combination with the providing of an input level offset value and/or the providing of a reference voltage as described above.

In an embodiment the timing signal provider is arranged to provide an individual frame offset for at least two of said ultrasound measurement signals, each individual frame offset being different.

By providing different frame offsets for the individual measurements of substantially identical ultrasound measurement signals, the converter may be forced to use different steps of the transfer function stair for the individual signals, i.e. achieving a similar effect as obtained by the utilization of different sample rates for the individual signals. As a changing of sample rate according to the invention is a time scaling and the changing of frame offsets is a time offset, a combination of controlling both sample rates and frame offsets during the measurements makes it possible to sample the signal in more different ways without requiring large reference voltage changes.

In an embodiment said establishment of a sampled measurement frame is based on the respective ultrasound measurement signal, said sample rate and said frame offset, and preferably one or more of said input level offset value and said reference voltage.

In an embodiment said timing signal provider is arranged to ensure said individual frame offset for at least two of said ultrasound measurement signals being different.

Different frame offsets could preferably be used to achieve the improvement of robustness to the analog-to-digital converter non-linearity, as different frame offsets are possible to force the typically substantially identical ultrasound signals to be sampled at different steps of the converter transfer function stair as described above. It is therefore beneficial that the timing signal provider is arranged to ensure that different frame offsets are provided. This may for example be achieved by using a frame offset generating algorithm which calculates the next frame offset based on the previous frame offset, e.g. by incrementing, by taking the frame offsets from a predetermined sequence of different frame offsets, by determining a new frame offset in any way and then comparing it with the previous frame offset and repeat if not different, etc.

In order to achieve the technical effect in general, it may in various embodiments be sufficient that there is a certain high probability for the provided frame offset being different from the previous frame offset, whereby making it acceptable to generate the frame offsets by randomising or pseudo-randomising processes, or apply an algorithm which, like randomising processes, mostly but not guaranteed produce different offsets. The practical suitability of such algorithms, including randomising and pseudo-randomising processes, depends on the risk of providing non-different frame offsets too often, which highly depends on the time resolution and range of different offsets available, i.e. in terms of sub-sample timing possibilities, i.e. fractions of a sample duration as described above.

It is noted, that the technical effect is achieved by using different frame offsets for measurements that are going to be compared, averaged, merged or otherwise processed together to end up with a common result, for example a transit time difference determined on the basis of, e.g., 4 or 6 ultrasound measurement signals from each transducer and sampled within a short time of each other, e.g. within between 1 ns and 1 s, for example 1 ms. Hence, for the next flow measurement for example taking place between 0.1 second and 1 minute later, the timing signal provider may in an embodiment reuse frame offsets previously provided for earlier flow measurements or generate randomised frame offsets, etc., only ensuring difference with other frame offsets used for the same flow measurement, not necessarily with frame offsets used for earlier flow measurements.

In an embodiment said timing signal provider is arranged to provide a first sequence of different frame offsets for use with a sequence of ultrasound measurement signals from a first ultrasonic transducer of said at least two ultrasonic transducers and to provide a sequence of different frame offsets for use with a sequence of ultrasound measurement signals from a second ultrasonic transducer of said at least two ultrasonic transducers.

In a preferred embodiment the ensuring different frame offsets may preferably be related to, and considered in the light of, a selected sequence of measurements among the different transducers. As an example, a two-transducer flow meter needing e.g. 6 measurements from each transducer, i.e. in each direction, to determine a transit time difference with a predetermined acceptable accuracy, may in one embodiment be arranged to make 6 measurements from the first transducer with different frame offsets and then make 6 measurements from the second transducer with the same different or other different frame offsets, and may in another embodiment be arranged in an alternating fashion to make one measurement from each transducer with a first frame offset, then change frame offset and make a second measurement from each transducer, etc., until 6 pairs of measurements have been made with different frame offsets for each pair, and further embodiments may also be contemplated. In other words, the timing signal provider is according to an embodiment arranged to ensure that measurements from the same transducer are made with different frame offsets, whereas frame offsets used for different transducers may be shared or different. This may further be coordinated or not coordinated with the variation of sample rate according to the invention in several different ways to facilitate numerous different conversions made from highly similar signals to improve the accuracy of the conversions in general.

In an embodiment said individual frame offsets are different by less than a duration of a single sample, e.g. no more than 50%, preferably no more than 25%, more preferably no more than 15%, e.g. 12%, 8%, or 4%, of a duration of a single sample.

Preferably, the frame offsets are small, less than half a sample duration, as described above.

In an embodiment said sample timing input of said analog-to-digital converter comprises a control input for commanding the analog-to-digital converter to start sampling a sampled measurement frame; and wherein a control signal for said control input is based on said frame offset.

In an advantageous embodiment, the transit-time ultrasonic flow meter is arranged with a reference frame start time defined in relation to the ultrasound transmission start time and being a little shorter than the expected transit-time. The frame start control signal for the analog-to-digital converter may for example be based on such reference start time with the addition, or subtraction, of the frame offset determined for that respective measurement.

In an embodiment said timing signal provider comprises a digital-to-analog converter.

For simple and convenient establishment of the frame offsets various preferred embodiments utilise a digital-to-analog converter to generate the frame offsets or control signals, e.g. a start signal, based on the frame offsets. This may be particularly advantageous when the flow meter comprises a microcontroller or system-on-chip comprising on-chip converters directly controllable by the processing unit and easily connectable with none or only little auxiliary circuitry.

In an embodiment said processing unit is arranged to control said timing signal provider with respect to said frame offset.

It is highly advantageous to let the processing unit control the timing signal provider with respect to both sample rate and frame offset to achieve a coordination and thereby possible synergy of the various possible accuracy improvement techniques described above.

In an embodiment the timing signal provider is arranged to add a reference frame start time to said frame offset to offset start of sampling by a little less than an expected transit time.

In an aspect the invention relates to a method for calculating a transit-time based flow representation in a transit-time ultrasonic flow meter comprising at least two ultrasonic transducers, an analog-to-digital converter arrangement for sampling ultrasound measurement signals from the ultrasonic transducers and a processing unit for said calculating, the method comprising the steps of:

providing by a timing signal provider a timing signal to a sample timing input of an analog-to-digital converter of said analog-to-digital converter arrangement;

establishing an ultrasound measurement signal by one of said at least two ultrasonic transducers;

receiving said ultrasound measurement signal at an analog input of said analog-to-digital converter;

establishing by the analog-to-digital converter a sampled measurement frame with at least 10 samples on the basis of said ultrasound measurement signal and the timing signal;

providing said sampled measurement frame at a sample output of said analog-to-digital converter coupled to said processing unit;

repeating the above steps with a total of at least four ultrasound measurement signals, wherein said providing said timing signal comprises providing a different timing signal for at least two of said at least four ultrasound measurement signals, said different timing signal being different with respect to a sample rate; and calculating at least one transit-time based flow representation by the processing unit on the basis of a sampled measurement frame from each of said repetitions.

THE DRAWINGS

Figure 2:
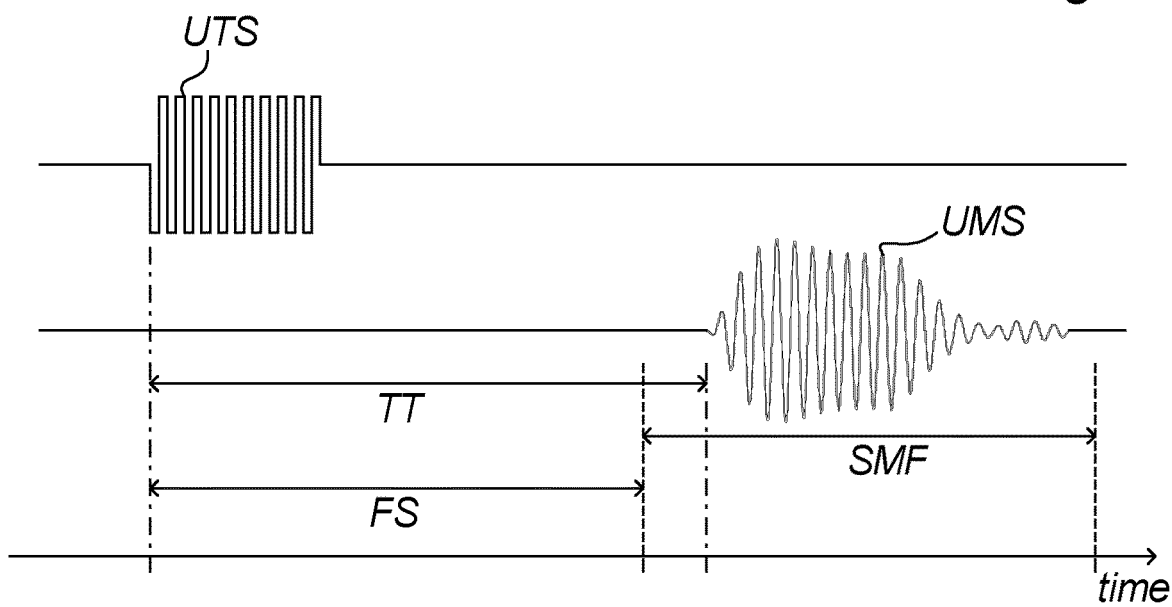
Figure 3:
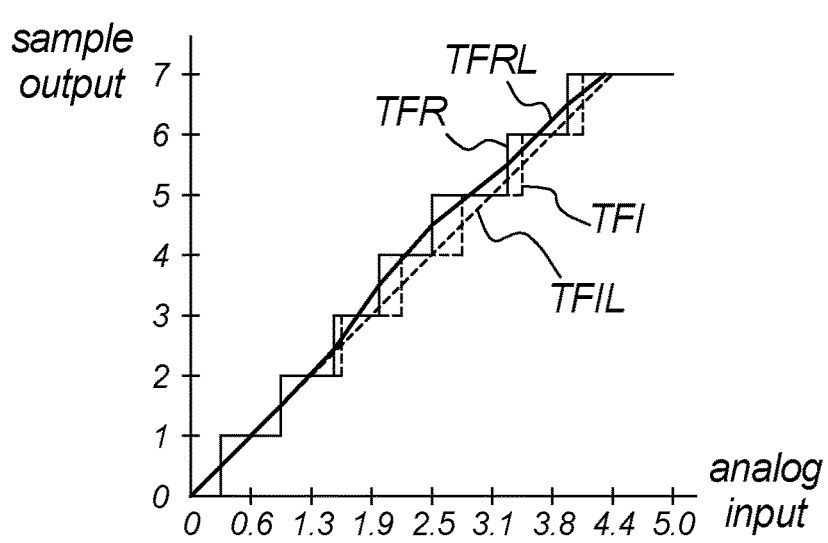
Figure 4:
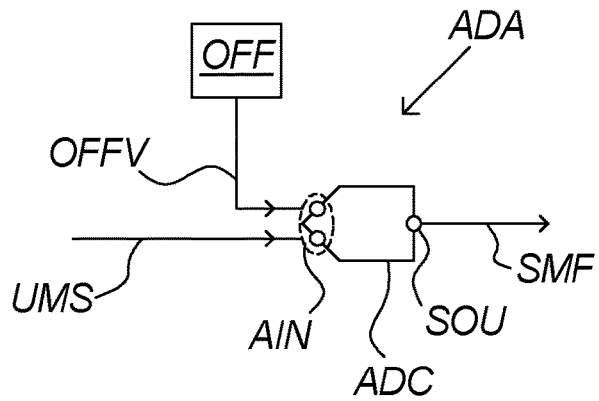
Figure 5:
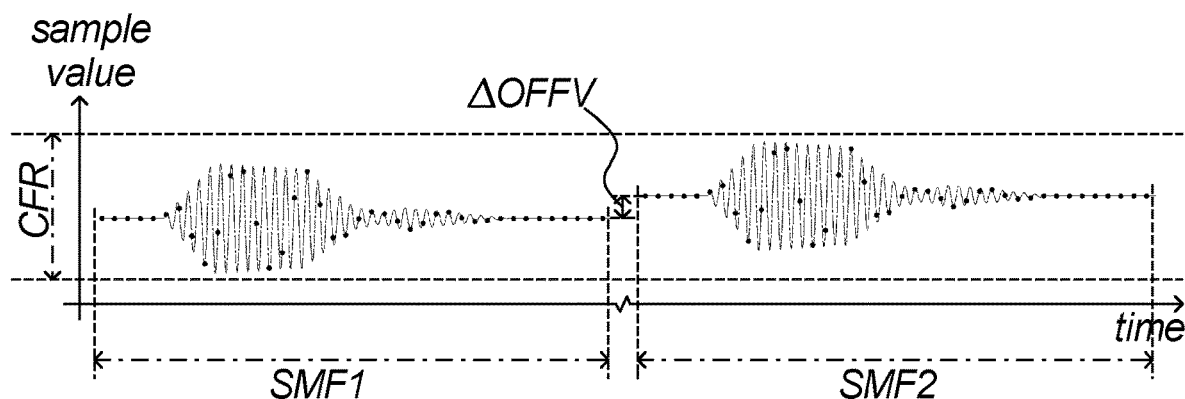
Figure 6:
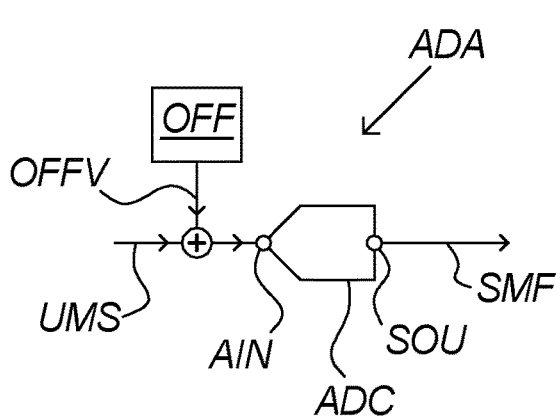
Figure 7:
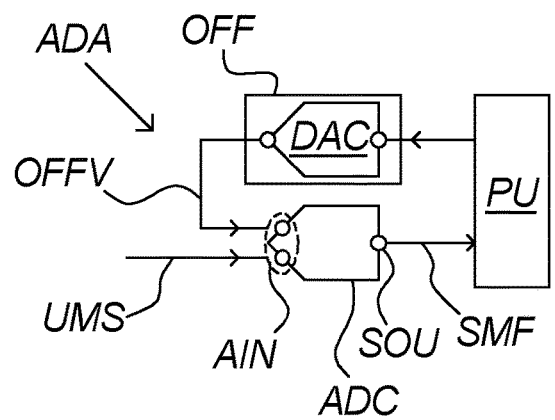
Figure 8:
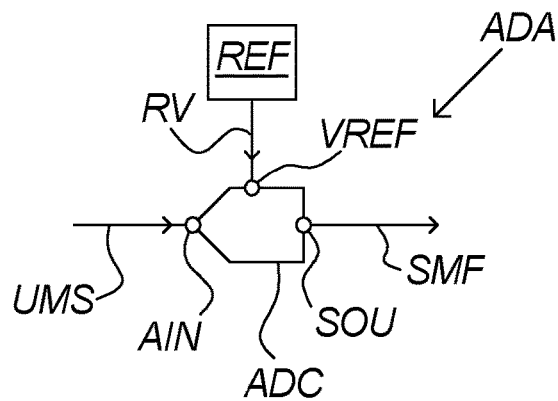
Figure 9:
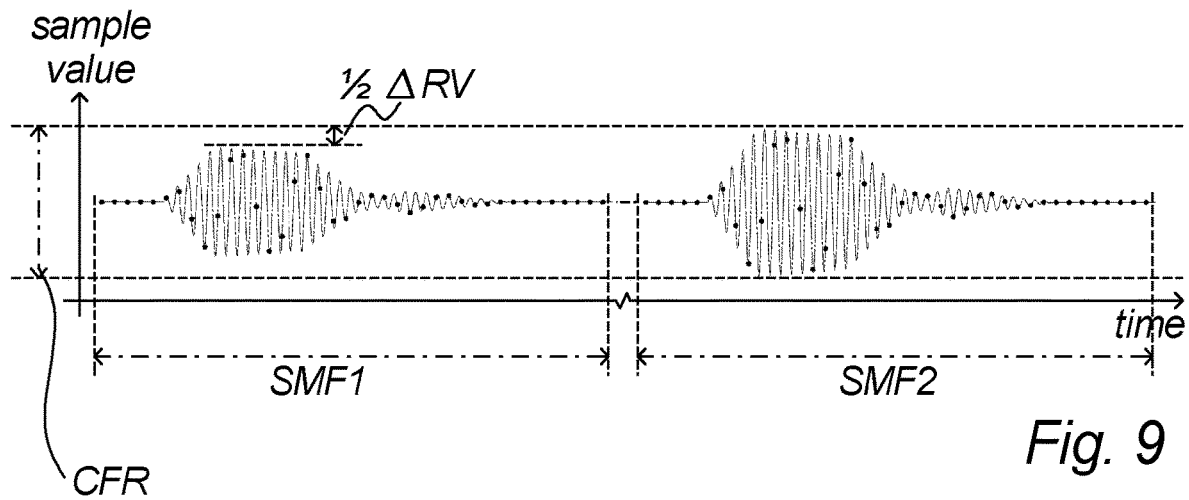
Figure 10:
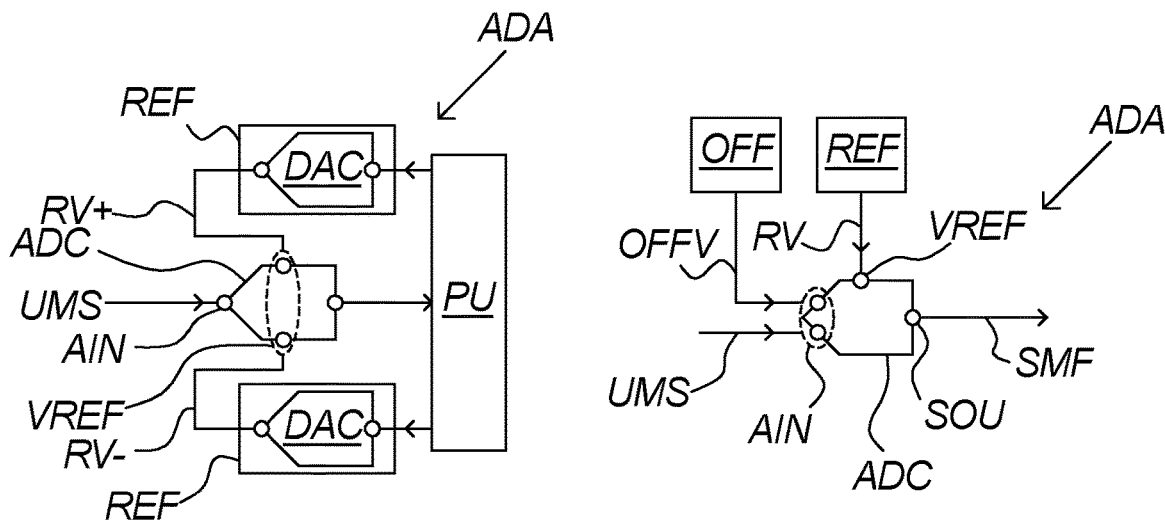
Figure 11:
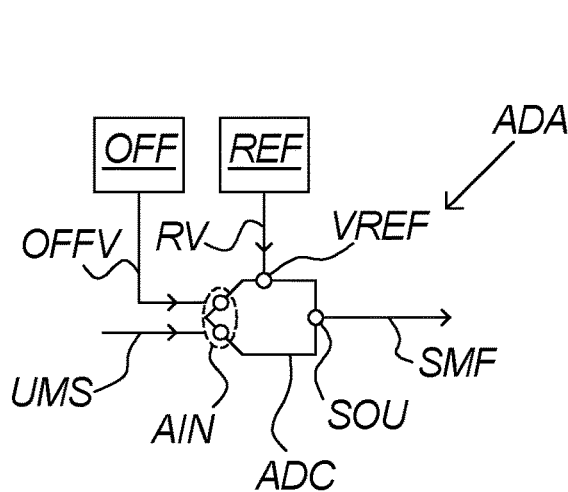
Figure 26:
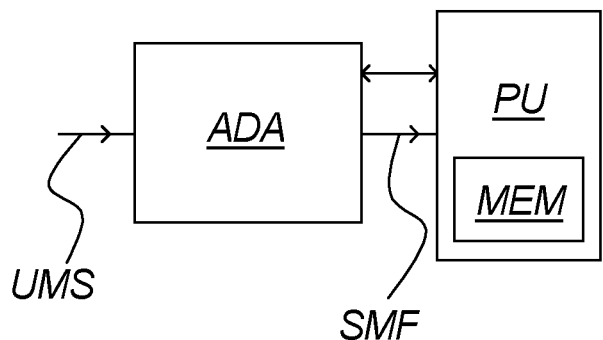
Figure 27:
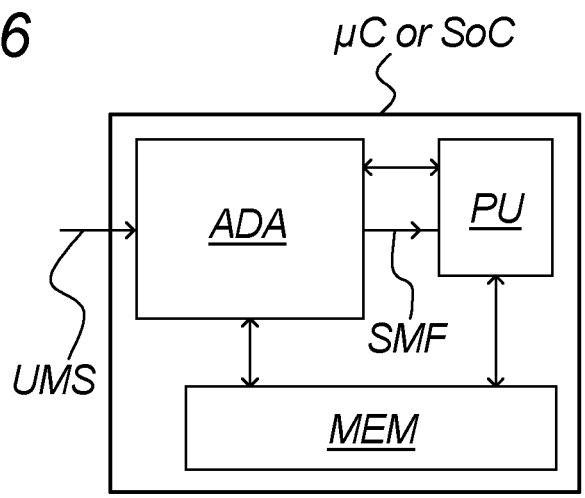
Figure 28:
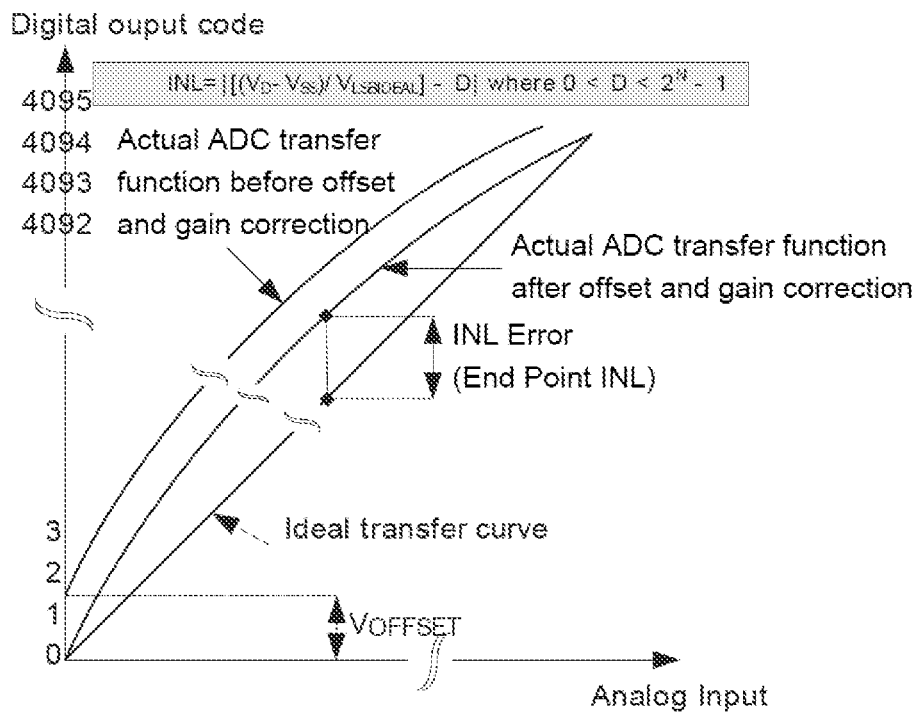
Figure 29:
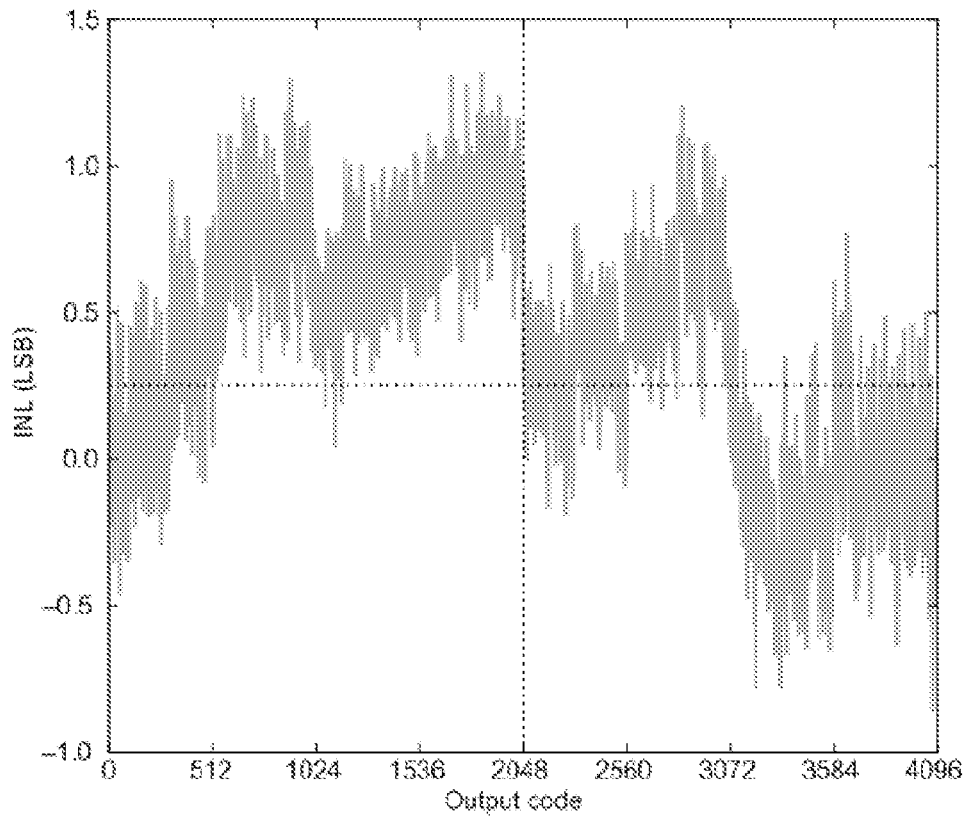

Various embodiments of the invention will in the following be described with reference to the drawings where FIG. 1 illustrates a block diagram of a transit-time based ultrasonic flow meter, FIG. 2 illustrates some of the terms used in the present description, FIG. 3 illustrates ideal and real stair transfer functions of analog-to-digital converters, FIG. 4 illustrates providing changing input level offset values according to an embodiment of the invention, FIG. 5 illustrates a difference of sampled measurement signals provided with different input level offset values according to the invention, FIGS. 6-7 illustrate alternative embodiments of the invention for providing changing input level offset values, FIG. 8 illustrates providing changing reference voltages according to an embodiment of the invention, FIG. 9 illustrates a difference of sampled measurement signals provided with different reference voltages according to the invention, FIGS. 10-11 illustrate alternative embodiments of the invention for providing changing reference voltages, FIG. 12 illustrates providing changing frame offsets according to an embodiment of the invention, FIG. 13 illustrates a difference of sampled measurement signals provided with different frame offsets according to the invention, FIGS. 14-17 illustrate alternative embodiments of the invention for providing changing frame offsets, FIG. 18 illustrates providing changing sample rates according to an embodiment of the invention, FIG. 19 illustrates a difference of sampled measurement signals provided with different sample rates according to the invention, FIGS. 20-23 illustrate alternative embodiments of the invention for providing changing sample rates, FIGS. 24-27 illustrate applying memory to various embodiments of the invention, and FIGS. 28-29 are reproductions from the datasheet of the EFM32G890 microcontroller.

DETAILED DESCRIPTION

FIG. 1 illustrates a block diagram of a transit-time based ultrasonic flow meter FM. It comprises two ultrasonic transducers TR which are arranged to emit ultrasound signals through a fluid of which the flow is to be determined, when provided with an ultrasound transmission signal UTS, and to establish an ultrasound measurement signal UMS when receiving ultrasound signals through the fluid. A transmission arrangement (not shown) is configured to provide the ultrasonic transducers with ultrasound transmission signals one at a time through a routing arrangement RT, and the routing arrangement is further arranged to forward a resulting ultrasound measurement signal from the other transducer to an analog-to-digital converter arrangement ADA. In other words, the routing arrangement RT is configured to control which transducer is sending and which transducer is receiving at any given time, and to route the ultrasound transmission signal UTS to the sending transducer, and route the ultrasound measurement signal UMS from the receiving transducer, accordingly.

By measuring the transit time, also called time-of-flight, of an ultrasound signal transmitted generally along the fluid flow and another generally against the fluid flow, a representation of the flow can be determined from the difference of the measured transit times in combination with various further parameters as described above and as well-known by the skilled person. In order to process the ultrasound measurement signals and determine transit-times and transit-time differences from them digitally, the ultrasound measurement signals are sampled by the analog-to-digital converter arrangement. The resulting sampled measurement frames SMF are forwarded to a processing unit PU, which is arranged to determine the flow representation FR therefrom.

FIG. 2 illustrates some of the terms used in the present description. The propagation of an example of an ultrasound transmission signal UTS is illustrated along a time axis. The signal frequency of the ultrasound transmission signal may for example in preferred embodiments be around 1 MHz, e.g. between 800 kHz and 1.1 MHz, but the present invention may apply with advantage to signals of any ultrasound frequencies. The illustrated signal is an unmodulated pulsed signal, but also modulated signals are within the scope of the invention.

After the duration of the transit time TT the first activity shows up at the receiving transducer in form of the ultrasound measurement signal. The transfer function of the meter housing, flow tube, fluid, possible reflectors, etc., has shaped the transmitted clean pulse signal to, for example, a signal similar to the illustrated ultrasound measurement signal UMS. It is noted, that other transfer functions will make the measured ultrasound signal look differently, but the present invention applies equally well for most received ultrasound signals.

As the transit time TT is unknown, the analog-to-digital convert arrangement ADA should preferably start sampling a short while before the expected arrival of the signal, and preferably continue sample a little longer than the expected signal duration. A delay for frame start FS is defined, e.g. predetermined or decided at runtime, which indicates when to start sampling. The frame start may be defined for example relative to the beginning, as illustrated, or end of the transmission signal UTS, or to another reference time. The transmission arrangement may indicate when the appropriate time starts, and a counter or timer may ensure that sampling starts after the duration of the frame start FS delay. The complete sampling of one ultrasound measurement signal UTS is referred to as a sampled measurement frame SMF, which may for example be analysed to identify the first activity and thereby determine the transit time TT.

When an appropriate time has passed to allow for the sampling, the transmission arrangement may cause another ultrasound transmission signal to be transmitted, for example from the other transducer, i.e. in the opposite direction, which is then received by the first transducer and sampled to provide a sampled measurement signal from that transducer. From the two sampled measurement signals it may be possible to derive a flow representation FR. The transit-time difference Δt may be derived by determining the two transit-times and finding their difference, or by various well-known methods in time or frequency domain to derive the transit-time difference by comparing two or more sampled measurement frames.

However, as illustrated in FIG. 3, analog-to-digital conversion is subject to non-linearity errors. FIG. 3 exemplifies this by illustrating the ideal transfer function TFI and ideal transfer function line TFIL of a 3-bit converter with an analog input range, i.e. converter full range CFR, of 0-5, e.g. 0-5 V. However, as shown, the real transfer function TFR and TFRL may deviate more or less from the ideal transfer function, causing certain steps of the stair function to be used at too low or too high input values. The degree of linearity error of a particular analog-to-digital converter ADC depends on the type and technology of the ADC, and on the quality thereof. Hence, cheap ADCs, e.g. as built-in components of other system, may be expected to have large linearity errors.

Because the ultrasound transmission signal UTS in ultrasound flow meters is typically identical for all measurements, the resulting ultrasound measurement signals UMS are also typically extremely similar, with only very small changes of the flow tube and fluid transfer function over considerably long time. This means that the analog-to-digital converter arrangement will convert almost identical signals for each measurement, which in turn means, that the same stairs of the converter transfer function will be used for all measurements, thereby applying the same linearity error to all measurements. This is not desirable, as it for example may cause the linearity error to accumulate in the flow rate output of the flow meter over time.

An example of a microcontroller which on several other parameters than its analog-to-digital converter seems very suitable for ultrasonic flow meters, is the EFM32G890 from Silicon Laboratories, Inc. It features a 12-bit analog-to-digital converter, but typical for this segment of feature-packed cost-effective microcontrollers, the extent of non-linearity errors of the analog-to-digital converter may for some flow meter applications be unacceptable. FIGS. 28 and 29 are reproductions from the datasheet of the above-mentioned specific microcontroller. FIG. 28 is a reproduction of the datasheet's FIG. 3.27 explaining how they define integrated non-linearity (INL), and FIG. 29 is a reproduction of a part of the datasheet's FIG. 3.30 illustrating the INL at different converter steps, i.e. output codes. This microcontroller is not worse than several other microcontrollers, but FIG. 29 quite well illustrates that the non-linearity errors of the ADC of a general purpose microcontroller may be significant, here ranging from about −0.8 LSB to +1.3 LSB, but even worse for the ultrasonic flow meter applications, extremely fluctuating over the converter steps, making it quite possible that even neighboring steps are infected with extremely different errors.

Different Input Level Offsets

FIG. 4 illustrates an embodiment of the invention reducing the impact of the linearity errors by applying different input level offset values OFFV to the ultrasound measurement signal UMS at the converter analog input AIN. The analog-to-digital converter arrangement ADA comprises an analog-to-digital converter, which may be of any ADC technology, e.g. a SAR ADC, and which has an analog input AIN for receiving a voltage to be converted, and a sample output SOU for outputting a sample representing the converted voltage. When the analog-to-digital converter ADC is implemented with reference voltage, clock signal, etc. in accordance with application standards of the particular type of ADC, the analog-to-digital converter may be used to convert a received ultrasound measurement signal UMS to a sampled measurement frame SMF. For simplicity, the standard auxiliary circuitry to employ an analog-to-digital converter is not illustrated on the drawings, but is well-known to the skilled person.

The embodiment of FIG. 4 further comprises an input level offset provider OFF which is arranged to provide an input level offset value OFFV to the analog input AIN. The input level offset value OFFV is added to or subtracted from the ultrasound measurement signal UMS, thereby changing its DC level.

In the embodiment of FIG. 4 the ADC is illustrated as a differential input ADC, where the analog input AIN comprises two connectors for receiving the ultrasound measurement signal UMS and the input level offset value OFFV, respectively. The addition or subtraction of the two input signals are thereby performed automatically within the ADC, and the difference is converted and provided as the sampled measurement frame SMF.

FIG. 5 illustrates the working principle of the embodiment of FIG. 4. Along a time axis is shown a first sampled measurement frame SMF1 and a second sampled measurement frame SMF2. As indicated on the time axis, a delay is imagined between the two measurement frames, but not shown for practical reasons. The vertical axis represents both the analog signal amplitude and the sampled measurement signal sample values. The samples of the two sampled measurement frames are shown as small round dots in the diagram superimposed on an example of an ultrasound measurement signal. Lower and upper horizontal, dashed lines indicate the converter full range CFR. As seen, the first ultrasound measurement signal is placed a bit low within the converter full range, thereby leaving additional, unused headroom within the converter full range above the signal.

The second ultrasound measurement signal is, on the contrary, placed a little higher within the converter full range. This is achieved by applying different input level offset values OFFV from the input level offset provider OFF to the conversion of the ultrasound measurement signals. The difference of input level offset values applied is illustrated as the span ΔOFFV in FIG. 5. Thereby all samples of the second sampled measurement frame SMF2 are converted at a different level, i.e. at a different converter step cf. FIG. 3, than the corresponding samples of the first sampled measurement signal SMF1. Thereby the second sampled measurement frame SMF2 has generally been subject to a different linearity error than the first sampled measurement frame SMF1, even though the ultrasound measurement signals are practically identical.

For illustration purposes the illustrated difference of input level offset value ΔOFFV between the two frames is about 15% of converter full range CFR, but in a preferred embodiment the offset difference between two sampled measurement frames is much smaller, for example changing only 1%, 2% or 5% of converter full range for each new frame. The larger the change, the bigger the change of conversion step, and thereby for some kinds of ADC linearity-errors, the bigger the chance of applying uncorrelated linearity errors to each signal frames. On the other hand, to not reduce resolution too much, it is typically desired that the ultrasound measurement signal and/or the converter full range CFR is scaled so that the signal leaves only little unused headroom of the dynamic range, which reduces the available offset range. For example, four ultrasound measurement signals may be subjected to four different input level offset values, e.g. 0V, 0V+2% of converter full range, 0V+4% of converter full range and at 0V+6% of converter full range, or for example −5%, −2%, +2% and +5% of converter full range, e.g. input level offset values of −0.25V, −0.10V, +0.10V and +0.25V in a system with a converter full range of 5V. In a preferred embodiment using Fourier transform for calculating transit times or transit-time difference, the difference in input level offset between signals may be disregarded, as preferably only the phase information is needed. If desired or required, the different input level offset values can straightforwardly be compensated for in the post processing by appropriate scaling of the samples.

The illustrated ultrasound measurement signals UMS contains a primary frequency component of 1 MHz, and the sampled measurement frames SMF are produced with a sample rate of 844 kHz, i.e. an undersampling flow meter technology. Besides the fewer samples being good for illustrative purposes, and that the present invention may also be applied well to conventionally sampled ultrasound signals, the present invention is particularly advantageous in undersampling flow meters, as inaccuracies of individual samples become more significant, and the samples are not spread over most of the converter steps simply by quantity as in conventional sampling.

The illustrated sampled measurement frames SMF contains 40 samples each, and the duration of the frames are thereby in this particular example approximately 47 μs.

It is noted that the embodiment is advantageous for the sampling of ultrasound signals of any frequency, and at any sample rate, though the achieved effect is most noticeable at relatively low sample rates.

Experiments have shown, that even small offset changes, for example moving a few converter steps, i.e. an offset of a few LSB, in the range of 1% to 5% of the full range, is sufficient to achieve in average over a number of measurements an improvement of the volume measurement accuracy, i.e. the accuracy of the integrated flow measurement, of more than 1%, e.g. as much as 2%.

By performing a number of measurements with different input level offset values OFFV, i.e. with different linearity errors, a combination, e.g. by averaging, of the measurements, may cause a generally reduced impact of the linearity error overall, resulting in an improved transit-time difference measurement and thereby improved flow- and volume measurement over time. In various embodiments, at least two ultrasound measurement signals from the first ultrasound transducer TR is sampled with different input level offset values, and at least two ultrasound measurement signals from the second ultrasound transducer TR is sampled with different input level offset values OFFV. To improve the effect, more measurements may be performed, and preferred embodiments may for example establish 4 or 6 sampled measurement frames SMF from each transducer TR, i.e. a total of 8 or 12 measurements performed to determine a flow representation FR. Alternatively, with less measurements performed for each determined flow representation, the average error over time of flow representation will still decrease compared to not applying varying input level offset values.

The selection of a different input level offset value OFFV for each new ultrasound measurement signal may be performed in several ways, for example by incrementing the previous value, by lookup in a predetermined sequence of input level offset values, by random or pseudo-random selection, etc.

As at least two transducers are each providing a number of ultrasound measurement signals UMS, several different sequences may be contemplated. In an embodiment all, for example, 4-6 ultrasound measurements from the first transducer are finished before proceeding to making preferably the same number of measurements from the second transducer. In this embodiment, the input level offset provider OFF may for example go through a sequence of 4-6 different input level offset values OFFV, e.g. by starting from 0 and incrementing with for example 1% of converter full range CFR for each new measurement. Before proceeding to the measurements from the second transducer, the input level offset provider may wrap back to start the sequence over for the next measurements. Thereby the largest offset value to be expected is, in this example, 6% of converter full range CFR, and the scaling by the analog input or the reference voltage can be designed to accommodate that amount of overhead. The same can be achieved when alternating between the two transducers, if the input level offset provider OFF is arranged to only proceed to the next input level offset value every second measurement.

If more complex measurement schedules are employed, or for example unpredictable, e.g. random or pseudo-random, changing of input level offset value is desired, the input level offset provider may keep track of previously applied input level offset values, e.g. by storing in a memory, either for all frames together or for the frames of each transducer separately. The history may be reset or overwritten after a certain number of conversions, e.g. the number of conversions used to determine one flow representation FR.

The, e.g., 4 or 6 sampled measurement frames SMF relating to a particular ultrasound transducer TR, i.e. measurement direction, may for example be averaged or otherwise combined in the time domain or the frequency domain to achieve one measurement frame from which a transit time TT can be derived. In a preferred embodiment, the, e.g. 4 or 6, sampled measurement frames SMF are Fourier transformed and then averaged. It may in some embodiments, for example where simple averaging in the time domain is desired, be beneficial to neutralize the applied input level offset value by applying the negated value to the sampled frame before combining the frames.

In particular, for flow meters utilizing undersampling technology, see for example PCT patent application publication WO2011/134470A2, hereby incorporated by reference, several measurements may be combined in order to reconstruct the ultrasound signal or in order to extract parameters sufficient to determine a transit time without reconstructing the time domain signal. A number of different ways to average, superimpose, combine, etc. a number of undersampled frames are described in the above-mentioned patent application. It is highly advantageous to combine this with the present invention so that the undersampled frames are sampled with different input level offsets in accordance with the present invention, whereas the different linearity errors of the different frames are averaged when the frames are combined in accordance with an undersampling post-processing as mentioned above.

In an alternative embodiment, undersampling is utilized without combining several measurement frames, or only a few measurement frames. By varying the input level offset values, the improved robustness against the non-linearity error of the invention is typically still achieved in average of transit-time differences and flow representations over time.

FIG. 6 illustrates an alternative embodiment of an analog-to-digital convert arrangement ADA with an input level offset provider OFF. In comparison with the embodiment illustrated in FIG. 4, the embodiment of FIG. 6 shows a single-ended analog input AIN, and a summing point is implemented to apply the input level offset value OFFV to the ultrasound measurement signal UMS.

FIG. 7 illustrates an embodiment of an analog-to-digital converter arrangement ADA with an input level offset provider OFF, and an analog-to-digital converter ADC with differential analog input AIN as described above with reference to FIG. 4. The input level offset provider OFF comprises a digital-to-analog converter DAC to establish an analog voltage as input level offset value to add to or subtract from the analog ultrasound measurement signal UMS. The embodiment of FIG. 7 further illustrates that the input level offset provider may preferably be controlled by the processing unit PU, for example by having the processing unit provide the digital value corresponding to the desired analog input level offset value OFFV. In a preferred embodiment the processing unit and both the DAC and the ADC are comprised in the same microcontroller or system-on-chip.

In addition to the above-described advantageous features of using the input level offset provider to change an input level offset value for each measurement, the input level offset provider may be arranged to also apply a DC correction offset to the signal, for example to move the signal into the converter range if over long time the strength of the ultrasound measurement signals have deteriorated, or for example if an adaptive range feature is used for the ADC to adjust the converter full range to the signal amplitude and a level offset thereby becomes relevant.

Different Reference Voltages

FIG. 8 illustrates an embodiment of the invention reducing the impact of the linearity errors by applying different reference voltages RV to the ultrasound measurement signal UMS at a reference voltage input VREF of an analog-to-digital converter ADC of the analog-to-digital converter arrangement ADA. The analog-to-digital converter may be of any ADC technology, e.g. a SAR ADC, and further comprise an analog input AIN for receiving a voltage to be converted, and a sample output SOU for outputting a sample representing the converted voltage. When the analog-to-digital converter ADC is implemented with reference voltage, clock signal, etc. in accordance with application standards of the particular type of ADC, the analog-to-digital converter may be used to convert a received ultrasound measurement signal UMS to a sampled measurement frame SMF. For simplicity, the standard auxiliary circuitry to employ an analog-to-digital converter is not illustrated on the drawings, but is well-known to the skilled person.

The embodiment of FIG. 8 further comprises a reference voltage provider REF, which is arranged to provide a reference voltage RV to the reference voltage input VREF. Besides the usual role of providing a reference voltage RV defining the full conversion range of the converter, the reference voltage provider REF of the present embodiment is further arranged to change the reference voltage RV between conversions, thereby changing the converter full range CFR and/or offsetting the conversion median.

FIG. 9 illustrates the working principle of the embodiment of FIG. 8. Along a time axis is shown a first sampled measurement frame SMF1 and a second sampled measurement frame SMF2. As indicated on the time axis, a delay is applied between the two measurement frames, but not shown for practical reasons. The vertical axis represents both the analog signal amplitude and the sampled measurement signal sample values. The samples of the two sampled measurement frames are shown as small round dots in the diagram superimposed on an example of an ultrasound measurement signal. Lower and upper horizontal, dashed lines indicate the converter full range CFR. As seen, the first ultrasound measurement signal fills less of the converter full range than the second ultrasound measurement signal.

The first and second ultrasound measurement signals are, in the analog domain, of the same amplitude, but different reference voltages RV have been provided from the reference voltage provider REF to the conversion of the ultrasound measurement signals, thereby changing the converter full range CFR between the two measurements. The difference of reference voltage applied is illustrated as the span ½ΔRV in FIG. 9. Thereby all samples of the second sampled measurement frame SMF2 are converted at a, in this example, smaller converter full range, thereby filling out more of the range, and thereby achieving samples at different levels than the sampling of the first sampled measurement frame SMF1, i.e. sampling at different converter steps cf. FIG. 3. Thereby the second sampled measurement frame SMF2 has generally been subject to a different linearity error than the first sampled measurement frame SMF1, even though the ultrasound measurement signals are practically identical. However, with the example of FIG. 9, samples near the range median are not changed or only slightly changed and do thereby not benefit much from the linearization effect, but for the samples at low or high levels, the change may be significant, and the achieved effect considerable.

In FIG. 9 the two signals are shown balanced around the same median for illustrative purposes, which may for example be the case in a differential voltage reference embodiment as described below with reference to FIG. 10 or by applying a DC level offset. In various embodiments, for example with a single-ended reference voltage RV without additional DC offset, the lower level samples will typically benefit less, and the medium and higher level samples benefit more.

For illustration purposes the illustrated difference of input level offset value ΔOFFV between the two frames is about 15% of converter full range CFR, but in a preferred embodiment the offset difference between two sampled measurement frames is much smaller, for example changing only 0.5%, 2% or 5% of converter full range for each new frame. The larger the change, the bigger the change of conversion step, and thereby for some kinds of ADC linearity-errors, the bigger the chance of applying uncorrelated linearity errors to each signal frames. On the other hand, to not reduce resolution too much, it is typically desired that the reference voltage is selected so the converter full range CFR leaves only little unused headroom of the dynamic range for the particular ultrasound measurement signals. For example, four ultrasound measurement signals may be sampled at four different reference voltages, e.g. at a nominal reference voltage, at the nominal voltage +1%, at the nominal voltage +2% and at the nominal voltage +3%, or for example at 91%, 97%, 103% and 109% of a nominal rate, etc. In a preferred embodiment using Fourier transform for calculating transit times or transit-time differences, the difference in reference voltage between signals may be disregarded, as preferably only the phase information is needed. If desired or required, the different reference voltages can straightforwardly be compensated for in the post processing by appropriate scaling of the samples.

The details and considerations described above with reference to the embodiment of changing input level offset values, regarding ultrasound measurement signal characteristics, sample rates, combination of sampled measurement frames, application in an undersampling system, various measurement schedules, etc., apply also to the embodiment described here of changing reference voltage. Further, the details and considerations described above with reference to the embodiment of changing input level offset values, regarding selecting offset values, e.g. by incrementing, etc., keeping track of previous offset values, etc., described as performed by the input level offset provider, apply also to the embodiment described here of changing reference voltage by the reference voltage provider, mutatis mutandis.

FIG. 10 illustrates an embodiment of an analog-to-digital converter arrangement ADA with a reference voltage provider REF, and an analog-to-digital converter ADC with an analog input AIN and a differential reference voltage input VREF. The reference voltage provider REF comprises two parts, delivering a high og positive reference voltage RV+ and a low or negative reference voltage RV−, respectively, to the voltage reference input VREF. The two parts of the reference voltage provider REF each comprises a digital-to-analog converter DAC to establish an analog voltage as the reference voltage RV+, RV−, respectively. The embodiment of FIG. 10 further illustrates that the reference voltage provider REF may preferably be controlled by the processing unit PU, for example by having the processing unit provide the digital values corresponding to the desired reference voltages RV+, RV−. In a preferred embodiment the processing unit and both the two DACs and the ADC are comprised in the same microcontroller or system-on-chip.

In an embodiment with differential reference voltage input, the reference voltages RV+, RV−, may be controlled asymmetrically to also achieve a small DC offset. By controlling this DC offset as described above with reference to FIGS. 4-7 for controlling an input level offset, a similar improvement may be achieved. A preferred embodiment comprises using the voltage reference provider to control both the converter range and/or the DC offset slightly as described above to achieve an improved robustness against non-linearity of the analog-to-digital converter arrangement.

FIG. 11 illustrates an embodiment of an analog-to-digital converter arrangement ADA with a reference voltage provider REF as described above with reference to FIGS. 8-10, and input level offset provider as described above with reference to FIGS. 4-7, and an analog-to-digital converter ADC. Thereby, for each measurement, may be applied a small change of input offset level value OFFV and/or reference voltage RV. In a preferred embodiment is thereby achieved even more variance of utilized conversion steps and/or a smaller range of changes are necessary for each of the input level offset and reference voltage features.

In addition to the above-described advantageous features of using the reference voltage provider REF to change a reference voltage RV for each measurement, the reference voltage provider may be arranged with an adaptive range feature to also control the converter full range to best fit the analog ultrasound measurement signal, for example to so-to-say zoom in on the signal if over long time the strength of the ultrasound measurement signals have deteriorated. In an embodiment with a differential reference voltage, e.g. as described with reference to FIG. 10, the reference voltages RV+, RV−, may be controlled asymmetrically to also achieve a DC correction to adjust a smaller converter full range to the DC level of the ultrasound measurement signal. Alternatively, if combined with an input level offset provider as described above with reference to FIGS. 4-7 and 11, the input level offset provider may provide a relevant DC correction when an adaptive range feature of the voltage reference provider, single-ended or differential, is applied.

Different Frame Offsets

FIG. 12 illustrates an embodiment of the invention reducing the impact of the linearity errors by varying a frame offset, i.e. a starting point in time of a sampled measurement frame, of the sampling of the ultrasound measurement signal UMS at a sample timing input STI of an analog-to-digital converter ADC of the analog-to-digital converter arrangement ADA. The analog-to-digital converter may be of any ADC technology, e.g. a SAR ADC, and further comprise an analog input AIN for receiving a voltage to be converted, and a sample output SOU for outputting a sample representing the converted voltage. When the analog-to-digital converter ADC is implemented with reference voltage, clock signal, etc. in accordance with application standards of the particular type of ADC, the analog-to-digital converter may be used to convert a received ultrasound measurement signal UMS to a sampled measurement frame SMF. For simplicity, the standard auxiliary circuitry to employ an analog-to-digital converter is not illustrated on the drawings, but is well-known to the skilled person.

The embodiment of FIG. 12 further comprises a timing signal provider TSP, which is arranged to provide a timing signal TS to the sample timing input STI, the timing signal TS comprising a frame offset FOFF. The frame offset FOFF controls or indicates an absolute start time, see frame start FS of FIG. 2, for sampling a particular ultrasound measurement signal UMS or a frame start time FS relative to a nominal start time or relative to a previous start time. For a relative frame offset, it may be negative or positive. By nominal start time is referred to the frame start FS, i.e. time for starting the sampling, used in a similar embodiment without a varying frame offset, i.e. typically a predetermined amount of time after the ultrasound transmission signal UTS has been sent to the sending transducer TR, where the predetermined amount of time roughly corresponds to a little shorter than a calculated, estimated or previously measured absolute transit time TT, see FIG. 2. In other words, the advantageous embodiments described for example with reference to FIGS. 12-17, where a varying frame offset is applied in the analog-to-digital converter arrangement ADA, are arranged to vary the frame start FS indicated in FIG. 2 so an ultrasound measurement signal UMS in terms of timing will be located slightly different than the previous inside the sampled measurement frame SMF.

Depending on the particular analog-to-digital converter ADC, the type of timing signal, sample timing input and frame offset indication or control may be selected accordingly. For example, for analog-to-digital converter types relying on a start signal to start sampling, the signal timing input STI may comprise a start signal input, and the timing signal TS may comprise the start signal being controlled by the timing signal provider TSP, preferably based on an information about a transmission of an ultrasound transmission signals UTS, with the frame offset FOFF being represented by a varying frame start FS delay. Alternatively, the timing signal may comprise a control signal for a start signal provider. In another embodiment, the sample timing input STI may be a sample clock input, the timing signal TS being a sample clock and the timing signal provider TSP being a clock provider, and the frame offset being indicated and controlled by the timing signal provider TSP by changing a time offset of the sample clock between ultrasound measurement signals. Alternatives of this embodiment may be by controlling the offset of a faster clock being divided for use as sample clock, and/or by controlling a divider establishing a sample clock from a faster clock. In a preferred embodiment a faster clock, e.g. a system clock or a multiplied clock is provided and frame offsets FOFF, e.g. start signal or clock offset, are aligned with edges of the faster clock, i.e. in fractions of the sample clock.

FIG. 13 illustrates the working principle of the embodiment of FIG. 12. Along a time axis is shown a first sampled measurement frame SMF1 and a second sampled measurement frame SMF2. To illustrate the principle of the invention, the two sampled measurement frames are shown superimposed on each other instead of at their establishment time after each other. The vertical axis represents both the analog signal amplitude and the sampled measurement signal sample values. The samples of the first sampled measurement frame SMF1 are shown as small round dots in the diagram and the samples of the second sampled measurement frame SMF2 are shown as small diamond dots in the diagram, both superimposed on an example of an ultrasound measurement signal. Due to a frame offset difference ΔFOFF used for the sampling of the two sampled measurement frames they are in terms of time placed differently relative to the ultrasound measurement signal. Thereby, as seen, in this example diamond dots indicating samples of the second measurement frame SMF2 are displaced half a sample to the right of the round dots indication sample of the first measurement frame SMF1. This offset difference leads, however, as can be seen in the diagram, to significantly different sample values, thereby being sampled with different linearity errors. The skilled person will appreciate, that also smaller frame offsets of less than 50% of a sample period, for example 33%, 25%, 15%, 12%, 8% or 4% of a sample period, may, though not suited for illustration, also lead to significantly different sample values, at least for a part of the samples. For example, four ultrasound measurement signals may be sampled with four different frame starts, i.e. with four different frame offsets FOFF, e.g. at a nominal frame start, at the nominal frame start +25% of a sample period, at the nominal frame start+50% of a sample period and at the nominal frame start+75% of a sample period, or for example at −40% of a sample period, −20% of a sample period, +20% of a sample period and +40% of a sample period, all calculated from a nominal frame start time, etc. The different frame offsets may straightforwardly be compensated for in the post processing, and/or be disregarded if signals from different transducers with same offsets are compared.

The details and considerations described above with reference to the embodiment of changing input level offset values, regarding ultrasound measurement signal characteristics, sample rates, combination of sampled measurement frames, application in an undersampling system, various measurement schedules, etc., apply also to the embodiment described here of changing frame offset. Further, the details and considerations described above with reference to the embodiment of changing input level offset values, regarding selecting offset values, e.g. by incrementing, etc., keeping track of previous offset values, etc., described as performed by the input level offset provider, apply also to the embodiment described here of changing frame offset by the timing signal provider, mutatis mutandis.

FIG. 14 illustrates an embodiment of an analog-to-digital converter arrangement ADA with a timing signal provider TSP, and an analog-to-digital converter ADC with a timing signal input TSI as described above with reference to FIG. 12. The timing signal provider TSP comprises a digital-to-analog converter DAC to establish an analog voltage as start signal or clock or other frame offset FOFF control signal as described above. The embodiment of FIG. 14 further illustrates that the timing signal provider may preferably be controlled by the processing unit PU, for example by having the processing unit provide the digital value, time, clock, etc., corresponding to the desired analog timing signal TS. In a preferred embodiment the processing unit and both the DAC and the ADC are comprised in the same microcontroller or system-on-chip. In an embodiment where the frame start FS is controlled digitally, the processing unit PU may act as timing signal provider TSP and provide the timing signal TS with frame offset FOFF, e.g. a start signal, directly to the timing signal input TSI.

FIG. 15 illustrates an embodiment of an analog-to-digital converter arrangement ADA with a timing signal provider TSP as described above with reference to FIGS. 12-14, and input level offset provider as described above with reference to FIGS. 4-7, and an analog-to-digital converter ADC. Thereby, for each measurement, may be applied a small change of input offset level value OFFV and/or frame offset FOFF. In a preferred embodiment is thereby achieved even more variance of utilized conversion steps and/or a smaller range of changes are necessary for each of the input level offset and frame offset features.

FIG. 16 illustrates an embodiment of an analog-to-digital converter arrangement ADA with a timing signal provider TSP as described above with reference to FIGS. 12-14, and reference voltage provider REF as described above with reference to FIGS. 8-10, and an analog-to-digital converter ADC. Thereby, for each measurement, may be applied a small change of reference voltage RV and/or frame offset FOFF. In a preferred embodiment is thereby achieved even more variance of utilized conversion steps and/or a smaller range of changes are necessary for each of the input level offset and frame offset features.

FIG. 17 illustrates an embodiment of an analog-to-digital converter arrangement ADA with a timing signal provider TSP as described above with reference to FIGS. 12-14, an input level offset provider as described above with reference to FIGS. 4-7, a reference voltage provider REF as described above with reference to FIGS. 8-10, and an analog-to-digital converter ADC. Thereby, for each measurement, may be applied a small change of input offset level value OFFV, reference voltage RV and/or frame offset FOFF. In a preferred embodiment is thereby achieved even more variance of utilized conversion steps and/or a smaller range of changes are necessary for each of the input level offset, reference voltage, and frame offset features.

Different Sample Rates

FIG. 18 illustrates an embodiment of the invention reducing the impact of the linearity errors by varying the sample rate SR of the sampling of the ultrasound measurement signal UMS at a sample timing input STI of an analog-to-digital converter ADC of the analog-to-digital converter arrangement ADA. The analog-to-digital converter may be of any ADC technology, e.g. a SAR ADC, and further comprise an analog input AIN for receiving a voltage to be converted, and a sample output SOU for outputting a sample representing the converted voltage. When the analog-to-digital converter ADC is implemented with reference voltage, clock signal, etc. in accordance with application standards of the particular type of ADC, the analog-to-digital converter may be used to convert a received ultrasound measurement signal UMS to a sampled measurement frame SMF. For simplicity, the standard auxiliary circuitry to employ an analog-to-digital converter is not illustrated on the drawings, but is well-known to the skilled person.

The embodiment of FIG. 18 further comprises a timing signal provider TSP, which is arranged to provide a timing signal TS to the sample timing input STI, the timing signal TS comprising a sample rate SR. The sample rate SR controls or indicates a sample rate to be used for sampling a particular ultrasound measurement signal UMS.

Depending on the particular analog-to-digital converter ADC, the type of timing signal, sample timing input and sample rate indication or control may be selected accordingly. For example, for analog-to-digital converter types relying on a control signal to select a sample rate or provide a divisor to establish a sample rate from a system clock, the signal timing input STI may comprise a control input, and the timing signal TS may comprise the clock selector value or divisor value controlled by the timing signal provider TSP, with the signal rate SR being represented by a varying control signal. In another embodiment, the sample timing input STI may be a sample clock input, the timing signal TS being a sample clock and the timing signal provider TSP being a clock provider, and the sample rate being directly a characteristic of the provided sample clock by the timing signal provider TSP and e.g. being changed between ultrasound measurement signals. The timing signal provider TSP may comprise a digital-to-analog converter DAC to produce a sample rate control signal or sample clock. The sample clocks with different rates may preferably be derived from a considerably faster clock, e.g. a system clock, to allow for different divisions thereof being acceptably close in rate, e.g. within 10% of each other. For example, different sample rates may be established by counting edges of the faster clock, e.g. three different sample rates established by counting, e.g., 20, 21 and 22 edges, respectively, between each sample clock edge, to establish three different sample rates within 10% difference.

FIG. 19 illustrates the working principle of the embodiment of FIG. 18. Along a time axis is shown a first sampled measurement frame SMF1 and a second sampled measurement frame SMF2. To illustrate the principle of the invention, the two sampled measurement frames are shown superimposed on each other instead of at their establishment time after each other. The vertical axis represents both the analog signal amplitude and the sampled measurement signal sample values. The samples of the first sampled measurement frame SMF1 are shown as small round dots in the diagram and the samples of the second sampled measurement frame SMF2 are shown as small diamond dots in the diagram, both superimposed on an example of an ultrasound measurement signal. Due to different sample rates SR1, SR2, used for the sampling of the two sampled measurement frames, they are in terms of time placed differently relative to the ultrasound measurement signal. Though difficult to see in an illustration, the second sample rate SR2 is in this example 5% lower than the first sample rate SR1, i.e. having a slightly longer period per sample. In the example of FIG. 19 the first sample rate SR1 is 844 kHz, the second sample rate SR2 is 5% lower, i.e. approx. 802 kHz, and the primary frequency of the ultrasound measurement signal is approx. 1 MHz, but the invention may be used with any sample rates and any signal frequencies, with conventional sampling or undersampling. As seen, the different sample rates cause in this example diamond dots indicating samples of the second measurement frame SMF2 to be displaced relative to the round dots indicating samples of the first measurement frame SMF1. This sample rate difference leads, as can clearly be seen in the diagram, to significantly different sample values at least for most of the time, thereby being sampled with different linearity errors. The skilled person will appreciate, that also larger or smaller sample rate differences, e.g. between 1% and 10% of a sample period, may also lead to significantly different sample values, at least for a part of the samples. For example, four ultrasound measurement signals may be sampled at four different sample rates, e.g. at a nominal sample rate, at the nominal rate+3%, at the nominal rate+6% and at the nominal rate+9%, or for example at 91%, 97%, 103% and 109% of a nominal rate, etc. In a preferred embodiment using Fourier transform to determine the absolute transit time, different parameters and bins are used for different sample rates, and the phase results are normalized to combine several measurements sampled at different sample rates.

The details and considerations described above with reference to the embodiment of changing input level offset values, regarding ultrasound measurement signal characteristics, sample rates, combination of sampled measurement frames, application in an undersampling system, various measurement schedules, etc., apply also to the embodiment described here of changing sample rate. Further, the details and considerations described above with reference to the embodiment of changing input level offset values, regarding selecting offset values, e.g. by incrementing, etc., keeping track of previous offset values, etc., described as performed by the input level offset provider, apply also to the embodiment described here of changing sample rate by the timing signal provider, mutatis mutandis.

FIG. 20 illustrates an embodiment of an analog-to-digital converter arrangement ADA with a timing signal provider TSP as described above with reference to FIGS. 18-19, and input level offset provider as described above with reference to FIGS. 4-7, and an analog-to-digital converter ADC. Thereby, for each measurement, may be applied a small change of input offset level value OFFV and/or signal rate SR. In a preferred embodiment is thereby achieved even more variance of utilized conversion steps and/or a smaller range of changes are necessary for each of the input level offset and signal rate features.

FIG. 21 illustrates an embodiment of an analog-to-digital converter arrangement ADA with a timing signal provider TSP as described above with reference to FIGS. 18-19, and a reference voltage provider REF as described above with reference to FIGS. 8-10, and an analog-to-digital converter ADC. Thereby, for each measurement, may be applied a small change of reference voltage RV and/or signal rate SR. In a preferred embodiment is thereby achieved even more variance of utilized conversion steps and/or a smaller range of changes are necessary for each of the input level offset and signal rate features.

FIG. 22 illustrates an embodiment of an analog-to-digital converter arrangement ADA with a timing signal provider TSP providing a frame offset FOFF as described above with reference to FIGS. 12-14 and a signal rate SR as described above with reference to FIGS. 18-19, and an analog-to-digital converter ADC. Thereby, for each measurement, may be applied a small change of frame offset FOFF and/or signal rate SR. In a preferred embodiment is thereby achieved even more variance of utilized conversion steps and/or a smaller range of changes are necessary for each of the frame offset and signal rate features.

FIG. 23 illustrates an embodiment of an analog-to-digital converter arrangement ADA combining all of the above-described features with a timing signal provider TSP providing a frame offset FOFF as described above with reference to FIGS. 12-14 and a signal rate SR as described above with reference to FIGS. 18-19, as well as an input level offset provider as described above with reference to FIGS. 4-7, a reference voltage provider REF as described above with reference to FIGS. 8-10, and an analog-to-digital converter ADC. Thereby, for each measurement, may be applied a small change of input offset level value OFFV, reference voltage RV, frame offset FOFF and/or signal rate SR. In a preferred embodiment is thereby achieved even more variance of utilized conversion steps and/or a smaller range of changes are necessary for each of the input level offset, reference voltage, frame offset and signal rate features.

Figure 24:
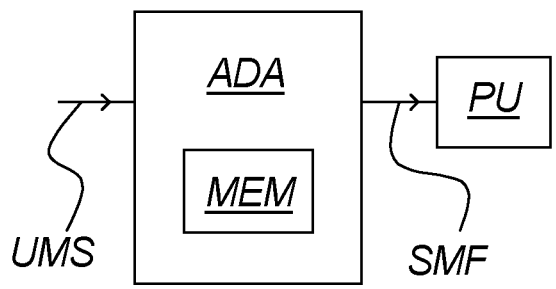

FIG. 24 illustrates an embodiment of an analog-to-digital converter arrangement ADA according to the invention, receiving an ultrasound measurement signal UMS and converting it to a sampled measurement frame SMF which is sent to a processing unit PU. The analog-to-digital converter arrangement ADA comprises a memory MEM to store and retrieve predetermined sequences, predetermined nominal or reference values, history of previous used values, etc.

Figure 25:
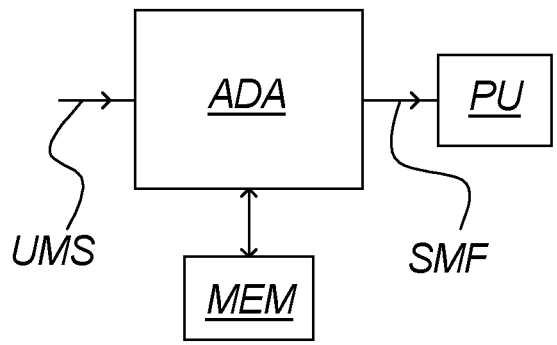

FIG. 25 illustrates an embodiment of an analog-to-digital converter arrangement ADA according to the invention, receiving an ultrasound measurement signal UMS and converting it to a sampled measurement frame SMF which is sent to a processing unit PU. The analog-to-digital converter arrangement ADA is coupled to a memory MEM to store and retrieve predetermined sequences, predetermined nominal or reference values, history of previous used values, etc.

FIG. 26 illustrates an embodiment of an analog-to-digital converter arrangement ADA according to the invention, receiving an ultrasound measurement signal UMS and converting it to a sampled measurement frame SMF which is sent to a processing unit PU. The processing unit PU comprises a memory MEM to store and retrieve predetermined sequences, predetermined nominal or reference values, history of previous used values, etc., and a connection is arranged to allow the analog-to-digital converter arrangement ADA to communicate with the memory MEM.

FIG. 27 illustrates an embodiment of a microcontroller μC or a system-on-chip SoC comprising an analog-to-digital converter arrangement ADA, a processing unit PU and a memory MEM according to the invention. An ultrasound measurement signal UMS is received and converting to a sampled measurement frame SMF which is processed by the processing unit PU. The memory MEM is arranged to allow storing and retrieving predetermined sequences, predetermined nominal or reference values, history of previous used values, etc.

In the embodiments described above with reference to FIGS. 24-27, the predetermined sequences, predetermined nominal or reference values, history of previous used values, etc. may for example be related to input level offset values as described above with reference to FIGS. 4-7, reference voltages as described with reference to FIGS. 8-11, frame offsets as described with reference to FIGS. 12-17, and/or sample rates as described with reference to FIGS. 18-23.

LIST OF REFERENCE SIGNS

ADA Analog-to-digital converter arrangement
ADC Analog-to-digital converter
AIN Analog input
CFR Converter full range
FM Transit-time ultrasonic flow meter
FOFF Frame offset
FR Flow representation
FS Frame start
MEM Memory
OFF Input level offset provider
OFFV Input level offset value
PU Processing unit
REF Reference voltage provider
RT Routing arrangement
RV Reference voltage
SMF Sampled measurement frame
SOU Sample output
SR Sample rate
STI Sample timing input
TFI Ideal transfer function
TFIL Ideal transfer function line
TFR Real transfer function
TFRL Real transfer function line
TR Ultrasonic transducer
TS Timing signal
TSP Timing signal provider
TT Transit time
UMS Ultrasound measurement signal
UTS Ultrasound transmission signal
VREF Reference voltage input

The invention claimed is:

1. A transit-time ultrasonic flow meter comprising at least two ultrasonic transducers, an analog-to-digital converter arrangement for sampling ultrasound measurement signals from the ultrasonic transducers and a processing unit for calculating a transit-time based flow representation from the sampled measurement signals;
wherein the analog-to-digital converter arrangement comprises:
an analog-to-digital converter comprising an analog input and a sample output; and
a first non-linearity robustness provider arranged to provide a first non-linearity robustness provision;
wherein the analog-to-digital converter arrangement is arranged to receive at least four ultrasound measurement signals from the ultrasonic transducers and provide the ultrasound measurement signals to the analog input;

wherein the first non-linearity robustness provider is arranged to provide an individual first non-linearity robustness provision for at least two of said ultrasound measurement signals, each individual first non-linearity robustness provision being different; and wherein the analog-to-digital converter is arranged to establish for each of the at least four ultrasound measurement signals a sampled measurement frame with at least 10 samples on the basis of the respective ultrasound measurement signal and the first non-linearity robustness provision and provide the sampled measurement frame at the sample output coupled to said processing unit;

wherein the first non-linearity robustness provider, respectively the first non-linearity robustness provision, are selected from:
- an input level offset provider, respectively an input level offset value provided to the analog input of the analog-to-digital converter,
- a reference voltage provider, respectively a reference voltage provided to a reference voltage input of the analog-to-digital converter,
- a timing signal provider, respectively a timing signal comprising a frame offset provided to a sample timing input of the analog-to-digital converter, and
- a timing signal provider, respectively a timing signal comprising a sample rate provided to the sample timing input of the analog-to-digital converter.

2. The transit-time ultrasonic flow meter of claim 1, wherein the analog-to-digital converter arrangement further comprises:
- a second non-linearity robustness provider arranged to provide a second non-linearity robustness provision;
- wherein the second non-linearity robustness provider is arranged to provide an individual second non-linearity robustness provision for at least two of said ultrasound measurement signals, each individual second non-linearity robustness provision being different; and
- wherein the analog-to-digital converter is arranged to establish for each of the at least four ultrasound measurement signals a sampled measurement frame with at least 10 samples on the basis of the respective ultrasound measurement signal, the first non-linearity robustness provision and the second non-linearity robustness provision, and provide the sampled measurement frame at the sample output coupled to said processing unit;
- wherein the second non-linearity robustness provider, respectively the second non-linearity robustness provision, are selected from:
  - an input level offset provider, respectively an input level offset value provided to the analog input of the analog-to-digital converter,
  - a reference voltage provider, respectively a reference voltage provided to a reference voltage input of the analog-to-digital converter,
  - a timing signal provider, respectively a timing signal comprising a frame offset provided to a sample timing input of the analog-to-digital converter, and
  - a timing signal provider, respectively a timing signal comprising a sample rate provided to the sample timing input of the analog-to-digital converter;

wherein the second non-linearity robustness provider is different from the first non-linearity provider, and the second non-linearity provision is different from the first non-linearity provision.

3. The transit-time ultrasonic flow meter of claim 1, wherein said first non-linearity robustness provider is arranged to provide a first sequence of different first non-linearity robustness provisions for use with a first sequence of ultrasound measurement signals from a first ultrasonic transducer of said at least two ultrasonic transducers and to provide a second sequence of different first non-linearity robustness provisions for use with a second sequence of ultrasound measurement signals from a second ultrasonic transducer of said at least two ultrasonic transducers.

4. The transit-time ultrasonic flow meter of claim 3, wherein said first and second sequences of ultrasound measurement signals each comprises 2-10 ultrasound measurement signals and said first and second sequences of different first non-linearity robustness provisions each comprises 2-10 different first non-linearity robustness provisions.

5. The transit-time ultrasonic flow meter of claim 3, wherein said first and second sequences of different first non-linearity robustness provisions are equal.

6. The transit-time ultrasonic flow meter of claim 3, wherein said first and second sequences of different first non-linearity robustness provisions contain no common values.

7. The transit-time ultrasonic flow meter of claim 3, wherein said first and second sequences of ultrasound measurement signals are received in an alternating fashion and said first non-linearity robustness provider is arranged to provide said first and second sequences of different first non-linearity robustness provisions in a corresponding alternating fashion.

8. The transit-time ultrasonic flow meter of claim 1, wherein said first non-linearity robustness provider is arranged to determine at least one of said first non-linearity robustness provisions on the basis of a previous first non-linearity robustness provision by an operation causing the new first non-linearity robustness provision to be different from said previous first non-linearity robustness provision.

9. The transit-time ultrasonic flow meter of claim 8, wherein said operation comprises an increment operation or a decrement operation.

10. The transit-time ultrasonic flow meter of claim 1, wherein said first non-linearity robustness provider is communicatively coupled to or comprises a memory, and wherein said first non-linearity robustness provider is arranged to provide said first non-linearity robustness provision from a sequence of predetermined first non-linearity robustness provisions stored in said memory.

11. The transit-time ultrasonic flow meter of claim 1, wherein said first non-linearity robustness provider is communicatively coupled to or comprises a memory, and wherein said first non-linearity robustness provider is arranged to store a history of at least one previous first non-linearity robustness provision for each transducer in said memory.

12. The transit-time ultrasonic flow meter of claim 1, wherein said first non-linearity robustness provider is arranged to provide said first non-linearity robustness provision on the basis of a randomly or pseudo-randomly selected value.

13. The transit-time ultrasonic flow meter of claim 12, wherein said pseudo-randomly selected value is derived from one of said sampled measurement frames.

14. The transit-time ultrasonic flow meter of claim 1, wherein said first non-linearity robustness provider comprises a digital-to-analog converter.

15. The transit-time ultrasonic flow meter of claim 1, wherein said processing unit is arranged to control said first non-linearity robustness provider.

16. The transit-time ultrasonic flow meter of claim 1, wherein said processing unit is implemented in a microcontroller or a system-on-chip of said transit-time ultrasonic flow meter, and wherein said microcontroller or system-on-chip comprises an analog-to-digital converter of said analog-to-digital converter arrangement and a digital-to-analog converter of said first non-linearity robustness provider.

17. The transit-time ultrasonic flow meter of claim 1, wherein said at least four ultrasound measurement signals are consecutive ultrasound measurement signals.

18. The transit-time ultrasonic flow meter of claim 1, wherein said processing unit is arranged to calculate at least one transit time difference on the basis of at least two of said at least four ultrasound measurement signals being received from one of said at least two transducers and on the basis of at least two other of said at least four ultrasound measurement signals being received from another one of said at least two transducers, and wherein said processing unit is arranged to calculate at least one of said transit-time based flow representation using said calculated at least one transit time difference.

19. A method for calculating a transit-time based flow representation in a transit-time ultrasonic flow meter comprising at least two ultrasonic transducers, an analog-to-digital converter arrangement for sampling ultrasound measurement signals from the ultrasonic transducers and a processing unit for said calculating, the method comprising the steps of:
providing by a first non-linearization robustness provider a first non-linearization robustness provision;
establishing an ultrasound measurement signal by one of said at least two ultrasonic transducers;
receiving said ultrasound measurement signal at an analog input of an analog-to-digital converter of said analog-to-digital converter arrangement;
establishing by the analog-to-digital converter a sampled measurement frame with at least 10 samples on the basis of said ultrasound measurement signal and the first non-linearization robustness provision;
providing said sampled measurement frame at a sample output of said analog-to-digital converter coupled to said processing unit;
repeating the above steps with a total of at least four ultrasound measurement signals, wherein said providing said first non-linearization robustness provision comprises providing a different first non-linearization robustness provision for at least two of said at least four ultrasound measurement signals; and
calculating at least one transit-time based flow representation by the processing unit on the basis of a sampled measurement frame from each of said repetitions;
wherein the first non-linearity robustness provider, respectively the first non-linearity robustness provision, are selected from:
an input level offset provider, respectively an input level offset value provided to the analog input of the analog-to-digital converter,
a reference voltage provider, respectively a reference voltage provided to a reference voltage input of the analog-to-digital converter,
a timing signal provider, respectively a timing signal comprising a frame offset provided to a sample timing input of the analog-to-digital converter, and
a timing signal provider, respectively a timing signal comprising a sample rate provided to the sample timing input of the analog-to-digital converter.

20. The method for calculating a transit-time based flow representation of claim 19, the method further comprising:
providing by a second non-linearization robustness provider a second non-linearization robustness provision; and
with the step of establishing by the analog-to-digital converter the sampled measurement frame with at least 10 samples, using said second non-linearization robustness provision as additional basis;
with the step of repeating the above steps with a total of at least four ultrasound measurement signals, providing said second non-linearization robustness provision comprises providing a different second non-linearization robustness provision for at least two of said at least four ultrasound measurement signals;
wherein the second non-linearity robustness provider, respectively the second non-linearity robustness provision, are selected from:
an input level offset provider, respectively an input level offset value provided to the analog input of the analog-to-digital converter,
a reference voltage provider, respectively a reference voltage provided to a reference voltage input of the analog-to-digital converter,
a timing signal provider, respectively a timing signal comprising a frame offset provided to a sample timing input of the analog-to-digital converter, and
a timing signal provider, respectively a timing signal comprising a sample rate provided to the sample timing input of the analog-to-digital converter;
wherein the second non-linearity robustness provider is different from the first non-linearity provider, and the second non-linearity provision is different from the first non-linearity provision.

* * * * *